US012690349B2

(12) United States Patent　　　　(10) Patent No.:　US 12,690,349 B2
Lee et al.　　　　　　　　　　　　　(45) Date of Patent:　　　Jul. 21, 2026

(54) DISPLAY DEVICE

(71) Applicant: Samsung Display Co., LTD., Yongin-si (KR)

(72) Inventors: Yong Hee Lee, Yongin-si (KR); Kyung Bae Kim, Yongin-si (KR); Do Yeong Park, Yongin-si (KR); Ji Hye Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/788,206

(22) Filed: Jul. 30, 2024

(65) Prior Publication Data

US 2025/0056990 A1　Feb. 13, 2025

(30) Foreign Application Priority Data

Aug. 7, 2023　(KR) ........................ 10-2023-0102647

(51) Int. Cl.
　　*H10K 59/131*　　　(2023.01)
　　*H10H 29/14*　　　(2025.01)
　　*H10K 59/121*　　　(2023.01)
　　*G02B 27/01*　　　(2006.01)
　　*H10K 59/35*　　　(2023.01)
(52) U.S. Cl.
　　CPC ......... *H10K 59/131* (2023.02); *H10H 29/142* (2025.01); *H10K 59/1216* (2023.02); *G02B 27/0172* (2013.01); *G02B 2027/0178* (2013.01); *H10K 59/352* (2023.02)

(58) Field of Classification Search
　　CPC ............. H10K 59/131; H10K 59/1216; G09G 2300/0426
　　See application file for complete search history.

(56) References Cited

U.S. PATENT DOCUMENTS

| 2018/0130856 A1* | 5/2018 | Kim | H10K 59/353 |
| 2018/0197925 A1* | 7/2018 | Lius | H10K 59/131 |
| 2022/0208103 A1* | 6/2022 | Kim | G09G 3/3275 |
| 2023/0180557 A1* | 6/2023 | Zou | H10D 86/60 |
| | | | 257/72 |
| 2025/0048885 A1 | 2/2025 | Kim et al. | |

FOREIGN PATENT DOCUMENTS

| CN | 112051691 A | 12/2020 |
| KR | 10-2025-0019227 A | 2/2025 |

* cited by examiner

*Primary Examiner* — Kevin M Nguyen
(74) *Attorney, Agent, or Firm* — Womble Bond Dickinson (US) LLP

(57)　　　　ABSTRACT

The present disclosure relates to a display device, and more particularly, to a display device capable of reducing or minimizing or reducing a dead space area. According to one or more embodiments of the present disclosure, a display device including: a substrate having a display area and a non-display area; a signal transmission line including a signal line in the display area of the substrate and a fan-out line extending from the signal line and in the non-display area of the substrate; and a plurality of pixels in the display area of the substrate, wherein a plurality of signal transmission lines include the signal transmission line and are respectively connected to the plurality of pixels, and the plurality of signal transmission lines are on different layers on the substrate.

28 Claims, 45 Drawing Sheets

FIG. 6

STL1 : FL1, DL1
STL2 : FL2, DL2
STL3 : FL3, DL3
STL4 : FL4, DL4
STL5 : FL5, DL5
STL6 : FL6, DL6

STL1 : FL1, DL1
STL2 : FL2, DL2
STL3 : FL3, DL3
STL4 : FL4, DL4
STL5 : FL5, DL5
STL6 : FL6, DL6

FIG. 13

FL6 VA6 FL5 VA5 FL4 VA4 FL3 VA3 FL2 VA2 FL1 VA1 SUB

IV

STL2 : DL2, FL2

NDA

DA

B S CH D W

G

DL2

CNE2

STL1 : FL1, DL1
STL2 : FL2, DL2
STL3 : FL3, DL3
STL4 : FL4, DL4
STL5 : FL5, DL5
STL6 : FL6, DL6

STL7 : FL7, DL7
STL8 : FL8, DL8
STL9 : FL9, DL9
STL10: FL10, DL10
STL11 : FL11, DL11
STL12 : FL12, DL12

STL1 : FL1, DL1
STL2 : FL2, DL2
STL3 : FL3, DL3
STL4 : FL4, DL4
STL5 : FL5, DL5
STL6 : FL6, DL6

STL7 : FL7, DL7
STL8 : FL8, DL8
STL9 : FL9, DL9
STL10: FL10, DL10
STL11 : FL11, DL11
STL12 : FL12, DL12

STL1 : FL1, DL1
STL2 : FL2, DL2
STL3 : FL3, DL3
STL4 : FL4, DL4
STL5 : FL5, DL5
STL6 : FL6, DL6

STL7 : FL7, DL7
STL8 : FL8, DL8
STL9 : FL9, DL9
STL10: FL10, DL10
STL11: FL11, DL11
STL12: FL12, DL12

Figure 26:
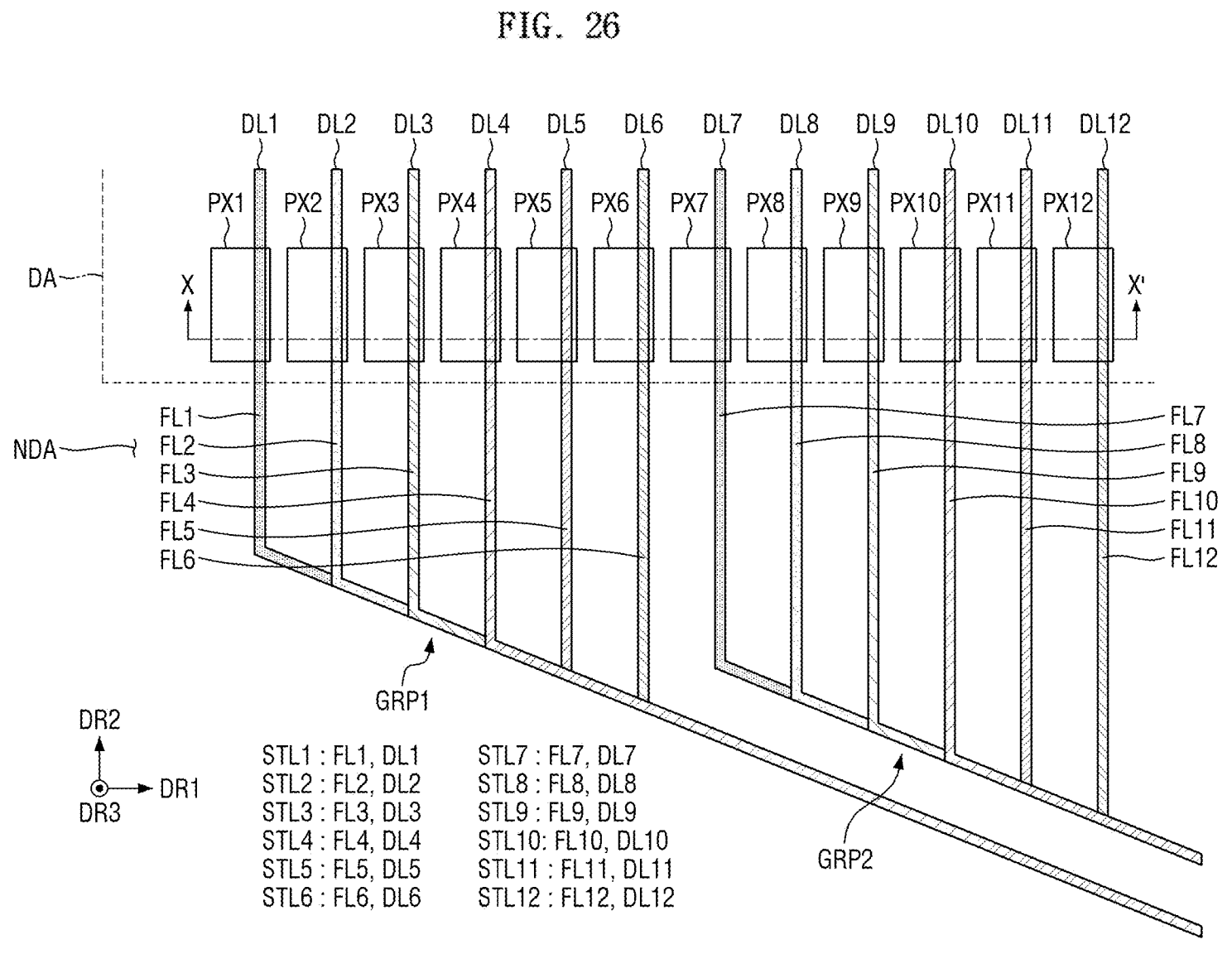

STL1 : FL1, DL1     STL7 : FL7, DL7
STL2 : FL2, DL2     STL8 : FL8, DL8
STL3 : FL3, DL3     STL9 : FL9, DL9
STL4 : FL4, DL4     STL10 : FL10, DL10
STL5 : FL5, DL5     STL11 : FL11, DL11
STL6 : FL6, DL6     STL12 : FL12, DL12

Figure 28:
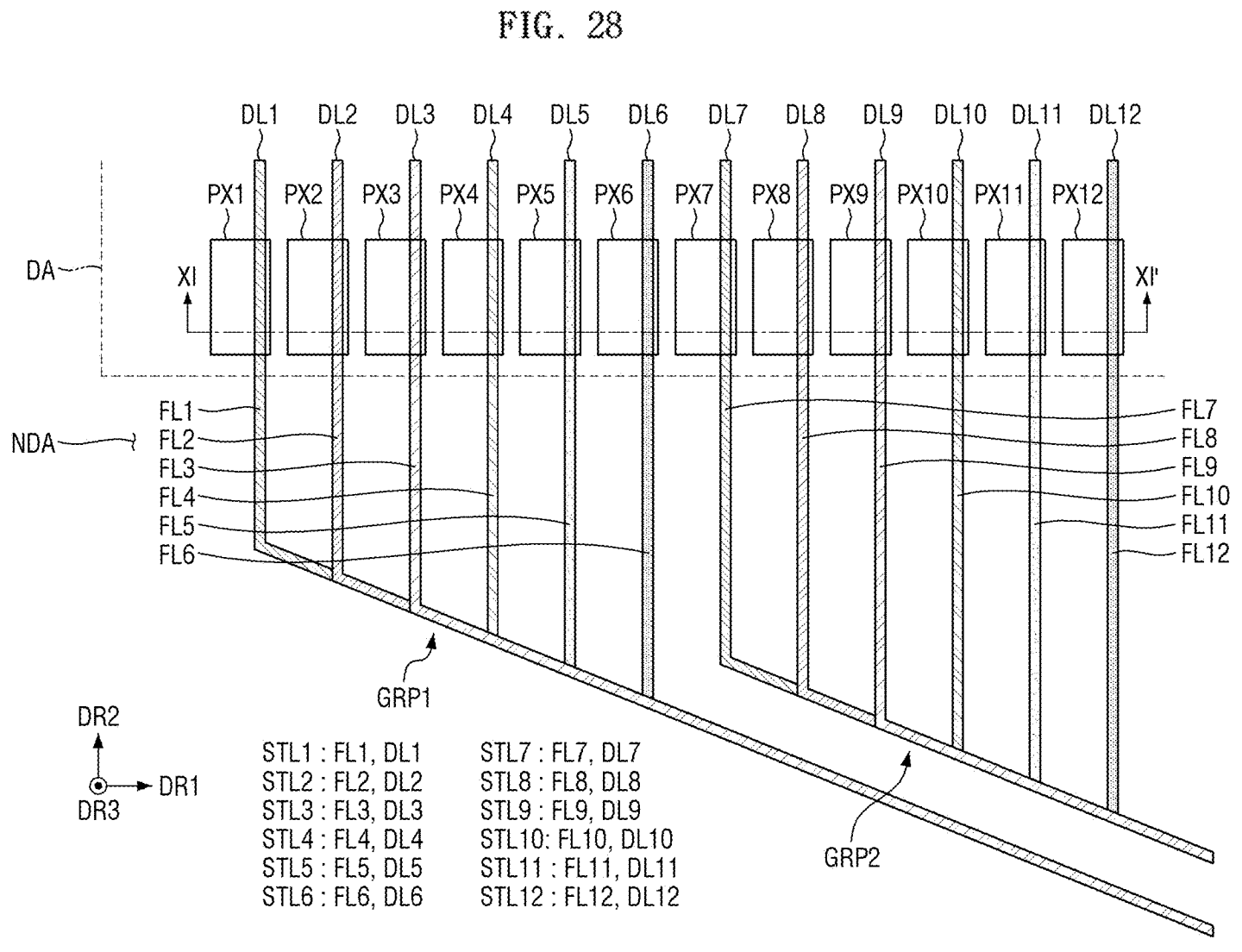

STL1 : FL1, DL1
STL2 : FL2, DL2
STL3 : FL3, DL3
STL4 : FL4, DL4
STL5 : FL5, DL5
STL6 : FL6, DL6

STL7 : FL7, DL7
STL8 : FL8, DL8
STL9 : FL9, DL9
STL10: FL10, DL10
STL11 : FL11, DL11
STL12 : FL12, DL12

FIG. 29

STL4 : DL4, FL4

DISPLAY DEVICE

CROSS-REFERENCE TO RELATED APPLICATION

The present application claims priority to and the benefit of Korean Patent Application No. 10-2023-0102647, filed on Aug. 7, 2023, in the Korean Intellectual Property Office, the entire content of which is incorporated by reference herein.

BACKGROUND

1. Field

The present disclosure relates to a display device, and for example, to a display device capable of reducing or minimizing a dead space area.

2. Description of the Related Art

An organic light emitting display device includes a display element of which luminance is changed by current, for example, an organic light emitting diode.

SUMMARY

Aspects of embodiments of the present disclosure provide a display device capable of reducing or minimizing a dead space area.

According to one or more embodiments of the present disclosure, a display device including: a substrate having a display area and a non-display area; a signal transmission line including a signal line in the display area of the substrate and a fan-out line extending from the signal line and in the non-display area of the substrate; and a plurality of pixels in the display area of the substrate, wherein a plurality of signal transmission lines include the signal transmission line and are respectively connected to the plurality of pixels, and wherein the plurality of signal transmission lines are on different layers on the substrate.

In one or more embodiments, the plurality of signal transmission lines overlap in the non-display area.

In one or more embodiments, a plurality of fan-out lines of the plurality of signal transmission lines overlap in the non-display area and include the fan-out line.

In one or more embodiments, when a longest fan-out line from among the plurality of fan-out lines of the plurality of signal transmission lines is a reference fan-out line, an overlapping area between the reference fan-out line and each of the plurality of fan-out lines other than the reference fan-out line is different.

In one or more embodiments, the plurality of signal transmission lines do not overlap in the display area.

In one or more embodiments, a plurality of signal lines of the plurality of signal transmission lines do not overlap in the display area and include the signal line.

In one or more embodiments, a plurality of fan out lines of the plurality of signal transmission lines have different lengths and include the fan-out line.

In one or more embodiments, the plurality of signal transmission lines are on succeeding higher layers as they are arranged with each other along one direction.

In one or more embodiments, further including a plurality of connection electrodes respectively connecting the plurality of signal transmission lines to the plurality of pixels.

In one or more embodiments, the plurality of signal transmission lines have different lengths, and a plurality of signal lines are connected to the plurality of pixels by a smaller number of the connection electrodes as they have greater lengths and include the signal line.

In one or more embodiments, the plurality of signal transmission lines are connected to the plurality of pixels by a greater number of the connection electrodes as they are on succeeding higher layers.

In one or more embodiments, a plurality of signal lines of the plurality of signal transmission lines are connected to a plurality of transistors of the plurality of pixels through the plurality of connection electrodes and include the signal line.

In one or more embodiments, the plurality of signal transmission lines are a first group of signal transmission lines, and the display device further including a second group of signal transmission lines adjacent to the first group of signal transmission lines and including a plurality of other signal transmission lines that do not overlap the first group of signal transmission lines.

In one or more embodiments, two signal transmission lines in different groups of signal transmission lines and located adjacent to each other are at a same layer.

In one or more embodiments, the first group of signal transmission lines are on succeeding higher layers as they are arranged with each other along one direction, and the second group of signal transmission lines are on succeeding lower layers as they are arranged with other along the one direction.

In one or more embodiments, further including: a plurality of first capacitor layers respectively on the plurality of pixels; and a plurality of second capacitor layers respectively on the first capacitor layers.

In one or more embodiments, at least one signal transmission line of the plurality of signal transmission lines is at a same layer as at least one capacitor layer selected from among the first capacitor layer and the second capacitor layer.

In one or more embodiments, a capacitor layer on a different layer from the at least one signal transmission line has a larger area than a capacitor layer at a same layer as the at least one signal transmission line.

In one or more embodiments, a capacitor layer on a different layer from the at least one signal transmission line overlaps the at least one signal transmission line in the display area.

In one or more embodiments, a capacitor layer on the different layer from the at least one signal transmission line overlaps a signal line of the at least one signal transmission line in the display area.

In one or more embodiments, at least one signal transmission line of the plurality of signal transmission lines overlaps an edge of at least one pixel.

In one or more embodiments, at least one signal transmission line of the plurality of signal transmission lines overlaps a center of at least one pixel.

In one or more embodiments, one unit pixel includes at least two or more pixels from among the plurality of pixels, and the plurality of signal transmission lines respectively connected to the pixels of the one unit pixel are at an edge of the unit pixel.

In one or more embodiments, further including a display driver in the non-display area of the substrate, wherein the plurality of signal transmission lines are connected to the display driver in the non-display area.

According to one or more embodiments of the present disclosure, a display device including: a substrate having a display area and a non-display area; a plurality of pixels in the display area; and a plurality of signal transmission lines respectively connected to the plurality of pixels in the display area, and extending from the display area to the non-display area, wherein the plurality of signal transmission lines are located on different layers on the substrate.

In one or more embodiments, the plurality of signal transmission lines overlap in the non-display area.

In one or more embodiments, when a longest signal transmission line from among the plurality of signal transmission lines is a reference signal transmission line, an overlapping area between the reference signal transmission line and each of the plurality of signal transmission lines other than the reference signal transmission line is different.

In one or more embodiments, the plurality of signal transmission lines do not overlap in the display area.

In one or more embodiments, the plurality of signal transmission lines are on succeeding higher layers as they are arranged with each other along one direction.

In one or more embodiments, further including a plurality of connection electrodes respectively connecting the plurality of signal transmission lines to the plurality of pixels.

In one or more embodiments, the plurality of signal transmission lines have different lengths, and the plurality of signal transmission lines are connected to the pixels by a smaller number of the connection electrodes as they have greater lengths.

In one or more embodiments, the plurality of signal transmission lines are connected to the pixels by a greater number of the connection electrodes as they are on succeeding higher layers.

In the display device according to the present disclosure, signal transmission lines overlap in a non-display area, and thus the density of fan-out lines in a fan-out region may increase. Accordingly, the size of the fan-out region may be reduced and the dead space area of the display device may be minimized or reduced.

The effects, aspects, and features of embodiments of the present disclosure are not limited to the above-described effects, aspects, and features, and other effects, aspects, and features, which are not described herein will become apparent to those skilled in the art from the following description.

BRIEF DESCRIPTION OF DRAWINGS

The above and other aspects and features of embodiments of the present disclosure will become more apparent by describing in more detail example embodiments thereof with reference to the attached drawings, in which:

FIG. 6 is a cross-sectional view of a display device according to one or more embodiments;

FIG. 10 is a cross-sectional view along the line III-III' of FIG. 7;

FIG. 13 is a cross-sectional view taken along the line B-IV of FIG. 11;

FIG. 16 is a cross-sectional view taken along the line E-IV of FIG. 11;

FIG. 17 is a cross-sectional view taken along the line F-IV of FIG. 11;

FIG. 18 is a plan view of a display device according to one or more embodiments;

FIG. 19 is a cross-sectional view taken along the line V-V' of FIG. 18;

FIG. 20 is a plan view of a display device according to one or more embodiments;

FIG. 22 is a cross-sectional view taken along the line VII-VII' of FIG. 20;

FIG. 24 is a plan view of a display device according to one or more embodiments;

FIG. 25 is a cross-sectional view taken along the line IX-IX' of FIG. 24;

FIG. 26 is a plan view of a display device according to one or more embodiments;

FIG. 27 is a cross-sectional view along the line XX' of FIG. 26;

FIG. 28 is a plan view of a display device according to one or more embodiments;

FIG. 29 is a cross-sectional view taken along the line XI-XI' of FIG. 28;

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to embodiments set forth herein. Rather, these embodiments are provided so that the present disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the present disclosure. In the attached drawings, the thickness of layers and regions is exaggerated for clarity.

Although the terms "first", "second", etc. may be used herein to describe one or more suitable elements, these elements, should not be limited by these terms. These terms may be utilized to distinguish one element from another element. Thus, a first element discussed may be termed a second element without departing from teachings of one or more embodiments of the present disclosure. The description of an element as a "first" element may not require or imply the presence of a second element or other elements. The terms "first", "second", etc. may also be utilized herein to differentiate different categories or sets of elements. For conciseness, the terms "first", "second", etc. may represent "first-category (or first-set)", "second-category (or second-set)", etc., respectively.

Aspects and features of one or more suitable embodiments of the present disclosure may be combined partially or totally. As will be clearly appreciated by those skilled in the art, technically one or more suitable interactions and operations are possible. One or more embodiments can be practiced individually or in combination.

Hereinafter, embodiments will be described in more detail with reference to the accompanying drawings.

Figure 1:
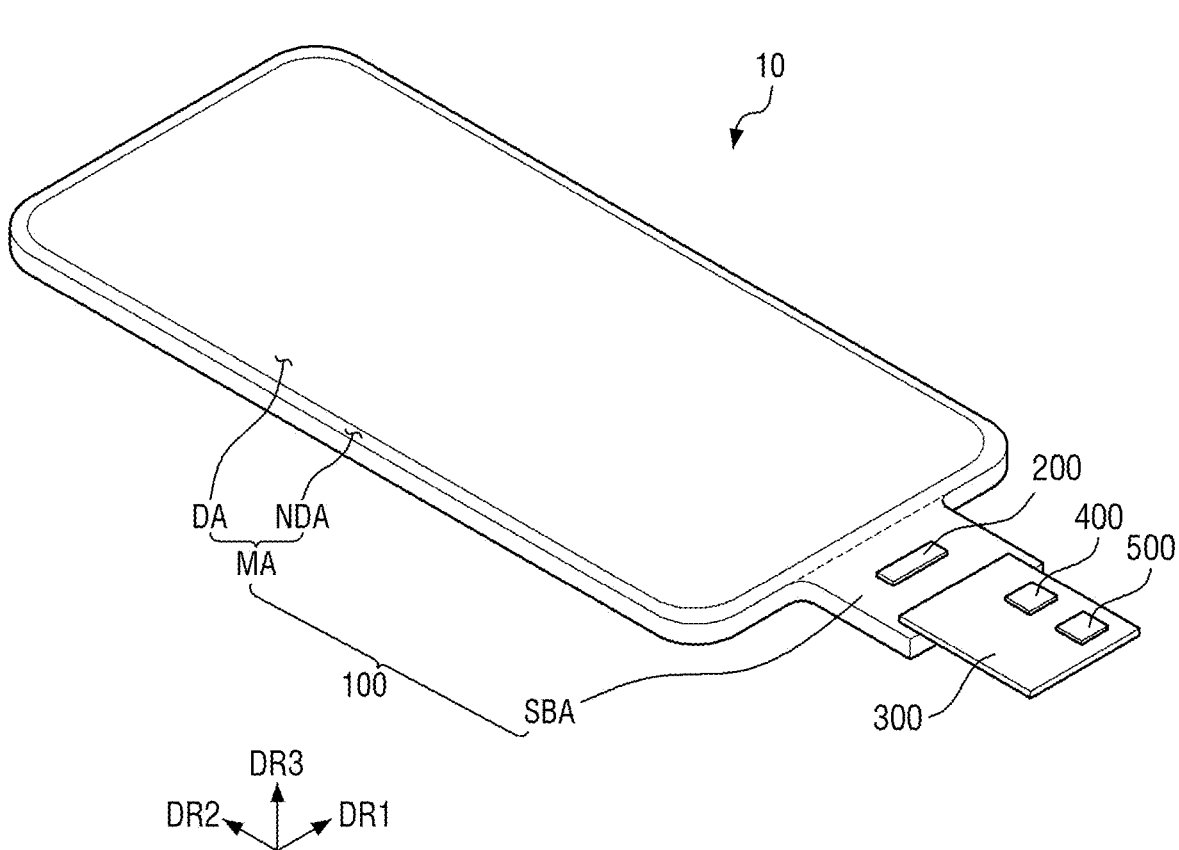
FIG. 1 is a perspective view showing a display device according to one or more embodiments.

FIG. 1 is a perspective view showing a display device according to one or more embodiments.

Referring to FIG. 1, a display device 10 may be applied to portable electronic devices such as a mobile phone, a smartphone, a tablet personal computer, a mobile communication terminal, an electronic organizer, an electronic book, a portable multimedia player (PMP), a navigation system, an ultra-mobile PC (UMPC), and/and/or the like. For example, the display device 10 may be applied as a display unit of a television, a laptop, a monitor, a billboard, and/or an Internet-of-Things (IoT) device. For another example, the display device 10 may be applied to wearable devices such as a smart watch, a watch phone, a glasses type or kind display, or a head mounted display (HMD).

The display device 10 may have a planar shape similar to a quadrilateral shape. For example, the display device 10 may have a planar shape similar to a quadrilateral shape having a short side in a first direction DR1 and a long side in a second direction DR2. A corner where the short side in the first direction DR1 and the long side in the second direction DR2 meet may be right-angled or rounded with a suitable curvature (e.g., a set or predetermined curvature). The planar shape of the display device 10 is not limited to a quadrilateral shape, and may be formed in a shape similar to another polygonal shape, a circular shape, and/or elliptical shape.

The display device 10 may include a display panel 100, a display driver 200, a circuit board 300, a touch driver 400, and a power supply unit 500.

The display panel 100 may include a main region MA and a sub-region SBA.

The main region MA may include the display area DA including pixels displaying an image and the non-display area NDA disposed around the display area DA along an edge or periphery of the display area DA. The display area DA may be to emit light from a plurality of emission areas or a plurality of opening areas. For example, the display panel 100 may include a pixel circuit including switching elements, a pixel defining layer defining an emission area or an opening area, and a self-light emitting element.

For example, the self-light emitting element may include at least one of an organic light emitting diode (LED) including an organic light emitting layer, a quantum dot LED including a quantum dot light emitting layer, an inorganic LED including an inorganic semiconductor, or a micro LED, but is not limited thereto.

The non-display area NDA may be an area outside the display area DA. The non-display area NDA may be defined as an edge area of the main region MA of the display panel 100. The non-display area NDA may include a gate driver that is configured to supply gate signals to the gate lines, and fan-out lines that connect the display driver 200 to the display area DA.

The sub-region SBA may extend from one side of the main region MA. The sub-region SBA may include a flexible material that can be bent, folded, and/or rolled. For example, when the sub-region SBA is bent, the sub-region SBA may overlap the main region MA in a thickness direction of the display device 10 (e.g., a third direction DR3). The sub-region SBA may include the display driver 200 and a pad portion connected to the circuit board 300. In one or more embodiments, the sub-region SBA may not be provided (e.g., be excluded), and the display driver 200 and the pad portion may be arranged in the non-display area NDA.

The display driver 200 may output signals and voltages for driving the display panel 100. The display driver 200 may supply data voltages to data lines DL (e.g., see FIG. 4). The display driver 200 may supply a power voltage to the power line and may supply a gate control signal to the gate driver. The display driver 200 may be formed as an integrated circuit (IC) and mounted on the display panel 100 by a chip on glass (COG) method, a chip on plastic (COP) method, and/or an ultrasonic bonding method. For example, the display driver 200 may be disposed in the sub-region SBA, and may overlap the main region MA in the thickness direction of the display device 10 (e.g., the third direction DR3) by bending of the sub-region SBA. For another example, the display driver 200 may be mounted on the circuit board 300.

The circuit board 300 may be attached to the pad portion of the display panel 100 by utilizing an anisotropic conductive film (ACF). Lead lines of the circuit board 300 may be electrically connected to the pad portion of the display panel 100. The circuit board 300 may be a flexible printed circuit board (FPCB), a printed circuit board (PCB), and/or a flexible film such as a chip on film.

The touch driver 400 may be mounted on the circuit board 300.

The power supply unit 500 may be disposed on the circuit board 300 to supply a power voltage to the display driver 200 and the display panel 100. The power supply unit 500 may generate a driving voltage to supply it to a driving voltage line VDL (e.g., see FIG. 3), and may generate a common voltage to supply it to a common electrode that is common to the light emitting elements of a plurality of pixels. For example, the driving voltage may be a high potential voltage for driving the light emitting element, and the common voltage may be a low potential voltage for driving the light emitting element.

Figure 2:
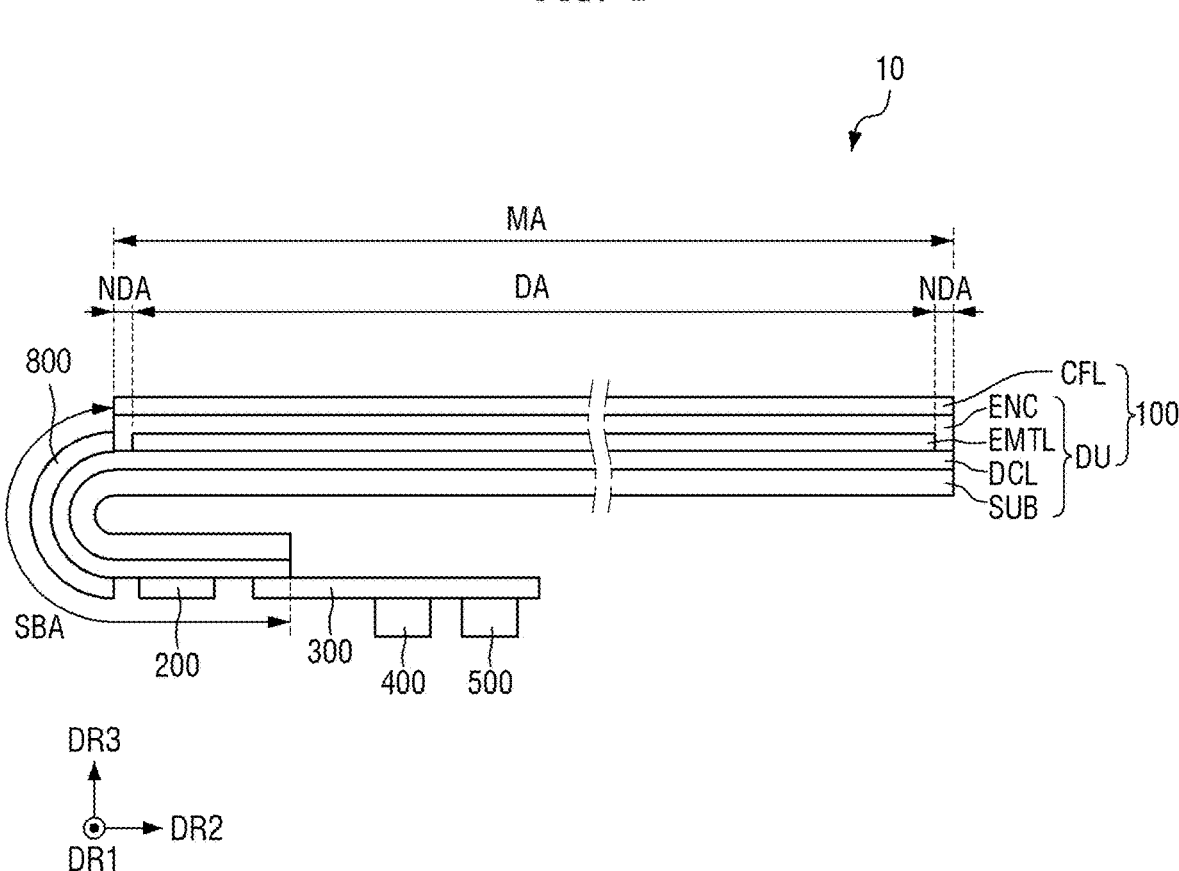
FIG. 2 is a cross-sectional view illustrating a display device according to one or more embodiments.

FIG. 2 is a cross-sectional view illustrating a display device according to one or more embodiments.

Referring to FIG. 2, the display panel 100 may include a display unit DU and a color filter layer CFL. The display unit DU may include a substrate SUB, a driving circuit layer DCL, a light emitting element layer EMTL, and an encapsulation layer ENC.

The substrate SUB may be a base substrate SUB or a base member. The substrate SUB may be a flexible substrate SUB that can be bent, folded, and/or rolled. For example, the substrate SUB may include a polymer resin such as polyimide (PI), but is not limited thereto. For another example, the substrate SUB may include a glass material and/or a metal material.

The driving circuit layer DCL may be disposed on the substrate SUB. The driving circuit layer DCL may include a plurality of transistors. The driving circuit layer DCL may further include the gate lines, the data lines DL (e.g., see FIG. 3), the power lines, gate control lines, the fan-out lines that connect the display driver 200 to the data lines DL, and the lead lines that connect the display driver 200 to the pad portion. Each of the transistors may include a semiconductor region, a source electrode, a drain electrode, and a gate electrode. For example, when the gate driver is formed on one side of the non-display area NDA of the display panel 100, the gate driver may include transistors.

The driving circuit layer DCL may be disposed in the display area DA, the non-display area NDA, and the sub-region SBA. Transistors, gate lines, data lines DL (e.g., see FIG. 3), and power lines of the pixels of the driving circuit layer DCL may be disposed in the display area DA. Gate control lines and fan-out lines of the driving circuit layer DCL may be disposed in the non-display area NDA. The lead lines of the driving circuit layer DCL may be disposed in the sub-region SBA.

The light emitting element layer EMTL may be disposed on the driving circuit layer DCL. The light emitting element layer EMTL may include the plurality of light emitting elements ED (e.g., see FIG. 5) in which a pixel electrode, a light emitting layer, and a common electrode are sequentially stacked to emit light, and the pixel defining layer defining the pixels. The plurality of light emitting elements ED (e.g., see FIG. 5) of the light emitting element layer EMTL may be disposed in the display area DA.

For example, the light emitting layer of the light emitting elements ED (e.g., see FIG. 5) may be an organic light emitting layer including an organic material. The light emitting layer of the light emitting elements ED (e.g., see FIG. 5) may include a hole transporting layer, an organic light emitting layer, and an electron transporting layer. When the pixel electrode receives a suitable voltage (e.g., a set or predetermined voltage) through the transistor of the driving circuit layer DCL and the common electrode receives the cathode voltage, holes and electrons may be transferred to the organic light emitting layer through the hole transporting layer and the electron transporting layer, respectively and may be combined with each other to emit light in the organic light emitting layer. For example, the pixel electrode may be an anode electrode, and the common electrode may be a cathode electrode, but the present disclosure is not limited thereto.

For another example, each of the plurality of light emitting elements ED (e.g., see FIG. 5) may include a quantum dot light emitting diode including a quantum dot light emitting layer, an inorganic light emitting diode including an inorganic semiconductor, and/or a micro light emitting diode.

The encapsulation layer ENC may cover the top surface and the side surface of the light emitting element layer EMTL, and may protect the light emitting element layer EMTL. The encapsulation layer ENC may include at least one inorganic layer and/or at least one organic layer for encapsulating the light emitting element layer EMTL.

The color filter layer CFL may be disposed on the encapsulation layer ENC. The color filter layer CFL may include a plurality of color filters respectively corresponding to the plurality of emission areas. Each of the color filters may selectively transmit light of a specific wavelength and may block or reduce or absorb light of a different wavelength. The color filter layer CFL may be to absorb a part of light coming from the outside of the display device 10 to reduce reflected light due to external light. Accordingly, the color filter layer CFL may prevent or reduce color distortion caused by reflection of the external light.

The sub-region SBA of the display panel 100 may extend from one side of the main region MA. The sub-region SBA may include a flexible material that can be bent, folded, and/or rolled. For example, when the sub-region SBA is bent, the sub-region SBA may overlap the main region MA in the thickness direction of the display device 10 (e.g., the third direction DR3). The sub-region SBA may include the display driver 200 and the pad portion electrically connected to the circuit board 300.

When the sub-region SBA is bent, as shown in FIG. 2, a protective layer 800 may be further disposed on the bent portion of the sub-region SBA.

Figure 3:
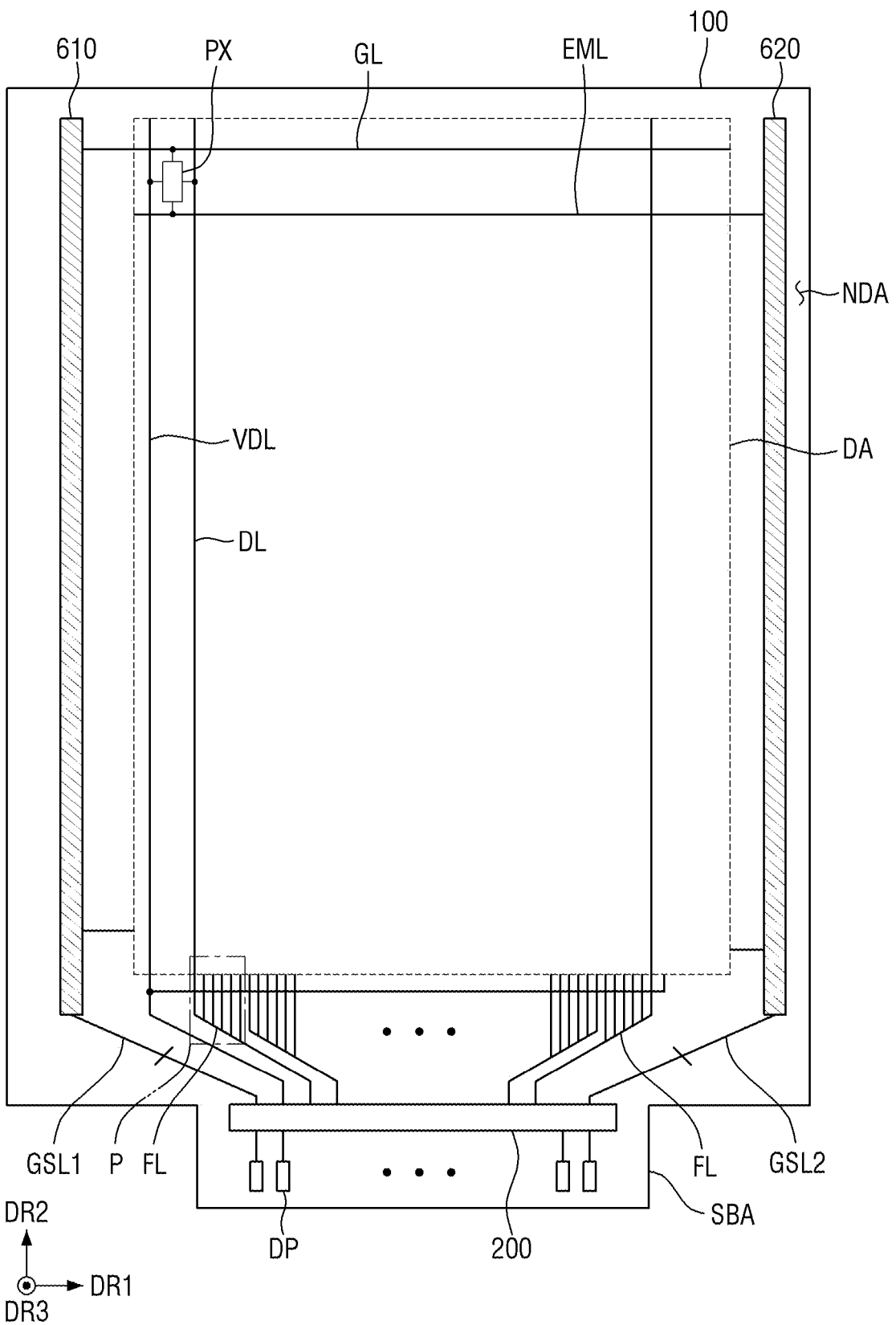
FIG. 3 is a plan view illustrating a display unit of a display device according to one embodiment.
Figure 4:
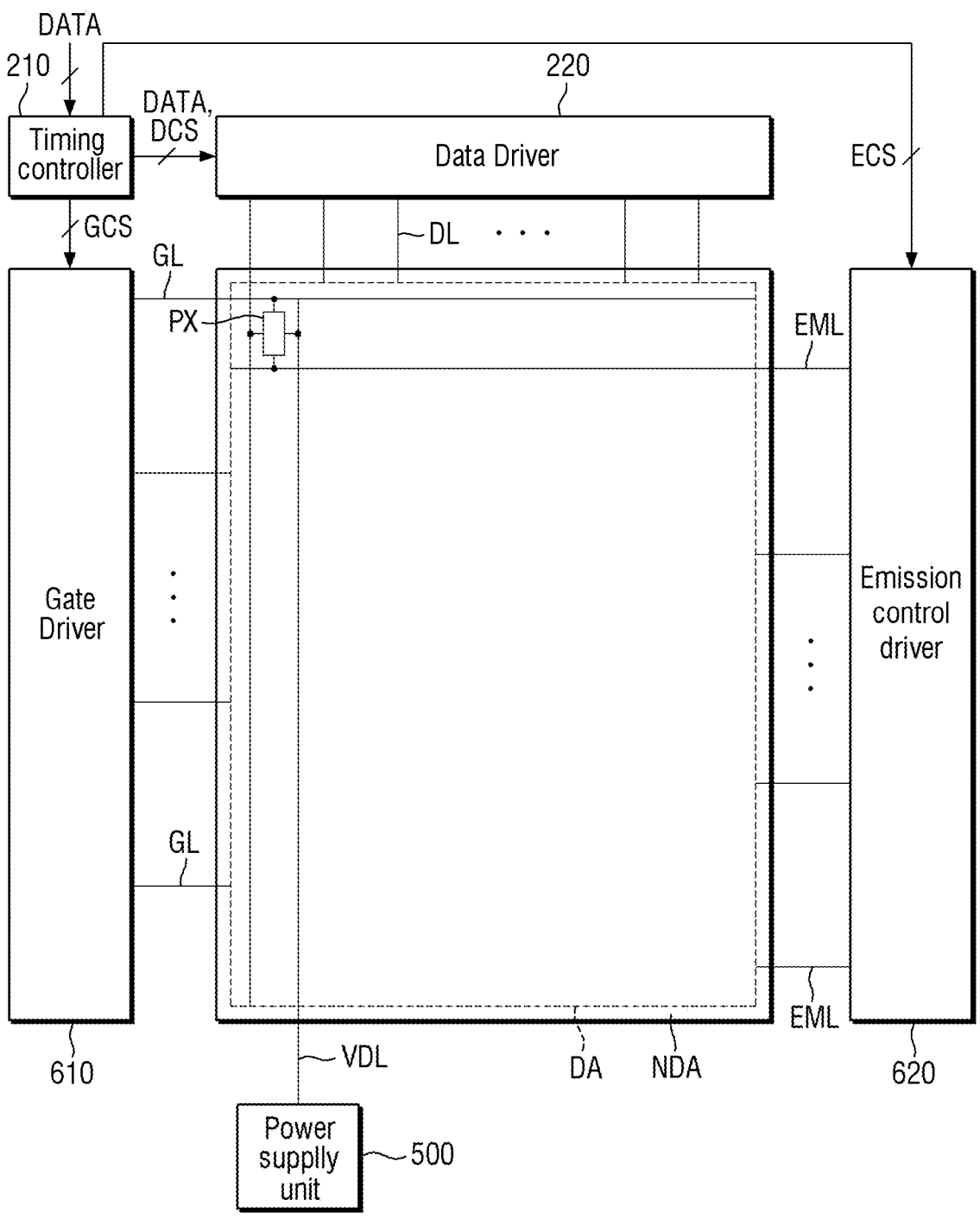
FIG. 4 is a block diagram illustrating a display panel and a display driver according to one or more embodiments.

FIG. 3 is a plan view illustrating a display unit of a display device according to one or more embodiments. FIG. 4 is a block or reduce diagram illustrating a display panel and a display driver according to one or more embodiments.

Referring to FIGS. 3 and 4, the display panel 100 may include the display area DA and the non-display area NDA.

The display area DA may include a plurality of pixels PX, and a plurality of signal transmission lines connected to the plurality of pixels PX. Here, the plurality of signal transmission lines may include a plurality of gate lines GL of a plurality of common voltage lines VSL (e.g., see FIG. 5), a plurality of emission lines EML and a plurality of data lines DL, and the fan-out lines connected to the aforementioned lines.

Each of the plurality of pixels PX may be connected to the gate line GL, the data line DL, the emission line EML, the driving voltage line VDL, and the common voltage line VSL. Each of the pixels PX may include at least one transistor, the light emitting element ED (e.g., see FIG. 5), and a capacitor.

Each of the plurality of gate lines GL may extend in the first direction DR1 and may be spaced (e.g., spaced and/or apart) from each other in the second direction DR2 crossing the first direction DR1. The gate lines GL may be arranged along the second direction DR2. The gate lines GL may sequentially supply gate signals to the plurality of pixels PX.

The emission lines EML may each extend in the first direction DR1 and may be spaced from each other in the second direction DR2. The emission line EML may be arranged along the second direction DR2. The emission lines EML may sequentially supply an emission signal to the plurality of pixels PX.

The data lines DL may extend in the second direction DR2 and may be spaced from each other in the first direction DR1. The data lines DL may be arranged along the first direction DR1. The data lines DL may supply data voltages to the plurality of pixels PX. The data voltage may determine the luminance of each of the pixels PX.

The driving voltage lines VDL may extend in the second direction DR2 and may be spaced from each other in the first direction DR1. The driving voltage lines VDL may be arranged along the first direction DR1. The driving voltage lines VDL may supply a driving voltage to the plurality of pixels PX. The driving voltage may be a high potential voltage for driving the light emitting element ED of the pixels PX.

The non-display area NDA may be around (e.g., may surround) the display area DA. The non-display area NDA may include a gate driver 610, an emission control driver 620, fan-out lines FL, a first gate control line GSL1, and a second gate control line GSL2.

The fan-out lines FL may extend from the display driver 200 to the display area DA. The fan-out lines FL may supply the data voltage received from the display driver 200 to the plurality of data lines DL.

The first gate control line GSL1 may extend from the display driver 200 to the gate driver 610. The first gate control line GSL1 may supply a gate control signal GCS (e.g., see FIG. 4) received from the display driver 200 to the gate driver 610.

The second gate control line GSL2 may extend from the display driver 200 to the emission control driver 620. The second gate control line GSL2 may supply an emission control signal ECS (e.g., see FIG. 4) received from the display driver 200 to the emission control driver 620.

The sub-region SBA may extend from one side of the non-display area NDA. The sub-region SBA may include the display driver 200 and a pad portion DP. The pad portion DP may be disposed closer to one edge of the sub-region SBA than the display driver 200. The pad portion DP may be electrically connected to the circuit board 300 through an anisotropic conductive film ACF.

The display driver 200 may include a timing controller 210 and a data driver 220 (e.g., see FIG. 4).

The timing controller 210 may receive a digital video data signal DATA and timing signals from the circuit board 300. The timing controller 210 may generate, based on the timing signals, a data control signal DCS to control the operation timing of the data driver 220, the gate control signal GCS to control the operation timing of the gate driver 610, and the emission control signal ECS to control the operation timing of the emission control driver 620. The timing controller 210 may supply the gate control signal GCS to the gate driver 610 through the first gate control line GSL1. The timing controller 210 may supply the emission control signal ECS to the emission control driver 620 through the second gate control line GSL2. The timing controller 210 may supply the digital video data signal DATA and the data control signal DCS to the data driver 220.

The data driver 220 may convert the digital video data signal DATA into analog data voltages and supply them to the data lines DL through the fan-out lines FL. The gate signals of the gate driver 610 may select the pixels PX to which the data voltage is supplied, and the selected pixels PX may receive the data voltage through the data lines DL.

The power supply unit 500 may be disposed on the circuit board 300 to supply a power voltage to the display driver 200 and the display panel 100. The power supply unit 500 may generate a driving voltage to supply it to the driving voltage line VDL, and may generate a common voltage to supply it to a common electrode that is common to the light emitting elements ED (e.g., see FIG. 5) of a plurality of pixels.

The gate driver 610 may be disposed at one external side of the display area DA or at one side of the non-display area NDA. The emission control driver 620 may be disposed at the other external side of the display area DA or at the other side of the non-display area NDA. However, the present disclosure is not limited thereto. As another example, the gate driver 610 and the emission control driver 620 may be disposed at any one of one side and the other side of the non-display area NDA.

The gate driver 610 may include a plurality of transistors for generating gate signals based on the gate control signal GCS. The emission control driver 620 may include a plurality of transistors for generating emission signals based on the emission control signal ECS. For example, the transistors of the gate driver 610 and the transistors of the emission control driver 620 may be formed on (e.g., at) the same layer as the transistors of each of the pixels PX. The gate driver 610 may supply the gate signals to the gate lines GL, and the emission control driver 620 may supply the emission signals to the emission lines EML.

Figure 5:
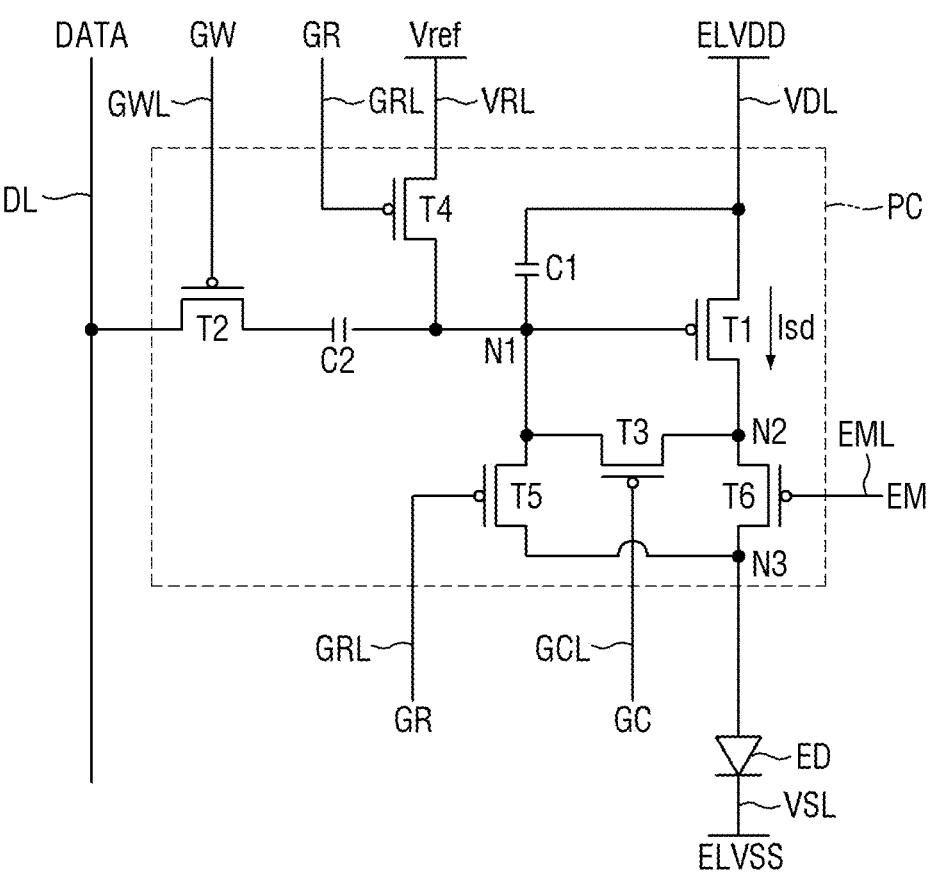
FIG. 5 is a circuit diagram of one pixel of a display device according to one or more embodiments.

FIG. 5 is a circuit diagram of one pixel of a display device according to one or more embodiments.

The pixel PX may be connected to a first gate line GWL, a second gate line GCL, a third gate line GRL, the emission line EML, the data line DL, the driving voltage line VDL, the common voltage line VSL, and a reference voltage line VRL. Here, the common voltage line VSL may be connected to the common electrode (e.g., the cathode electrode) of the light emitting element ED.

The pixel PX may include a pixel circuit PC and the light emitting element ED. The pixel circuit PC may include a first transistor T1, a second transistor T2, a third transistor T3, a fourth transistor T4, a fifth transistor T5, a sixth transistor T6, a first capacitor C1, and a second capacitor C2.

The first transistor T1 (for example, a driving transistor) may include a gate electrode, a source electrode, and a drain electrode. The first transistor T1 may control a source-drain current (hereinafter, a driving current) according to the data voltage applied to the gate electrode of the first transistor T1. The driving current (e.g., Isd) flowing through a channel region of the first transistor T1 may be proportional to the square of a difference between the threshold voltage Vth of first transistor T1 and the voltage Vsg between the source electrode and the gate electrode of the first transistor T1($Isd=k\times(Vsg-Vth)^2$). Here, k is a proportional coefficient determined by the structure and physical characteristics of the first transistor T1, Vsg is a source-gate voltage of the first transistor T1, and Vth is a threshold voltage of the first transistor T1.

The light emitting element ED may be to emit light by receiving the driving current Isd. The emission amount or the luminance of the light emitting element ED may be proportional to the magnitude of the driving current Isd.

The light emitting element ED may be an organic light emitting diode including a first electrode, a second electrode, and an organic light emitting layer disposed between the first electrode and the second electrode. For another example, the light emitting element ED may be an inorganic light emitting element including a first electrode, a second electrode, and an inorganic semiconductor disposed between the first electrode and the second electrode. For still another example, the light emitting element ED may be a quantum dot light emitting element including a first electrode, a second electrode, and a quantum dot light emitting layer disposed between the first electrode and the second electrode. For still another example, the light emitting element ED may be a micro light emitting diode.

The first electrode of the light emitting element ED may be electrically connected to a third node N3. The second electrode of the light emitting element ED may be connected to the common voltage line VSL. The second electrode of the light emitting element ED may receive a common voltage (e.g., low potential voltage) from the common voltage line VSL.

The second transistor T2 may be turned on by a first gate signal GW of the first gate line GWL to electrically connect the data line DL to the second electrode of the second capacitor C2. The gate electrode of the second transistor T2 may be electrically connected to the first gate line GWL to receive the first gate signal GW, the source electrode thereof may be electrically connected to the data line DL, and the drain electrode thereof may be electrically connected to the second electrode of the second capacitor C2. The data line DL may be to transmit the data signal DATA to the pixel PX.

The third transistor T3 may be turned on by the second gate signal GC of the second gate line GCL to electrically connect a first node N1 to a second node N2. The gate electrode of the third transistor T3 may be electrically connected to the second gate line GCL to receive the second gate signal GC, the source electrode thereof may be electrically connected to the first node N1, and the drain electrode thereof may be electrically connected to the second node N2.

The fourth transistor T4 may be turned on by a third gate signal GR of the third gate line GRL to electrically connect a reference voltage line VRL to the first node N1. The gate electrode of the fourth transistor T4 may be electrically connected to the third gate line GRL to receive third gate signal GR, the source electrode thereof may be electrically connected to the reference voltage line VRL, and the drain electrode thereof may be electrically connected to the first node N1. The reference voltage line VRL may be to transmit a reference voltage Vref. The reference voltage Vref may be, for example, greater (e.g., level higher) than a common voltage ELVSS and less (e.g., level less) than a driving voltage ELVDD.

The fifth transistor T5 may be turned on by the third gate signal GR of the third gate line GRL to electrically connect the first node N1 to the third node N3. The gate electrode of the fifth transistor T5 may be electrically connected to the third gate line GRL to receive the third gate signal GR, the source electrode thereof may be electrically connected to the first node N1, and the drain electrode thereof may be electrically connected to the third node N3.

The sixth transistor T6 may be turned on by the emission signal EM of the emission line EML to electrically connect the second node N2 that is the drain electrode of the first transistor T1 with the third node N3 that is the first electrode of the light emitting element ED. The gate electrode of the sixth transistor T6 may be electrically connected to the emission line EML to receive the emission signal EM, the source electrode thereof may be electrically connected to the second node N2, and the drain electrode thereof may be electrically connected to the third node N3.

The first capacitor C1 may be connected between the first node N1, which is the gate electrode of the first transistor T1, and the driving voltage line VDL. For example, the first electrode of the first capacitor C1 may be electrically connected to the first node N1, and the second electrode of the first capacitor C1 may be electrically connected to the driving voltage line VDL.

The second capacitor C2 may be electrically connected between the first node N1, which is the gate electrode of the first transistor T1, and the drain electrode of the second transistor T2. For example, the first electrode of the second capacitor C2 may be electrically connected to the first node N1, and the second electrode of the second capacitor C2 may be electrically connected to the drain electrode of the second transistor T2.

When the first transistor T1 and the sixth transistor T6 are turned on, a driving current (e.g., Isd) may be supplied to the light emitting element ED, so that the light emitting element ED may be to emit light.

At least one of the aforementioned first to sixth transistors T1 to T6 may be a metal-oxide-semiconductor field effect transistor (MOSFET). For example, each of the first to sixth transistors T1 to T6 may be a P-type or kind MOSFET. In some embodiments, each of the first to sixth transistors T1 to T6 may be an N-type or kind MOSFET. In still another example, some of the first to sixth transistors T1 to T6 may be P-type or kind MOSFETs, and the other transistors may be N-type or kind MOSFETs.

Figure 6:
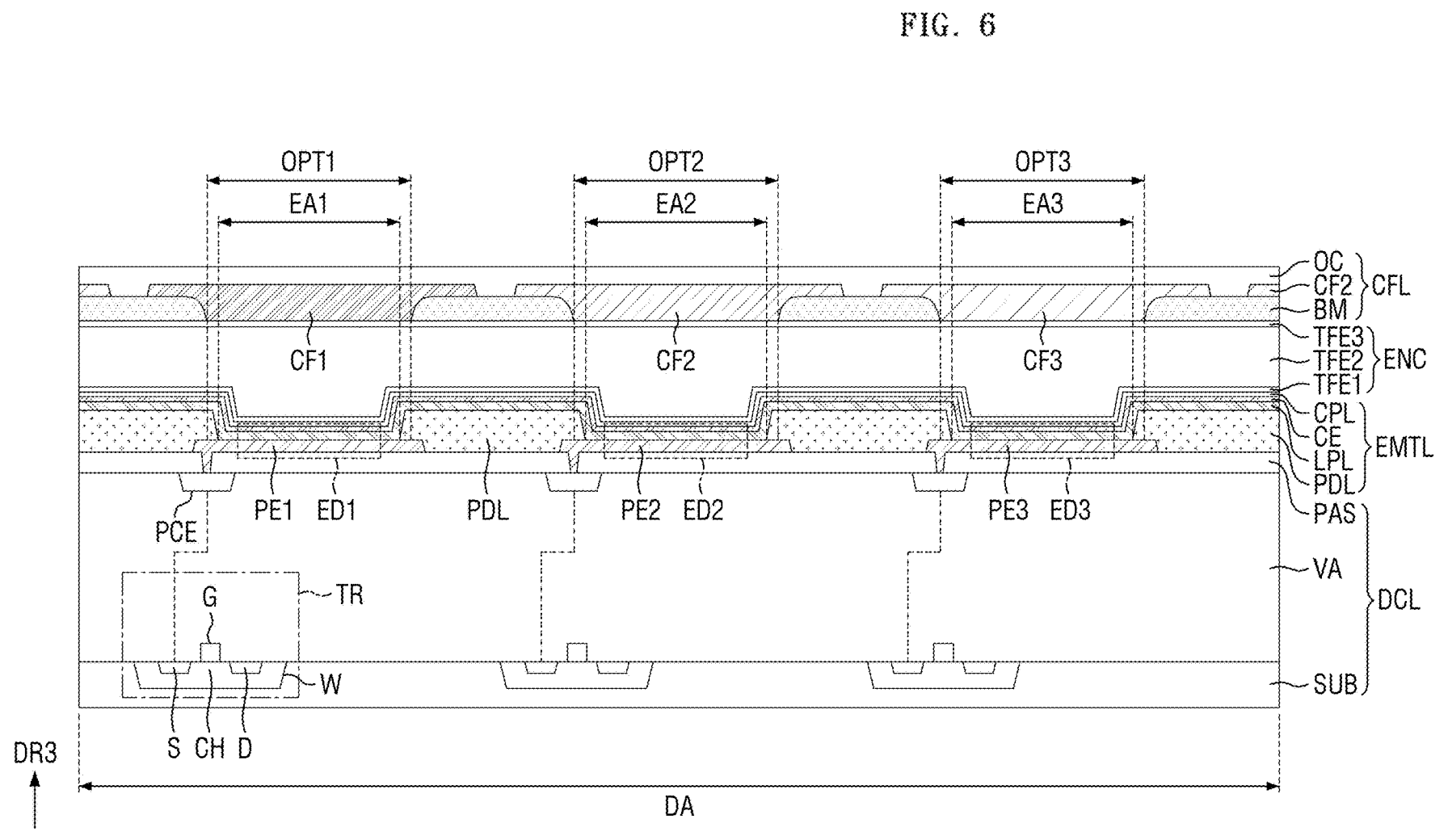

FIG. 6 is a cross-sectional view of a display device according to one or more embodiments.

As shown in FIG. 6, the display device 10 may include the driving circuit layer DCL, the light emitting element layer EMTL, the encapsulation layer ENC, and the color filter layer CFL.

The substrate SUB may be a silicon substrate SUB, a germanium substrate SUB, and/or a silicon-germanium substrate SUB. The substrate SUB may be a substrate SUB doped with first type or kind impurities.

A well region W may be disposed on the substrate SUB (or in the substrate SUB). The well region W may be a region doped with second type or kind impurities. The second type or kind impurity may be different from the aforementioned first type or kind impurity. For example, when the first type or kind impurity is a p-type or kind (e.g., P) impurity, the second type or kind impurity may be an n-type or kind (e.g., N) impurity. In one or more embodiments, when the first type or kind impurity is an n-type or kind impurity, the second type or kind impurity may be a p-type or kind impurity.

A source region S, a drain region D, and a channel region CH of a transistor TR may be disposed in the well region W. For example, the source region S (or source electrode) and the drain region D (or drain electrode) of the transistor TR may be disposed in the well region W. Each of the source region S and the drain region D may be a region doped with the aforementioned first type or kind impurities. The gate electrode G of the transistor TR may cross and overlap the well region W in the third direction DR3. In a plan view, the well region W crossing the gate electrode G may be defined as two parts, and the source region S may be disposed in any one of the two parts, and the drain region D may be disposed in the other part thereof. In other words, in the well region W, the source region S and the drain region D may be disposed on both (e.g., simultaneously) sides of the gate electrode G with the gate electrode G interposed therebetween. The channel region CH of the transistor may be disposed in the region of the well region W that overlaps the gate electrode G in the third direction DR3. The transistor TR shown in FIG. 6 may be, for example, the first transistor T1 of FIG. 5.

In one or more embodiments, the source region S may include a first low-concentration impurity region having an impurity concentration relatively lower than those of other portions of the source region S. In other words, a portion of the source region S may include a lower concentration of impurities than other portions of the source region S. The drain region D may include a second low-concentration impurity region having an impurity concentration relatively lower than those of other portions of the drain region D. In other words, a portion of the drain region D may include a lower concentration of impurities than other portions of the drain region D.

The first low-concentration impurity region and the second low-concentration impurity region may be disposed close to the channel region CH of the transistor TR. For example, the first low-concentration impurity region may be disposed close to the channel region CH to overlap a first spacer disposed on one side of the gate electrode G, and the second low-concentration impurity region may be disposed close to the channel region CH to overlap a second spacer disposed on the other side of the gate electrode G. In this way, the distance between the high-concentration impurity region of the source region S and the high-concentration impurity region of the drain region D may be increased due to the first low-concentration impurity region and the second low-concentration impurity region, and the length of the channel region CH may be increased due to the increase in the distance. Accordingly, punch-through and hot carrier phenomena caused by a short channel may be prevented or reduced.

An interlayer insulating layer VA may be disposed on the substrate SUB and the well region W.

A passivation layer PAS may be disposed on the interlayer insulating layer VA.

The light emitting element layer EMTL may be disposed on the passivation layer PAS. The light emitting element layer EMTL may include, for example, a first light emitting element ED1, a second light emitting element ED2, and a third light emitting element ED3 disposed in different emission areas. For example, the first light emitting element ED1 of the light emitting element layer EMTL may be disposed in a first emission area EA1, the second light emitting element ED2 of the light emitting element layer EMTL may be disposed in a second emission area EA2, and the third light emitting element ED3 of the light emitting element layer EMTL may be disposed in a third emission area EA3.

Each of the first light emitting element ED1, the second light emitting element ED2, and the third light emitting element ED3 may be configured to emit white light.

The first light emitting element ED1 may include a first pixel electrode PE1 (or first anode electrode), a light providing layer LPL, and a common electrode CE stacked in the third direction DR3.

The second light emitting element ED2 may include a second pixel electrode PE2 (or second anode electrode), the light providing layer LPL, and the common electrode CE stacked in the third direction DR3.

The third light emitting element ED3 may include a third pixel electrode PE3 (or third anode electrode), the light providing layer LPL (e.g., a light emitting layer), and the common electrode CE stacked in the third direction DR3.

Here, the light providing layer LPL and the common electrode CE may be common layers commonly utilized by the light emitting elements ED1 to ED3. In other words, the plurality of light emitting elements ED1 to ED3 of the light emitting element layer EMTL may share the light providing layer LPL and the common electrode CE.

The light providing layer LPL may include a plurality of light emitting layers configured to emit lights of different colors, and the plurality of light emitting layers may be stacked along the third direction DR3. Different lights from the plurality of light emitting layers may be mixed to generate white light. In one or more embodiments, the light providing layer LPL may further include a charge generation layer.

Each of the first pixel electrode PE1, the second pixel electrode PE2, and the third pixel electrode PE3 may be connected to the source region S of the transistor TR of the corresponding emission area through a pixel connection electrode PCE of the emission area.

The first pixel electrode PE1 may be disposed to correspond to the first emission area EA1, the second pixel electrode PE2 may be disposed to correspond to the second emission area EA2, and the third pixel electrode PE3 may be disposed to correspond to the third emission area EA3.

A bank PDL (or pixel defining layer) may be disposed on the first pixel electrode PE1, the second pixel electrode PE2, and the third pixel electrode PE3 and the passivation layer PAS.

The bank PDL may define the emission areas of the pixels (for example, the first emission area EA1 of the first pixel PX1, the second emission area EA2 of the second pixel PX2, and the third emission area EA3 of the third pixel PX3). To this end, the bank PDL may be disposed to expose a partial region of each of the first pixel electrode PE1, the second pixel electrode PE2, and the third pixel electrode PE3 on the passivation layer PAS. The bank PDL may cover the edge of each of the first pixel electrode PE1, the second pixel electrode PE2, and the third pixel electrode PE3. The bank PDL may be formed of an organic layer such as acryl resin, epoxy resin, phenolic resin, polyamide resin, polyimide resin, and/or the like.

The light providing layer LPL may be disposed on the pixel electrodes PE1, PE2, and PE3 and the bank PDL. For example, the light providing layer LPL may be disposed on the first pixel electrode PE1, the second pixel electrode PE2, the third pixel electrode PE3, and the bank PDL.

The light providing layer LPL may include a plurality of light emitting units. For example, the light providing layer LPL may include a first light emitting unit, a second light emitting unit, and a third light emitting unit stacked in the third direction DR3. The light emitting units may be configured to emit lights of different wavelengths. For example, the first light emitting unit, the second light emitting unit, and the third light emitting unit may be configured to emit lights of different colors. For example, the light providing layer LPL may have a tandem structure in which the plurality of light emitting units that are configured to emit lights of different colors are stacked in a vertical direction (for example, the third direction DR3).

The first light emitting unit may be disposed on the pixel electrodes PE1, PE2, and PE3. The first light emitting unit may include a first light emitting layer, a hole transporting layer, an organic material layer, and an electron transporting layer. A second light emitting unit may be disposed on the first light emitting unit.

The second light emitting unit may include a second light emitting layer, a hole transporting layer, an organic material layer, and an electron transporting layer.

A third light emitting unit may be disposed on the second light emitting unit. The third light emitting unit may include a third light emitting layer, a hole transporting layer, an organic material layer, and an electron transporting layer.

The light emitting elements ED1, ED2, and ED3 may be configured to emit white light by mixing light of a first color (for example, blue) from the first light emitting unit, light of a second color (for example, red) from the second light emitting unit, and light of a third color (for example, green) from the third light emitting unit. For example, each of the first light emitting element ED1, the second light emitting element ED2, the third light emitting element ED3, and a dummy light emitting element may be configured to emit white light.

Further, the light providing layer LPL may further include at least one charge generation layer in addition to the aforementioned light emitting units. The charge generation layer may be disposed between the light emitting units adjacent in the third direction DR3, for example. The charge generation layer may include a first charge generation layer and a second charge generation layer stacked in the third direction DR3, for example. In this case, the first charge generation layer may be disposed between the first light emitting unit and the second light emitting unit, and the second charge generation layer may be disposed between the second light emitting unit and the third light emitting unit.

On the other hand, each charge generation layer may include a negative charge generation layer and a positive charge generation layer. For example, the first charge generation layer may include a first negative charge generation layer and a first positive charge generation layer stacked in the third direction DR3, and the second charge generation layer may include a second negative charge generation layer and a second positive charge generation layer stacked in the third direction DR3.

The common electrode CE may be disposed on the light providing layer LPL. For example, the common electrode CE may be disposed on the light providing layer LPL to overlap the first pixel electrode PE1, the second pixel electrode PE2, the third pixel electrode PE3, the first emission area EA1, the second emission area EA2, the third emission area EA3, and the bank PDL. In the top emission structure, the common electrode CE may be formed of a transparent conductive material (TCO) such as ITO and/or IZO configured to transmit light or a semi-transmissive conductive material such as magnesium (Mg), silver (Ag), and/or an alloy of magnesium (Mg) and silver (Ag). When the common electrode CE is formed of a semi-transmissive conductive material, the light emission efficiency may be increased due to a micro-cavity effect.

A capping layer CPL may be disposed on the common electrode CE. The capping layer CPL may include an inorganic insulating material. In one or more embodiments, the capping layer CPL may include aluminum oxide, titanium oxide, tantalum oxide, hafnium oxide, zinc oxide, silicon oxide, silicon nitride, and/or silicon oxynitride.

The encapsulation layer ENC may be disposed on the capping layer CPL. The encapsulation layer ENC may cover the top surface and the side surface of the light emitting element layer EMTL, and may protect the light emitting element layer EMTL. The encapsulation layer ENC may include at least one inorganic layer and at least one organic layer for encapsulating the light emitting element layer EMTL. The encapsulation layer ENC may include at least one inorganic layer TFE1 and TFE3 to prevent or reduce oxygen or moisture from permeating into the light emitting element layer EMTL. In some embodiments, the encapsulation layer ENC may include at least one organic layer to protect the light emitting element layer EMTL from foreign substances such as dust. For example, the encapsulation layer ENC may include a first encapsulation inorganic layer TFE1, an encapsulation organic layer TFE2, and a second encapsulation inorganic layer TFE3.

The first inorganic encapsulation layer TFE1 may be disposed on the capping layer CPL, the organic encapsulation layer TFE2 may be disposed on the first inorganic encapsulation layer TFE1, and the second inorganic encapsulation layer TFE3 may be disposed on the organic encapsulation layer TFE2. The first encapsulation inorganic layer TFE1 and the second encapsulation inorganic layer TFE3 may be formed of a multilayer in which one or more inorganic layers of a silicon nitride layer, a silicon oxynitride layer, a silicon oxide layer, a titanium oxide layer, and/or an aluminum oxide layer are alternately stacked. The encapsulation organic layer TFE2 may be an organic layer such as acryl resin, epoxy resin, phenolic resin, polyamide resin, polyimide resin, and/or the like.

A light blocking layer BM may be disposed on the encapsulation layer ENC. The light blocking layer BM may include a plurality of holes OPT1, OPT2, and OPT3 disposed to overlap the emission areas EA1, EA2, and EA3. For example, the first hole OPT1 may be disposed to overlap the first emission area EA1. The second hole OPT2 may be disposed to overlap the second emission area EA2, and the third hole OPT3 may be disposed to overlap the third emission area EA3. The areas or sizes of the holes OPT1, OPT2, and OPT3 may be larger than the areas or sizes of the emission areas EA1, EA2, and EA3 defined by the bank PDL, respectively. The holes OPT1, OPT2, and OPT3 of the light blocking layer BM are formed to be larger than the emission areas EA1, EA2, and EA3, so that the light emitted from the emission areas EA1, EA2, and EA3 may be visually recognized by the user not only from the front surface but also from the side surface of the display device 10.

The light blocking layer BM may include a light absorbing material. For example, the light blocking layer BM may include an inorganic black pigment and/or an organic black pigment. The inorganic black pigment may be carbon black, and the organic black pigment may include at least one of lactam black, perylene black, and/or aniline black, but they are not limited thereto. The light blocking layer BM may prevent or reduce visible light infiltration and color mixture between the first to third emission areas EA1, EA2, and EA3, which leads to the improvement of color reproducibility of the display device 10.

Further, the display device 10 may include a plurality of color filters CF1, CF2, and CF3 disposed on the emission areas EA1, EA2, and EA3. The plurality of color filters CF1, CF2, and CF3 may be disposed to correspond to the emission areas EA1, EA2, and EA3, respectively. For example, the color filters CF1, CF2, and CF3 may be disposed on the light blocking layer BM including the plurality of holes OPT1, OPT2, and OPT3 disposed to correspond to the emission areas EA1, EA2, and EA3, respectively.

The color filters CF1, CF2, and CF3 may include a first color filter CF1, a second color filter CF2, and a third color filter CF3 disposed to correspond to the different emission areas EA1, EA2, and EA3, respectively. The color filters CF1, CF2, and CF3 may include a colorant such as a dye or a pigment that absorbs light in a wavelength band other than light in a specific wavelength band, and may be disposed to correspond to the color of the light emitted from the emission areas EA1, EA2, and EA3. For example, the first color filter CF1 may be a red color filter that is disposed to overlap the first emission area EA1 and transmits only the first light of the red color. The second color filter CF2 may be a green color filter that is disposed to overlap the second emission area EA2 and transmits only the second light of the green color, and the third color filter CF3 may be a blue color filter that is disposed to overlap the third emission area EA3 and transmits only the third light of the blue color.

The plurality of color filters CF1, CF2, and CF3 may be spaced from other adjacent color filters CF1, CF2, and CF3 on the light blocking layer BM. The color filters CF1, CF2, and CF3 may have areas larger than those of the holes OPT1, OPT2, and OPT3 of the light blocking layer BM, respectively, while covering the holes, and may have areas enough to be spaced from other color filters CF1, CF2, and CF3 on the light blocking layer BM. However, the present disclosure is not limited thereto. The plurality of color filters CF1, CF2, and CF3 may be disposed to partially overlap other adjacent color filters CF1, CF2, and CF3. The different color filters CF1, CF2, and CF3 are areas that do not overlap the emission areas EA1, EA2, and EA3, and may overlap each other on the light blocking layer BM. In the display device, the color filters CF1, CF2, and CF3 are disposed to overlap each other, so that the intensity of the reflected light by external light may be reduced. Furthermore, the color of the reflected light by the external light may be controlled or selected by adjusting the disposition, shape, and area of the color filters CF1, CF2, and CF3 in a plan view.

An overcoat layer OC may be disposed on the color filters CF1, CF2, and CF3 to planarize the top ends of the color filters CF1, CF2, and CF3. The overcoat layer OC may be a colorless light transmissive layer that does not have a color in a visible light band. For example, the overcoat layer OC may include a colorless light transmissive organic material such as an acrylic resin.

Figure 7:
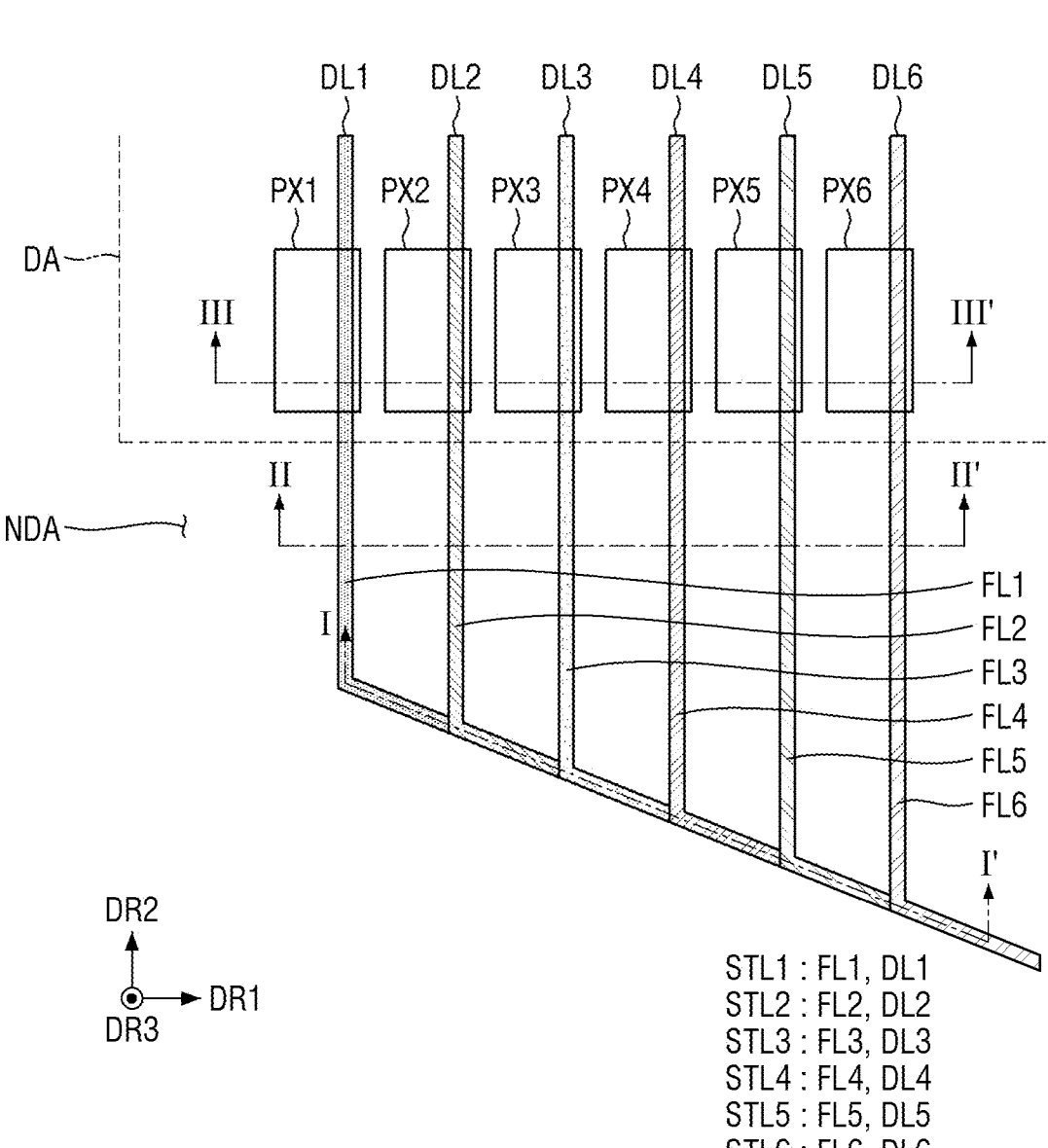
FIG. 7 is a detailed configuration diagram of a part P of FIG. 3.
Figure 8:
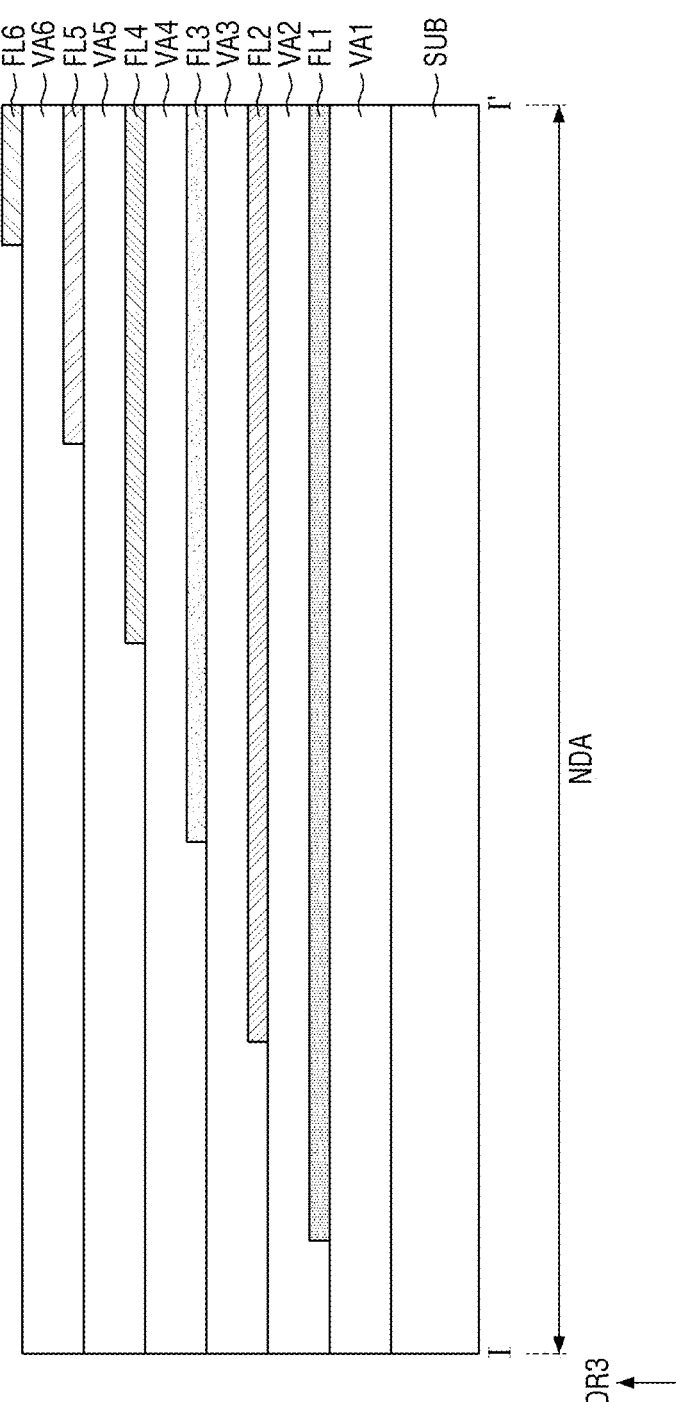
FIG. 8 is a cross-sectional view taken along the line I-I' of FIG. 7.
Figure 9:
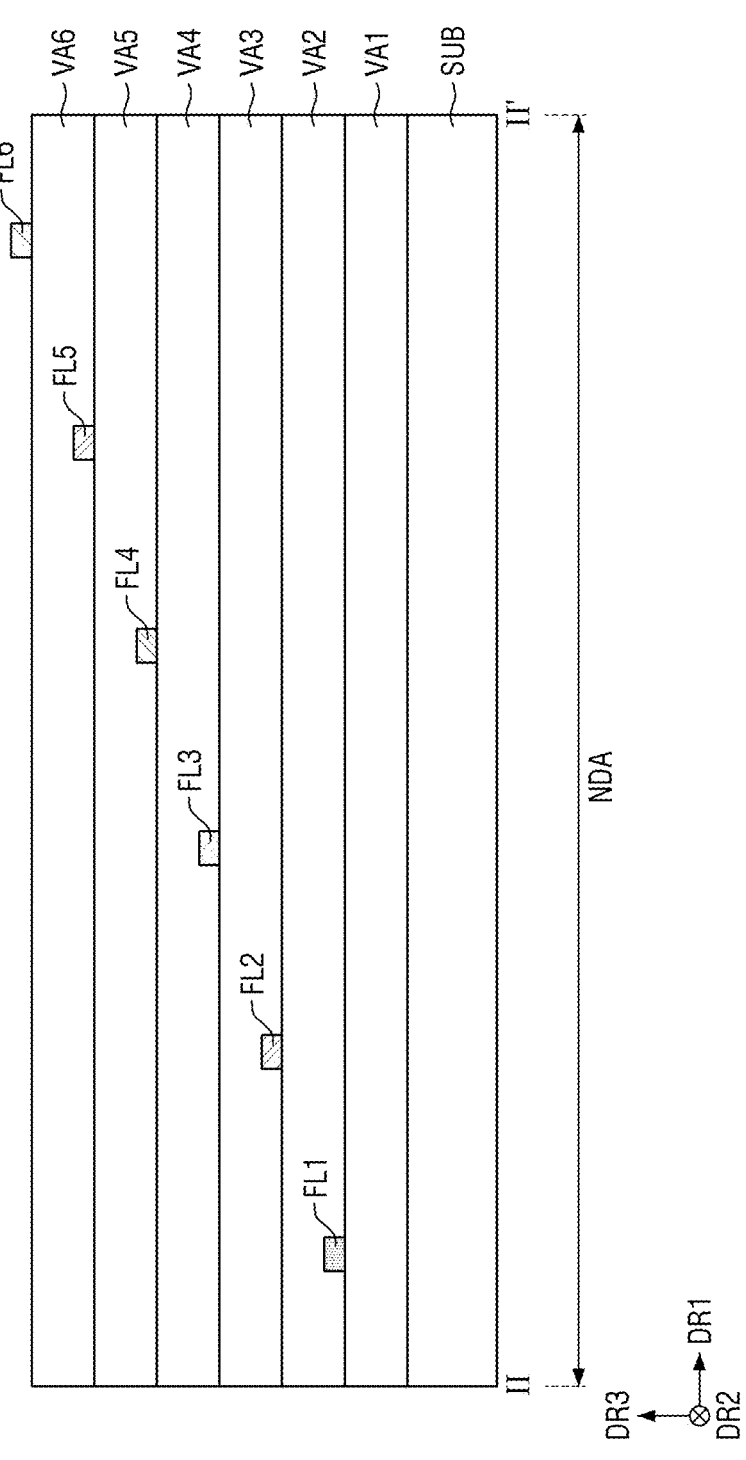
FIG. 9 is a cross-sectional view taken along the line II-II' of FIG. 7.
Figure 10:
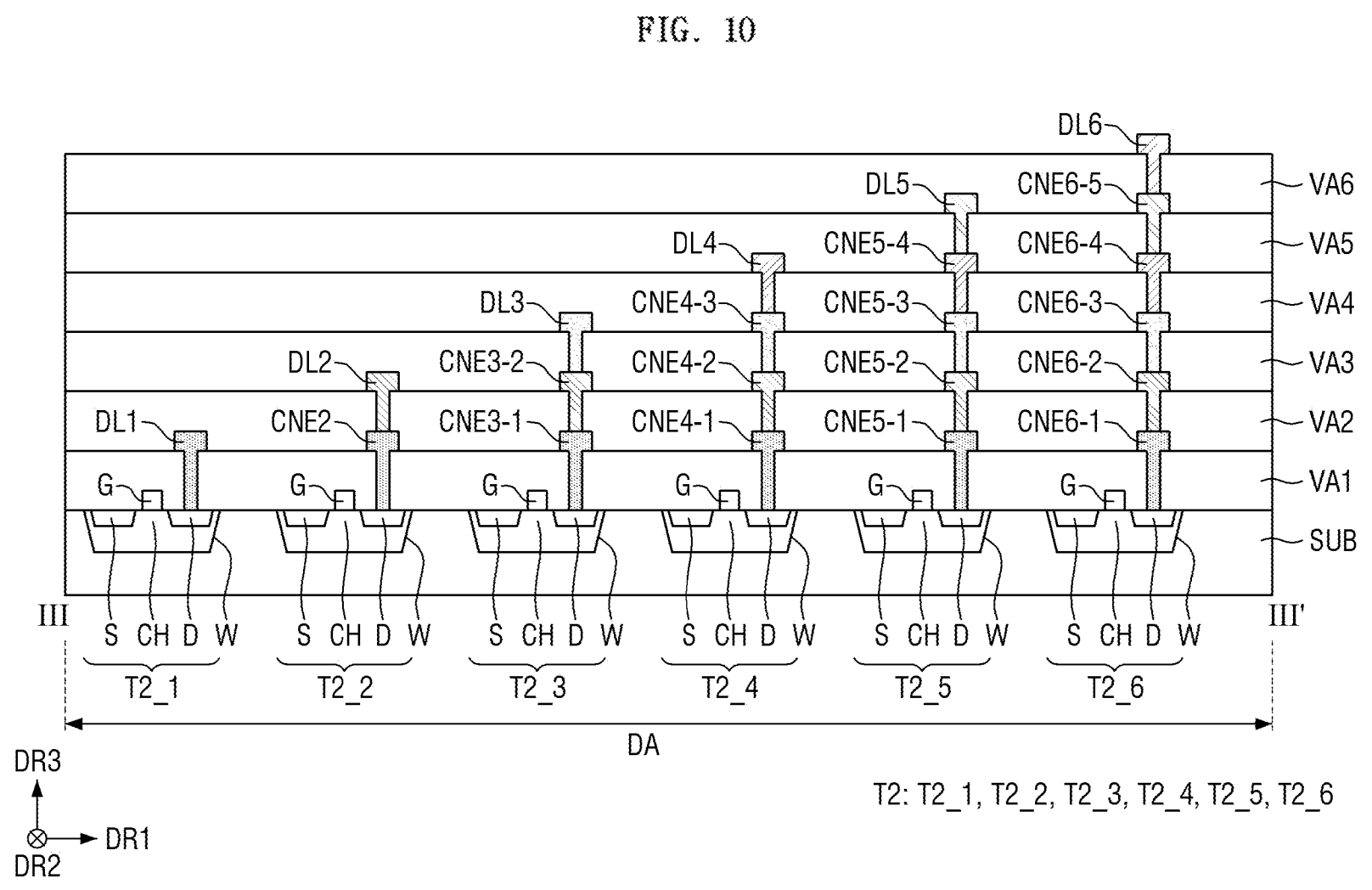

FIG. 7 is a detailed configuration diagram of a part P of FIG. 3, FIG. 8 is a cross-sectional view taken along the line I-I' of FIG. 7, FIG. 9 is a cross-sectional view taken along the line II-II' of FIG. 7, and FIG. 10 is a cross-sectional view along the line III-III' of FIG. 7.

First, in the display device 10 according to one or more embodiments, one signal transmission line may include a signal line (e.g., data line) disposed in the display area DA of the substrate SUB, and a fan-out line extending from the signal line (e.g., data line) and disposed in the non-display area NDA of the substrate SUB. In one or more embodiments, one signal transmission line may include a gate line disposed in the display area DA of the substrate SUB, and a fan-out line extending from the gate line and disposed in the non-display area NDA of the substrate SUB. In one or more embodiments, one signal transmission line may include a common voltage line disposed in the display area DA of the substrate SUB, and a fan-out line extending from the common voltage line and disposed in the non-display area NDA of the substrate SUB. Each line and the fan-out line connected thereto may be integrally formed. For example, a data line and a fan-out line connected to the data line may be integrally formed.

Herein, a data line and a fan-out line connected to the data line will be described as a representative signal transmission line.

As shown in FIG. 7, one signal transmission line may include a data line (e.g., DL1) disposed in the display area DA of the substrate SUB, and a fan-out line (e.g., FL1) disposed in the non-display area NDA of the substrate SUB. The data line DL1 may be disposed in the display area DA of the substrate SUB, and the fan-out line FL1 may be disposed in the non-display area NDA of the substrate SUB. The data line DL1 and the fan-out line FL1 may be integrally formed.

In the display device 10 according to one or more embodiments, a plurality of signal transmission lines may be provided. In other words, the display device 10 according to one or more embodiments may include a plurality of signal transmission lines STL1, STL2, STL3, STL4, STL5, and STL6. As one example, FIG. 7 illustrates first to sixth signal transmission lines STL1, STL2, STL3, STL4, STL5, and STL6.

Each of the signal transmission lines STL1, STL2, STL3, STL4, STL5, and STL6 may have a bent shape. For example, each of the first to sixth signal transmission lines STL1, STL2, STL3, STL4, STL5, and STL6 may have an L shape. In this case, a bent portion of each of the first to sixth signal transmission lines STL1, STL2, STL3, STL4, STL5, and STL6 may be disposed in the non-display area NDA. Each of the signal transmission lines STL1, STL2, STL3, STL4, STL5, and STL6 may include the data line and the fan-out line as described above. For example, as in the example shown in FIG. 7, the first signal transmission line STL1 may include a first data line DL1 disposed in the display area DA and a first fan-out line FL1 extending from the first data line DL1 and disposed in the non-display area NDA, the second signal transmission line STL2 may include a second data line DL2 disposed in the display area DA and a second fan-out line FL2 extending from the second data line DL2 and disposed in the non-display area NDA, the third signal transmission line STL3 may include a third data line DL3 disposed in the display area DA and a third fan-out line FL3 extending from the third data line DL3 and disposed in the non-display area NDA, the fourth signal transmission line STL4 may include a fourth data line DL4 disposed in the display area DA and a fourth fan-out line FL4 extending from the fourth data line DL4 and disposed in the non-display area NDA, the fifth signal transmission line STL5 may include a fifth data line DL5 disposed in the display area DA and a fifth fan-out line FL5 extending from the fifth data line DL5 and disposed in the non-display area NDA, and the sixth signal transmission line STL6 may include a sixth data line DL6 disposed in the display area DA and a sixth fan-out line FL6 extending from the sixth data line DL6 and disposed in the non-display area NDA.

The first to sixth signal transmission lines STL1 to STL6 may be electrically connected to the display driver 200 in the non-display area NDA.

The first to sixth signal transmission lines STL1 to STL6 and first to sixth insulating layers VA1, VA2, VA3, VA4, VA5, and VA6 may be components included in the driving circuit layer DCL described above.

A plurality of pixels PX1, PX2, PX3, PX4, PX5, and PX6 arranged along the first direction DR1 may be disposed in the display area DA.

The data line of the signal transmission line may be connected to the pixel in the display area DA. For example, the first data line DL1 of the first signal transmission line STL1 may be connected to a first pixel PX1, the second data line DL2 of the second signal transmission line STL2 may be connected to a second pixel PX2, the third data line DL3 of the third signal transmission line STL3 may be connected to a third pixel PX3, the fourth data line DL4 of the fourth signal transmission line STL4 may be connected to a fourth pixel PX4, the fifth data line DL5 of the fifth signal transmission line STL5 may be connected to a fifth pixel PX5, and the sixth data line DL6 of the sixth signal transmission line STL6 may be connected to a sixth pixel PX6. For example, as shown in FIG. 10, the first data line DL1 may be connected to the drain electrode D of a second transistor T2_1 provided in the first pixel PX1, the second data line DL2 of the second signal transmission line STL2 may be connected to the drain electrode D of a second transistor T2_2 provided in the second pixel PX2, the third data line DL3 of the third signal transmission line STL3 may be connected to the drain electrode D of a second transistor T2_3 provided in the third pixel PX3, the fourth data line DL4 of the fourth signal transmission line STL4 may be connected to the drain electrode D of a second transistor T2_4 provided in the fourth pixel PX4, the fifth data line DL5 of the fifth signal transmission line STL5 may be connected to the drain electrode D of a second transistor T2_5 provided in the fifth pixel PX5, and the sixth data line DL6 of the sixth signal transmission line STL6 may be connected to the drain electrode D of a second transistor T2_6 provided in the sixth pixel PX6. Here, the second transistors T2_1 to T2_6 of FIG. 10 may be the same as the above-described second transistor T2 of FIG. 5. Each second transistor T2 may include the gate electrode G, the channel region CH, the source electrode S, and the drain electrode D. The source electrode S, the drain electrode D, and the channel region CH of each second transistor T2 may be disposed in the well region W of the substrate SUB.

The plurality of signal transmission lines STL1 to STL6 may have different lengths. For example, as shown in FIGS. 7 and 8, the first signal transmission line STL1 may have the greatest length, the second signal transmission line STL2 may have the second greatest length, the third signal transmission line STL3 may have the third greatest length, the fourth signal transmission line STL4 may have the fourth greatest length, the fifth signal transmission line STL5 may have the fifth greatest length, and the sixth signal transmission line STL6 may have the smallest length. In other words, the first fan-out line FL1 of the first signal transmission line STL1 may have the greatest length, the second fan-out line FL2 of the second signal transmission line STL2 may have the second greatest length, the third fan-out line FL3 of the third signal transmission line STL3 may have the third greatest length, the fourth fan-out line FL4 of the fourth signal transmission line STL4 may have the fourth greatest length, the fifth fan-out line FL5 of the fifth signal transmission line STL5 may have the fifth greatest length, and the sixth fan-out line FL6 of the sixth signal transmission line STL6 may have the smallest length.

The plurality of signal transmission lines may be connected to the drain electrode D of the second transistor T2 through a greater number of connection electrodes as they are disposed on succeeding higher layers. For example, the data line of the signal transmission line disposed on the lowest layer from among the plurality of signal transmission lines may be directly connected to (or in contact with) the drain electrode D of the second transistor T2. For example, as shown in FIG. 10, the first data line DL1 of the first signal transmission line STL1 disposed on the first insulating layer VA1 so as to be closest to the substrate SUB may be directly connected to the drain electrode D of the second transistor T2 without any connection electrodes (e.g., with no connection electrode). The second data line DL2 of the second signal transmission line STL2 may be connected to the drain electrode D of the second transistor T2 through a connection electrode CNE2. The third data line DL3 of the third signal transmission line STL3 may be connected to the drain electrode D of the second transistor T2 through a third-first connection electrode CNE3-1 on the first insulating layer VA1 and a third-second connection electrode CNE3-2 on the second insulating layer VA2. The fourth data line DL4 of the fourth signal transmission line STL4 may be connected to the drain electrode D of the second transistor T2 through a fourth-first connection electrode CNE4-1 on the first insulating layer VA1, a fourth-second connection electrode CNE4-2 on the second insulating layer VA2, and a fourth-third connection electrode CNE4-3 on the third insulating layer VA3. The fifth data line DL5 of the fifth signal transmission line STL5 may be connected to the drain electrode D of the second transistor T2 through a fifth-first connection electrode CNE5-1 on the first insulating layer VA1, a fifth-second connection electrode CNE5-2 on the second insulating layer VA2, a fifth-third connection electrode CNE5-3 on the third insulating layer VA3, and a fifth-fourth connection electrode CNE5-4 on the fourth insulating layer VA4. The sixth data line DL6 of the sixth signal transmission line STL6 may be connected to the drain electrode D of the second transistor T2 through a sixth-first connection electrode CNE6-1 on the first insulating layer VA1, a sixth-second connection electrode CNE6-2 on the second insulating layer VA2, a sixth-third connection electrode CNE6-3 on the third insulating layer VA3, a sixth-fourth connection electrode CNE6-4 on the fourth insulating layer VA4, and a sixth-fifth connection electrode CNE6-5 on the fifth insulating layer VA5.

The connection electrode connected to one data line may be disposed on (e.g., at) the same layer as another data line. For example, the first data line DL1, the connection electrode CNE2, the third-first connection electrode CNE3-1, the fourth-first connection electrode CNE4-1, the fifth-first connection electrode CNE5-1, and the sixth-first connection electrode CNE6-1 may be disposed on (e.g., at) the same layer. For example, the first data line DL1, the connection electrode CNE2, the third-first connection electrode CNE3-1, the fourth-first connection electrode CNE4-1, the fifth-first connection electrode CNE5-1, and the sixth-first connection electrode CNE6-1 may be disposed on the first insulating layer VA1. The second data line DL2, the third-second connection electrode CNE3-2, the fourth-second connection electrode CNE4-2, the fifth-second connection electrode CNE5-2, and the sixth-second connection electrode CNE6-2 may be disposed on (e.g., at) the same layer. For example, the second data line DL2, the third-second connection electrode CNE3-2, the fourth-second connection electrode CNE4-2, the fifth-second connection electrode CNE5-2, and the sixth-second connection electrode CNE6-2 may be disposed on the second insulating layer VA2. The third data line DL3, the fourth-third connection electrode CNE4-3, the fifth-third connection electrode CNE5-3, and the sixth-third connection electrode CNE6-3 may be disposed on (e.g., at) the same layer. For example, the third data line DL3, the fourth-third connection electrode CNE4-3, the fifth-third connection electrode CNE5-3, and the sixth-third connection electrode CNE6-3 may be disposed on the third insulating layer VA3. The fourth data line DL4, the fifth-fourth connection electrode CNE5-4, and the sixth-fourth connection electrode CNE6-4 may be disposed on (e.g., at) the same layer. For example, the fourth data line DL4, the fifth-fourth connection electrode CNE5-4, and the sixth-fourth connection electrode CNE6-4 may be disposed on the fourth insulating layer VA4. The fifth data line DL5 and the sixth-fifth connection electrode CNE6-5 may be disposed on (e.g., at) the same layer. For example, the fifth data line DL5 and the sixth-fifth connection electrode CNE6-5 may be disposed on the fifth insulating layer VA5.

The data line and the connection electrode may be connected to an electrode therebelow through a through hole of the insulating layer. For example, the first data line DL1, the connection electrode CNE2, the third-first connection electrode CNE3-1, the fourth-first connection electrode CNE4-1, the fifth-first connection electrode CNE5-1, and the sixth-first connection electrode CNE6-1 may be connected to the drain electrodes D of the second transistors T2, respectively, through contact holes penetrating the first insulating layer VA1. The second data line DL2, the third-second connection electrode CNE3-2, the fourth-second connection electrode CNE4-2, the fifth-second connection electrode CNE5-2, and the sixth-second connection electrode CNE6-2 may be connected to the connection electrode CNE2, the third-first connection electrode CNE3-1, the fourth-first connection electrode CNE4-1, the fifth-first connection electrode CNE5-1, and the sixth-first connection electrode CNE6-1, respectively, through contact holes penetrating the second insulating layer VA2. The third data line DL3, the fourth-third connection electrode CNE4-3, the fifth-third connection electrode CNE5-3, and the sixth-third connection electrode CNE6-3 may be connected to the third-second connection electrode CNE3-2, the fourth-second connection electrode CNE4-2, the fifth-second connection electrode CNE5-2, and the sixth-second connection electrode CNE6-2, respectively, through contact holes penetrating the third insulating layer VA3. The fourth data line DL4, the fifth-fourth connection electrode CNE5-4, and the sixth-fourth connection electrode CNE6-4 may be connected to the fourth-third connection electrode CNE4-3, the fifth-third connection electrode CNE5-3, and the sixth-third connection electrode CNE6-3, respectively, through contact holes penetrating the fourth insulating layer VA4. The fifth data line DL5 and the sixth-fifth connection electrode CNE6-5 may be connected to the fifth-fourth connection electrode CNE5-4 and the sixth-fourth connection electrode CNE6-4, respectively, through contact holes penetrating the fifth insulating layer VA5. The sixth data line DL6 may be connected to the sixth-fifth connection electrode CNE6-5 through a contact hole penetrating the sixth insulating layer VA6.

The signal transmission lines may be disposed on different layers. For example, as shown in FIGS. 8-10, the first to sixth signal transmission lines STL1 to STL6 may be disposed in layers of different heights in the third direction DR3 with respect to the substrate SUB (e.g., the top surface of the substrate SUB). For example, the first signal transmission line STL1 may be disposed on the first insulating layer VA1, the second signal transmission line STL2 may be disposed on the second insulating layer VA2, the third signal transmission line STL3 may be disposed on the third insulating layer VA3, the fourth signal transmission line STL4 may be disposed on the fourth insulating layer VA4, the fifth signal transmission line STL5 may be disposed on the fifth insulating layer VA5, and the sixth signal transmission line STL6 may be disposed on the sixth insulating layer VA6. As a specific example, the first data line DL1 and the first fan-out line FL1 of the first signal transmission line STL1 may each be disposed on the first insulating layer VA1, the second data line DL2 and the second fan-out line FL2 of the second signal transmission line STL2 may each be disposed on the second insulating layer VA2, the third data line DL3 and the third fan-out line FL3 of the third signal transmission line STL3 may each be disposed on the third insulating layer VA3, the fourth data line DL4 and the fourth fan-out line FL4 of the fourth signal transmission line STL4 may each be disposed on the fourth insulating layer VA4, the fifth data line DL5 and the fifth fan-out line FL5 of the fifth signal transmission line STL5 may each be disposed on the fifth insulating layer VA5, and the sixth data line DL6 and the sixth fan-out line FL6 of the sixth signal transmission line STL6 may each be disposed on the sixth insulating layer VA6.

In other words, the plurality of signal transmission lines STL1 to STL6 may be disposed on succeeding higher layers as they are arranged with each other along the first direction DR1. For example, the first signal transmission line STL1 may be disposed on the first insulating layer VA1 which is the lowest, the second signal transmission line STL2 may be disposed on the second insulating layer VA2 which is the second lowest, the third signal transmission line STL3 may be disposed on the third insulating layer VA3 which is the third lowest, the fourth signal transmission line STL4 may be disposed on the fourth insulating layer VA4 which is the fourth lowest, the fifth signal transmission line STL5 may be disposed on the fifth insulating layer VA5 which is the fifth lowest, and the sixth signal transmission line STL6 may be disposed on the sixth insulating layer VA6 which is the highest.

Accordingly, the first signal transmission line STL1 may be disposed closest to the substrate SUB and the sixth signal transmission line STL6 may be disposed farthest from the substrate SUB. In one or more embodiments, the second signal transmission line STL2 may be disposed between the first signal transmission line STL1 and the third signal transmission line STL3 in the third direction DR3, the third signal transmission line STL3 may be disposed between the second signal transmission line STL2 and the fourth signal transmission line STL4 in the third direction DR3, the fourth signal transmission line STL4 may be disposed between the third signal transmission line STL3 and the fifth signal transmission line STL5 in the third direction DR3, and the fifth signal transmission line STL5 may be disposed between the fourth signal transmission line STL4 and the sixth signal transmission line STL6 in the third direction DR3.

The signal transmission lines STL1 to STL6 may overlap in the non-display area NDA and may not overlap in the display area DA. For example, as shown in FIGS. 7-10, the first to sixth signal transmission lines STL1 to STL6 may overlap in the third direction DR3 in the non-display area NDA, and may not overlap in the third direction DR3 in the display area DA. In other words, as shown in FIGS. 7 and 10, the first to sixth fan-out lines FL1 to FL6 of the first to sixth signal transmission lines STL1 to STL6 may overlap in the third direction DR3 in the non-display area NDA, and the first to sixth data lines DL1 to DL6 of the first to sixth signal transmission lines STL1 to STL6 may not overlap in the third direction DR3 in the display area DA.

In one or more embodiments, as shown in FIG. 8, overlapping areas between the signal transmission lines STL1 to STL6 may be different. For example, when the longest signal transmission line (e.g., STL1) from among the first to six signal transmission lines STL1 to STL6 is defined as a reference signal transmission line, an overlapping area between the reference signal transmission line STL1 and each of the signal transmission lines STL2 to STL6 other than the reference signal transmission line STL1 may be different. For example, an overlapping area between the reference signal transmission line STL1 and the second signal transmission line STL2 may be the largest, an overlapping area between the reference signal transmission line STL1 and the third signal transmission line STL3 may be the second largest, an overlapping area between the reference signal transmission line STL1 and the fourth signal transmission line STL4 may be the third largest, an overlapping area between the reference signal transmission line STL1 and the fifth signal transmission line STL5 may be the fourth largest, and an overlapping area between the reference signal transmission line STL1 and the sixth signal transmission line STL6 may be the smallest. In other words, when the longest fan-out line (e.g., FL1) from (e.g., selected from) among the fan-out lines of the signal transmission lines is defined as a reference fan-out line, an overlapping area between the reference fan-out line FL1 and each of the fan-out lines FL2 to FL6 other than the reference fan-out line FL1 may be different. For example, an overlapping area between the reference fan-out line FL1 and the second fan-out line FL2 may be the largest, an overlapping area between the reference fan-out line FL1 and the third fan-out line FL3 may be the second largest, an overlapping area between the reference fan-out line FL1 and the fourth fan-out line FL4 may be the third largest, an overlapping area between the reference fan-out line FL1 and the fifth fan-out line FL5 may be the fourth largest, and an overlapping area between the reference fan-out line FL1 and the sixth fan-out line FL6 may be the smallest.

The plurality of signal transmission lines STL1 to STL6 may be connected to a smaller number of connection electrodes as they have greater lengths. For example, from among the first to sixth signal transmission lines STL1 to STL6 that overlap in the non-display area NDA, the first signal transmission line STL1 having the greatest length may be directly connected to the drain electrode D of the second transistor T2_1 without any connection electrodes (e.g., with no connection electrode), the second signal transmission line STL2 having the second greatest length may be connected to the drain electrode D of the second transistor T2_2 through one connection electrode CNE2, the third signal transmission line STL3 having the third greatest length may be connected to the drain electrode D of the second transistor T2_3 through two connection electrodes CNE3-1 and CNE3-2, the fourth signal transmission line STL4 having the fourth greatest length may be connected to the drain electrode D of the second transistor T2_4 through three connection electrodes CNE4-1, CNE4-2, and CNE4-3, the fifth signal transmission line STL5 having the fifth greatest length may be connected to the drain electrode D of the second transistor T2_5 through four connection electrodes CNE5-1, CNE5-2, CNE5-3, and CNE5-4, and the sixth signal transmission line STL6 having the smallest length may be connected to the drain electrode D of the second transistor T2_6 through five connection electrodes CNE6-1, CNE6-2, CNE6-3, CNE6-4, and CNE6-5. As described above, the signal transmission lines STL1 to STL6 may be connected to corresponding connection electrodes through the data lines DL1 to DL6, respectively.

When the plurality of signal transmission lines STL1 to STL6 are connected to a smaller number of connection electrodes as they have greater lengths, the plurality of signal transmission lines STL1 to STL6 may be disposed on succeeding lower layers as they have greater lengths. In other words, the plurality of signal transmission lines STL1 to STL6 may be disposed closer to the corresponding transistors as they have greater lengths. For example, a distance between the first data line DL1 of the first signal transmission line STL1 having the greatest length and the drain electrode D of the second transistor T2_1 may be the shortest, while a distance between the sixth data line DL6 of the sixth signal transmission line STL6 having the smallest length and the drain electrode D of the second transistor T2_6 may be the longest.

According to one or more embodiments, because the signal transmission lines STL1 to STL6 overlap in the third direction DR3 in the non-display area NDA, the density of the fan-out lines in a region (hereinafter, fan-out region) where the fan-out lines FL1 to FL6 are disposed may increase. Thus, the area of the fan-out region (e.g., the size in the first direction DR1*the size in the second direction DR2) may be reduced, so that the dead space area of the display device 10 may be reduced or minimized.

Further, according to one or more embodiments, because the plurality of signal transmission lines STL1 to STL6 that overlap in the non-display area NDA are connected to a greater number of connection electrodes as they have smaller lengths, length deviations of connection paths between the signal transmission lines STL1 to STL6 and the transistors T2_1 to T2_6 may be reduced or minimized. Accordingly, voltage drop deviations between the data signals supplied to the pixels PX1 to PX6 through the signal transmission lines STL1 to STL6 may be reduced or minimized. Therefore, the luminance deviations between the pixels PX1 to PX6 may be reduced or minimized, so that the image quality of the display device 10 may be improved.

Figure 11:
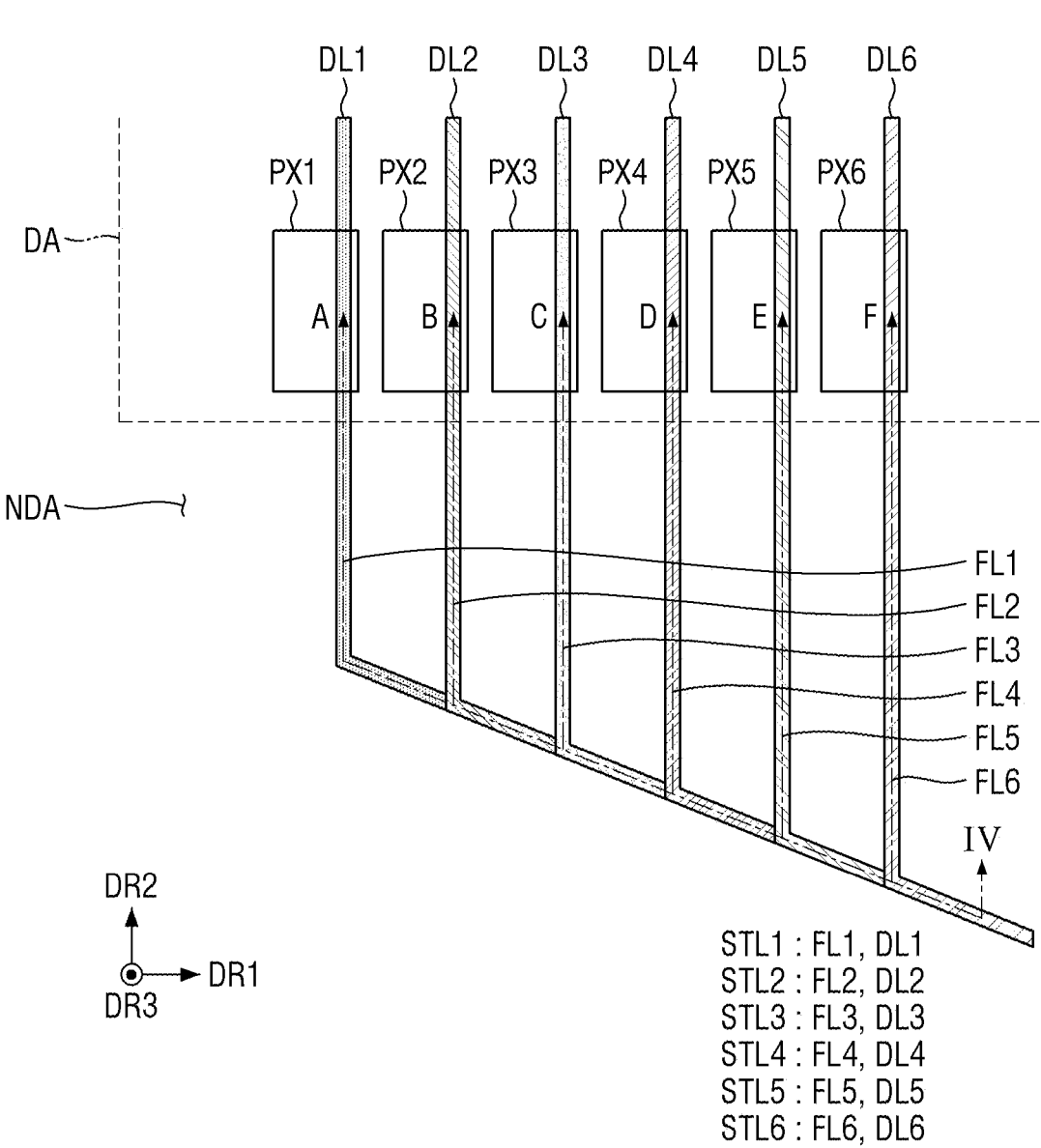
FIG. 11 is a detailed configuration diagram of a part P of FIG. 3.
Figure 12:
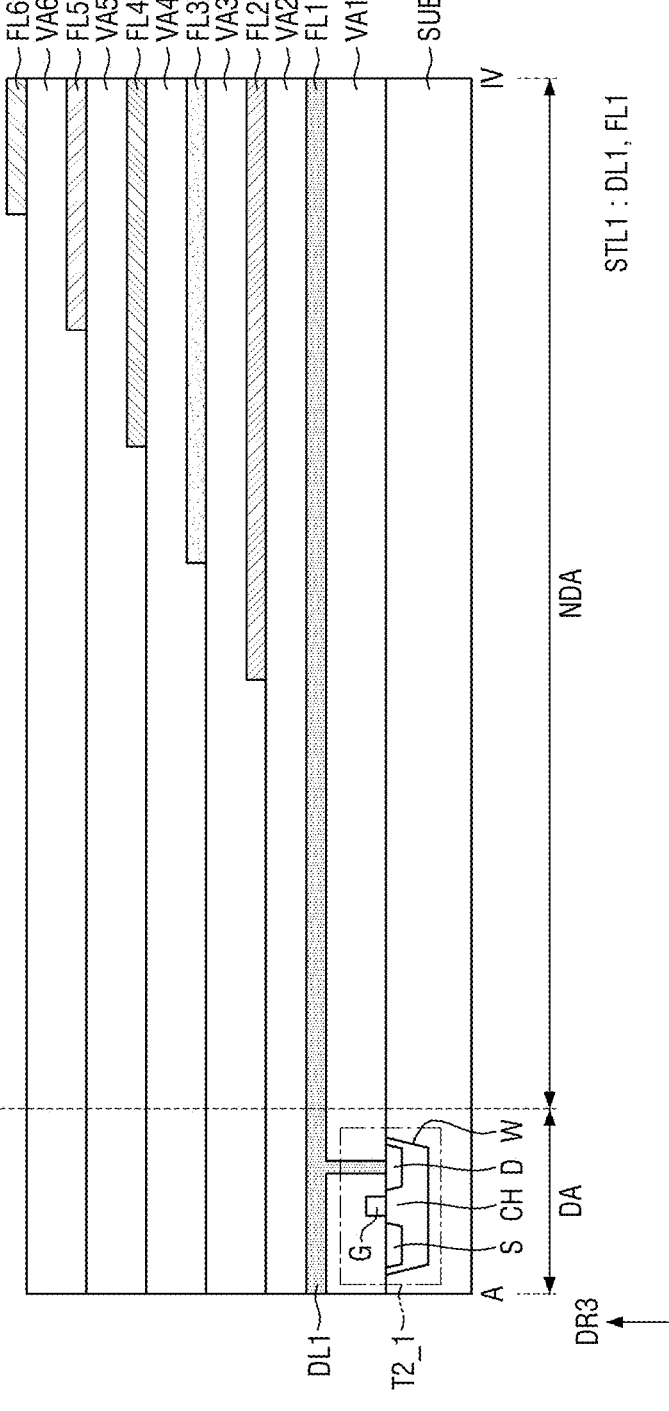
FIG. 12 is a cross-sectional view taken along the line A-IV of FIG. 11.
Figure 13:
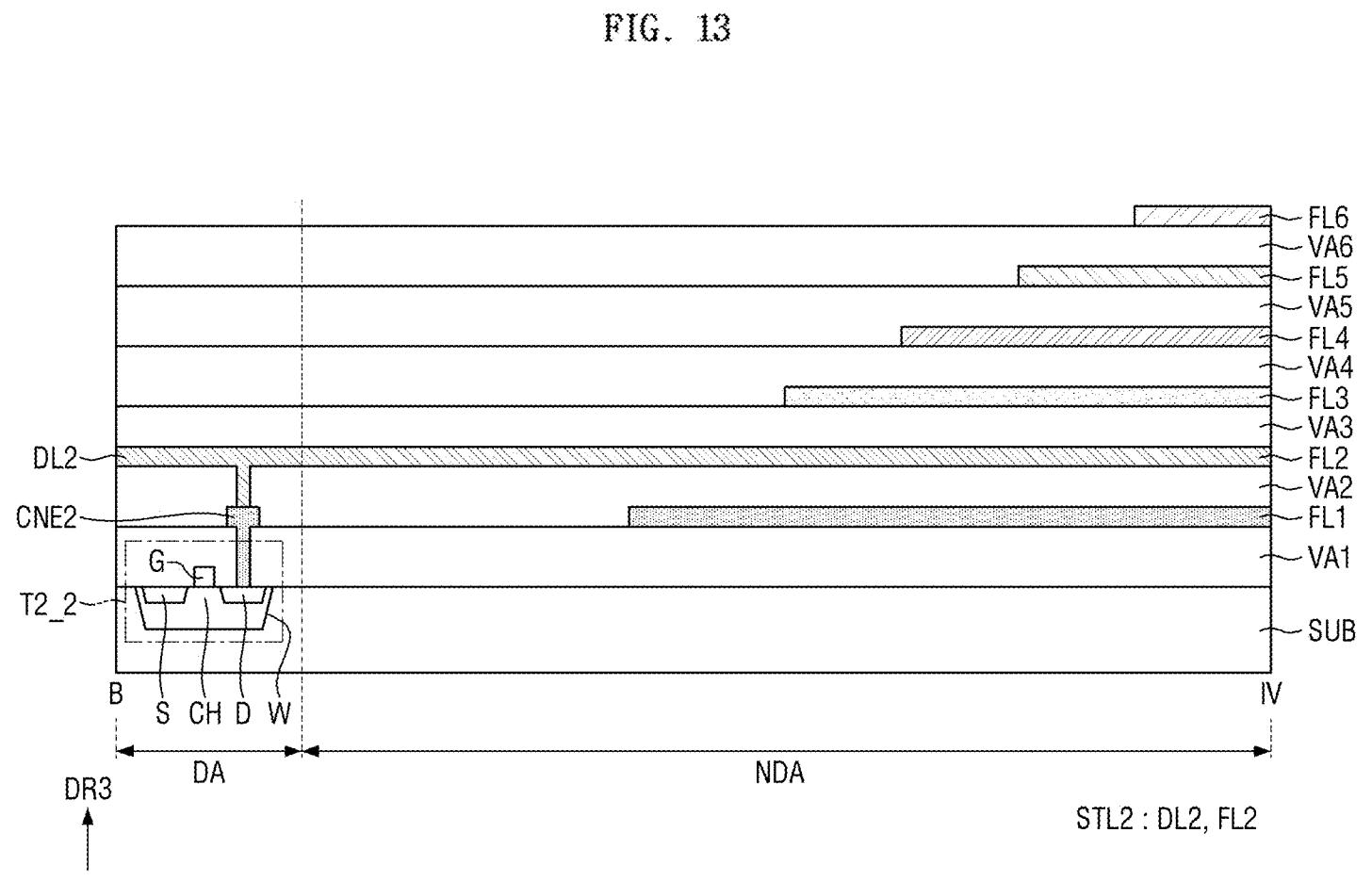
Figure 14:
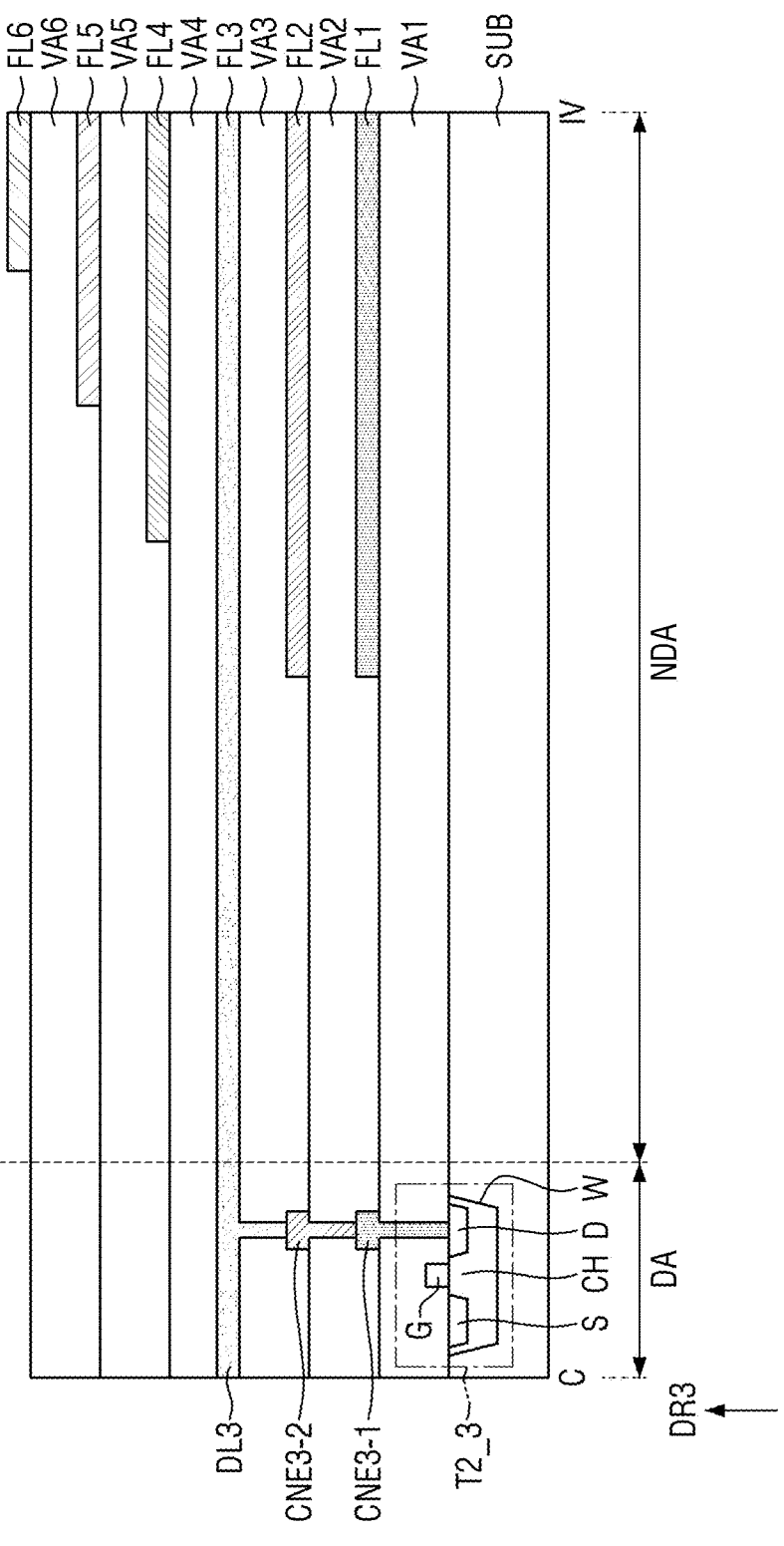
FIG. 14 is a cross-sectional view taken along the line C-IV of FIG. 11.
Figure 15:
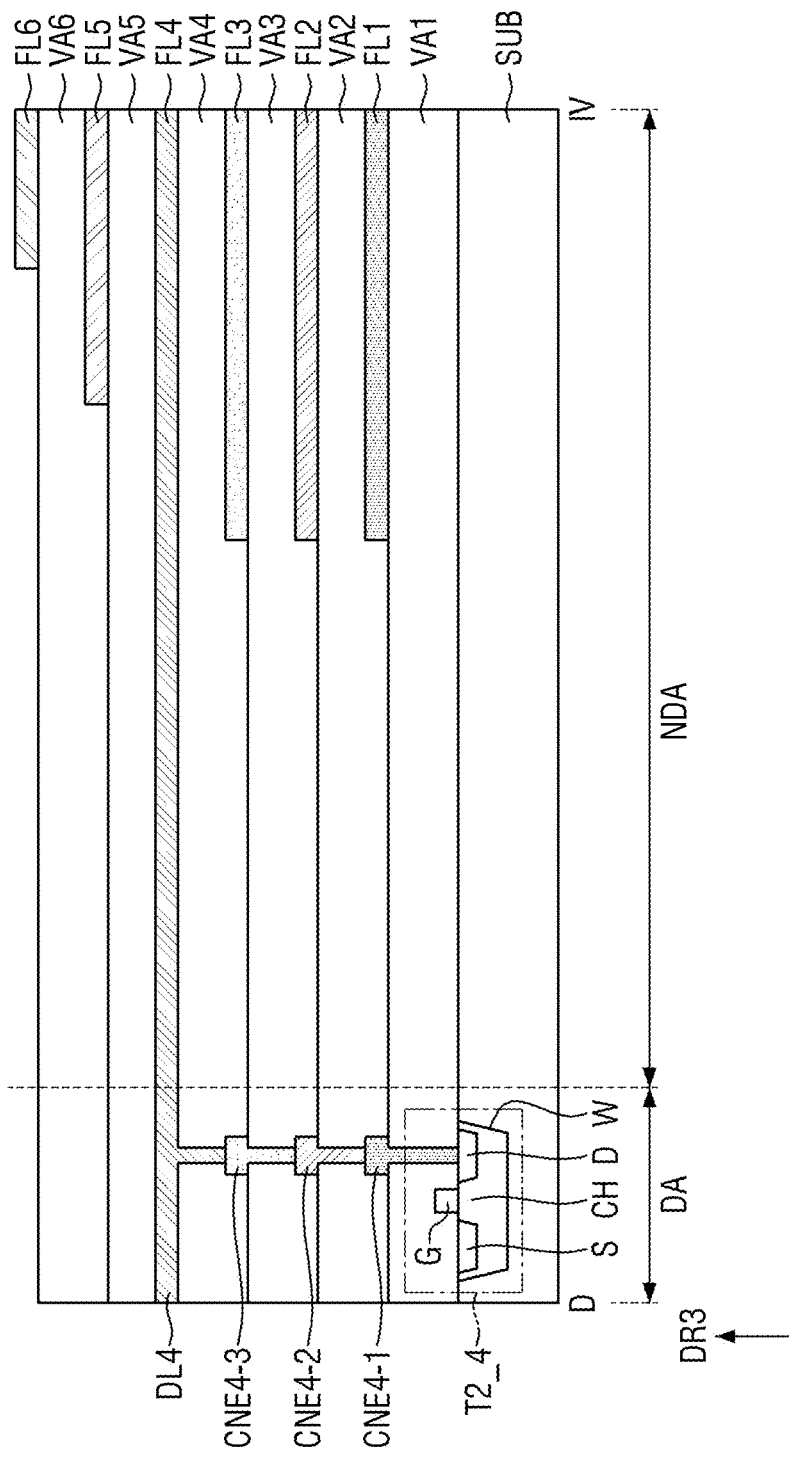
FIG. 15 is a cross-sectional view taken along the line D-IV of FIG. 11.
Figure 16:
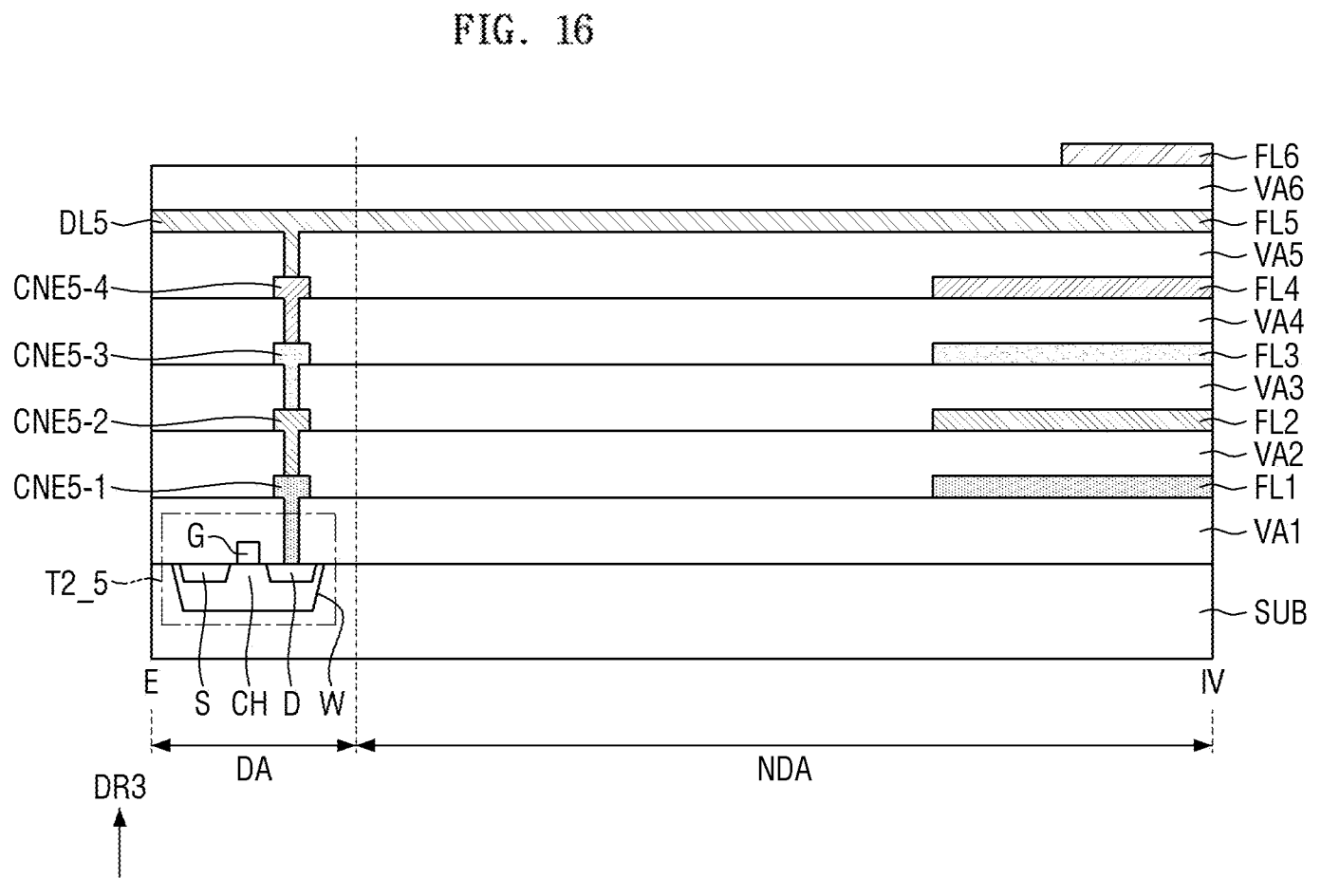
Figure 17:
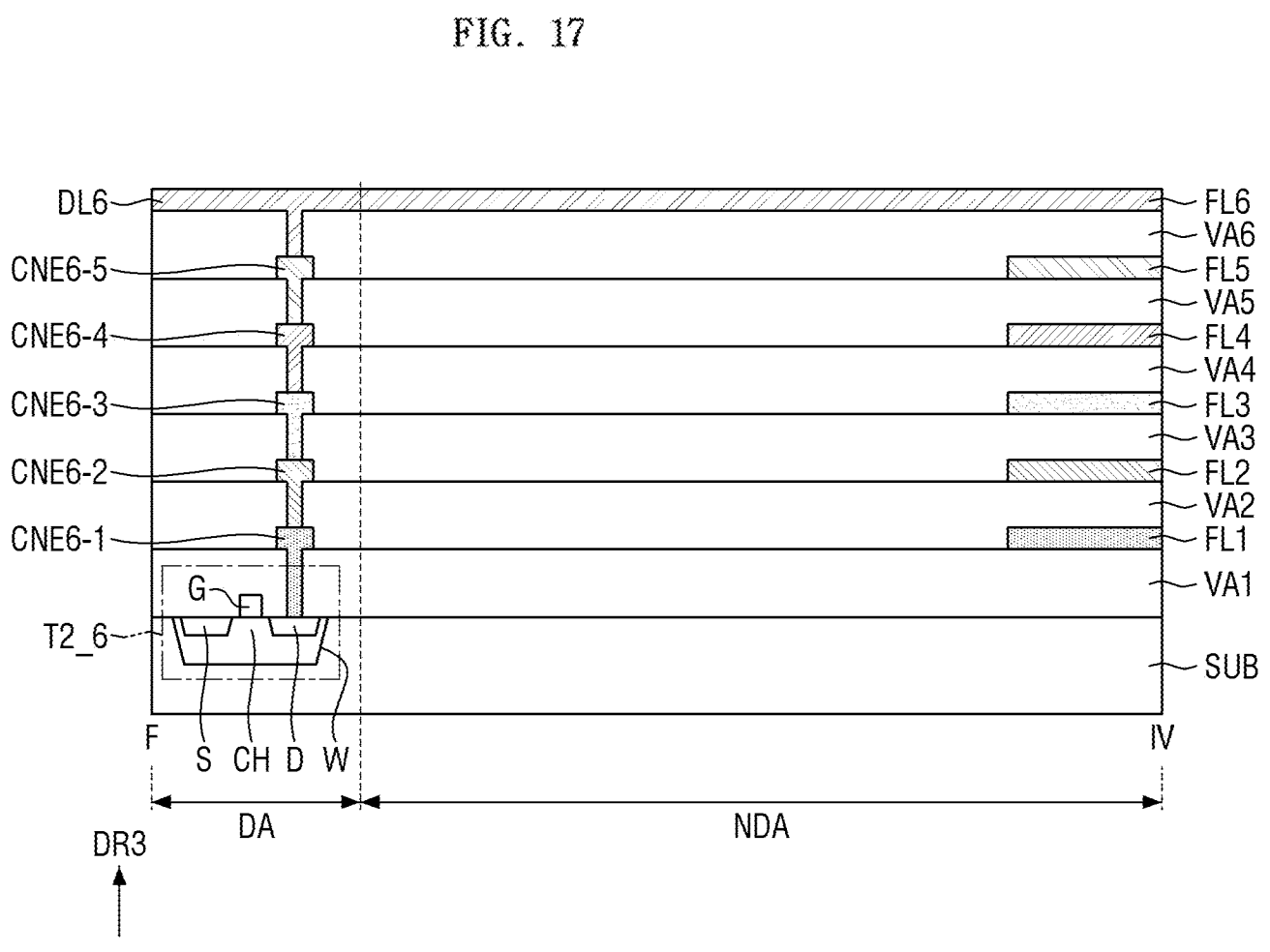

FIG. 11 is a detailed configuration diagram of a part P of FIG. 3. FIG. 12 is a cross-sectional view taken along the line A-IV of FIG. 11. FIG. 13 is a cross-sectional view taken along the line B-IV of FIG. 11. FIG. 14 is a cross-sectional view taken along the line C-IV of FIG. 11. FIG. 15 is a cross-sectional view taken along the line D-IV of FIG. 11. FIG. 16 is a cross-sectional view taken along the line E-IV of FIG. 11. FIG. 17 is a cross-sectional view taken along the line F-IV of FIG. 11. FIG. 11 is the same as FIG. 7 described above except for the difference in the position of the cross-section line.

As shown in FIGS. 11 and 12, the first data line DL1 of the first signal transmission line STL1 may be disposed in the display area DA, and the first fan-out line FL1 of the first signal transmission line STL1 may be disposed in the non-display area NDA. In this case, the first data line DL1 may be connected to the second transistor T2_1 of the first pixel PX1. For example, the first data line DL1 may be directly connected to the drain electrode D of the second transistor T2_1. In some embodiments, the first fan-out line FL1 of the first signal transmission line STL1 may overlap the second to sixth fan-out lines FL2 to FL6 in the non-display area NDA.

As shown in FIGS. 11 and 13, the second data line DL2 of the second signal transmission line STL2 may be disposed in the display area DA, and the second fan-out line FL2 of the second signal transmission line STL2 may be disposed in the non-display area NDA. In this case, the second data line DL2 may be connected to the second transistor T2_2 of the second pixel PX2. For example, the second data line DL2 may be connected to the drain electrode D of the second transistor T2_2 through the connection electrode CNE2. In some embodiments, the second fan-out line FL2 of the second signal transmission line STL2 may overlap the first, third, fourth, fifth, and sixth fan-out lines FL1, FL3, FL4, FL5, and FL6 in the non-display area NDA.

As shown in FIGS. 11 and 14, the third data line DL3 of the third signal transmission line STL3 may be disposed in the display area DA, and the third fan-out line FL3 of the third signal transmission line STL3 may be disposed in the non-display area NDA. In this case, the third data line DL3 may be connected to the second transistor T2_3 of the third pixel PX3. For example, the third data line DL3 may be connected to the drain electrode D of the second transistor T2_3 through the third-first connection electrode CNE3-1 and the third-second connection electrode CNE3-2. Further, the third fan-out line FL3 of the third signal transmission line STL3 may overlap the first, second, fourth, fifth, and sixth fan-out lines FL1, FL2, FL4, FL5, and FL6 in the non-display area NDA.

As shown in FIGS. 11 and 15, the fourth data line DL4 of the fourth signal transmission line STL4 may be disposed in the display area DA, and the fourth fan-out line FL4 of the fourth signal transmission line STL4 may be disposed in the non-display area NDA. In this case, the fourth data line DL4 may be connected to the second transistor T2_4 of the fourth pixel PX4. For example, the fourth data line DL4 may be connected to the drain electrode D of the second transistor T2_4 through the fourth-first connection electrode CNE4-1, the fourth-second connection electrode CNE4-2, and the fourth-third connection electrode CNE4-3. Further, the fourth fan-out line FL4 of the fourth signal transmission line STL4 may overlap the first, second, third, fifth, and sixth fan-out lines FL1, FL2, FL3, FL5, and FL6 in the non-display area NDA.

As shown in FIGS. 11 and 16, the fifth data line DL5 of the fifth signal transmission line STL5 may be disposed in the display area DA, and the fifth fan-out line FL5 of the fifth signal transmission line STL5 may be disposed in the non-display area NDA. In this case, the fifth data line DL5 may be connected to the second transistor T2_5 of the fifth pixel PX5. For example, the fifth data line DL5 may be connected to the drain electrode D of the second transistor T2_5 through the fifth-first connection electrode CNE5-1, the fifth-second connection electrode CNE5-2, the fifth-third connection electrode CNE5-3, and the fifth-fourth connection electrode CNE5-4. Further, the fifth fan-out line FL5 of the fifth signal transmission line STL5 may overlap the first, second, third, fourth, and sixth fan-out lines FL1, FL2, FL3, FL4, and FL6 in the non-display area NDA.

As shown in FIGS. 11 and 17, the sixth data line DL6 of the sixth signal transmission line STL6 may be disposed in the display area DA, and the sixth fan-out line FL6 of the sixth signal transmission line STL6 may be disposed in the non-display area NDA. In this case, the sixth data line DL6 may be connected to the second transistor T2_6 of the sixth pixel PX6. For example, the sixth data line DL6 may be connected to the drain electrode D of the second transistor T2_6 through the sixth-first connection electrode CNE6-1, the sixth-second connection electrode CNE6-2, the sixth-third connection electrode CNE6-3, the sixth-fourth connection electrode CNE6-4, and the sixth-fifth connection electrode CNE6-5. Further, the sixth fan-out line FL6 of the sixth signal transmission line STL6 may overlap the first to fifth fan-out lines FL1 to FL5 in the non-display area NDA.

Figure 18:
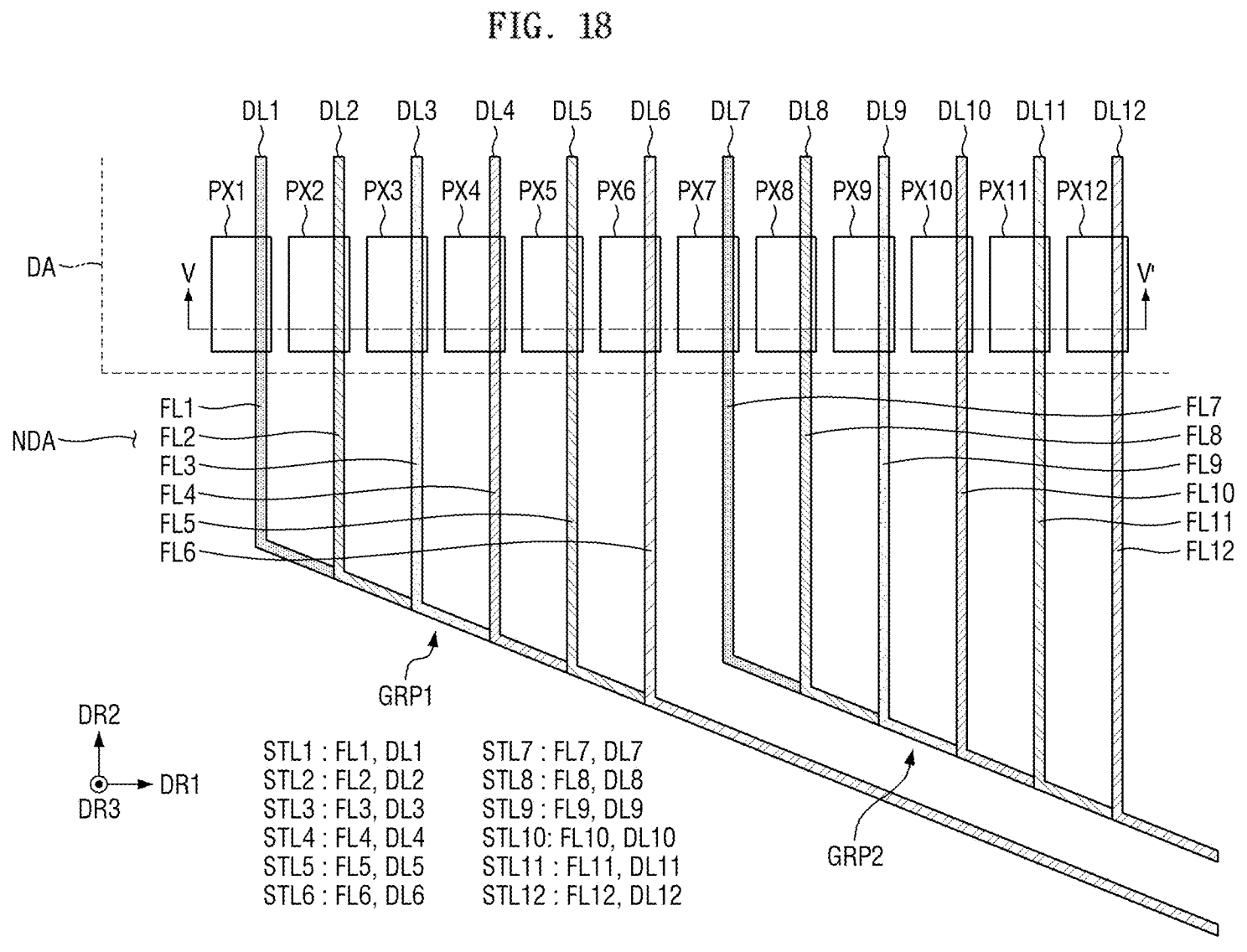
Figure 19:
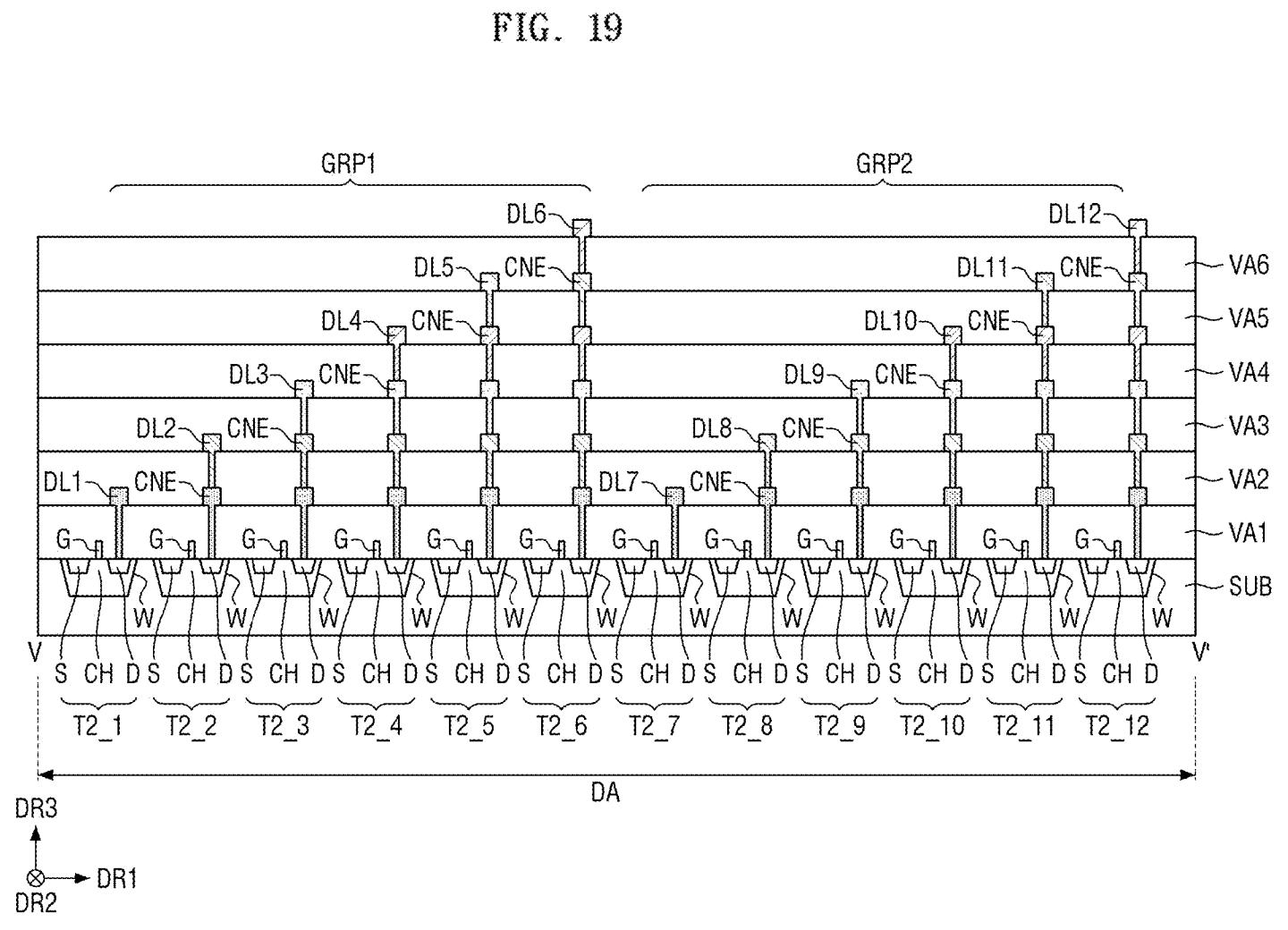

FIG. 18 is a plan view of a display device according to one or more embodiments, and FIG. 19 is a cross-sectional view taken along the line V-V' of FIG. 18.

As shown in FIG. 18, first to twelfth pixels PX1 to PX12 may be disposed in (e.g., arranged along) the first direction DR1 in the display area DA.

First to twelfth signal transmission lines STL1 to STL12 may be connected to the first to twelfth pixels PX1 to PX12, respectively. For example, a seventh data line DL7 of the seventh signal transmission line STL7 may be directly connected to the drain electrode D of a second transistor T2_7 provided in the seventh pixel PX7, an eighth data line DL8 of the eighth signal transmission line STL8 may be connected to the drain electrode D of a second transistor T2_8 provided in the eighth pixel PX8 through one connection electrode CNE, a ninth data line DL9 of the ninth signal transmission line STL9 may be connected to the drain electrode D of a second transistor T2_9 provided in the ninth pixel PX9 through two connection electrodes CNE, a tenth data line DL10 of the tenth signal transmission line STL10 may be connected to the drain electrode D of a second transistor T2_10 provided in the tenth pixel PX10 through three connection electrodes CNE, an eleventh data line DL11 of the eleventh signal transmission line STL11 may be connected to the drain electrode D of a second transistor T2_11 provided in the eleventh pixel PX11 through four connection electrodes CNE, and a twelfth data line DL12 of the twelfth signal transmission line STL12 may be connected to the drain electrode D of a second transistor T2_12 provided in the twelfth pixel PX12 through five connection electrodes CNE.

In one or more embodiments, the connection relationship between the first to sixth signal transmission lines STL1 to STL6 and the first to sixth pixels PX1 to PX6 may refer to the above description related to FIGS. 7 and 10.

The first to twelfth signal transmission lines STL1 to STL12 may be divided into signal transmission lines of a first group GRP1 and signal transmission lines of a second group GRP2. For example, the first to sixth signal transmission lines STL1 to STL6 disposed adjacently in the first direction DR1 and overlapping in the third direction DR3 may be the signal transmission lines of the first group GRP1, and the seventh to twelfth signal transmission lines STL7 to STL12 disposed adjacently in the first direction DR1 and overlapping in the third direction DR3 may be the signal transmission lines of the second group GRP2.

The signal transmission lines of the second group GRP2 may be disposed adjacent to the signal transmission lines of the first group GRP1 in the first direction DR1.

The signal transmission lines of the same group may overlap each other in the non-display area NDA. For example, as shown in FIGS. 18 and 19, the first to sixth signal transmission lines STL1 to STL6 may overlap in the third direction DR3 in the non-display area NDA, and the seventh to twelfth signal transmission lines STL7 to STL12 may overlap in the third direction DR3 in the non-display area NDA.

The signal transmission lines of different groups may not overlap in the non-display area NDA. For example, as shown in FIGS. 18 and 19, the first to sixth signal transmission lines STL1 to STL6 and the seventh to twelfth signal transmission lines STL7 to STL12 may not overlap in the third direction DR3 in the non-display area NDA.

The signal transmission lines of the same group may be disposed succeeding higher layers as they are arranged with each other along the first direction DR1. For example, as shown in FIG. 19, the first to sixth signal transmission lines STL1 to STL6 may be disposed succeeding higher layers as they are arranged with each other along the first direction DR1, and the seventh to twelfth signal transmission lines STL7 to STL12 may be disposed succeeding higher layers as they are arranged with each other along the first direction DR1.

The signal transmission lines disposed in different groups and adjacent to each other may be disposed on different layers in the display area DA. For example, as shown in FIG. 19, the sixth signal transmission line STL6 of the first group GRP1 and the seventh signal transmission line STL7 of the second group GRP2 may be disposed on different layers. In this case, as in one example shown in FIG. 19, the sixth signal transmission line STL6 and the seventh signal transmission line STL7 may be disposed to have a maximum distance therebetween. In other words, the sixth signal transmission line STL6 may be disposed on the highest layer (e.g., the sixth insulating layer VA6), and the seventh signal transmission line STL7 may be disposed on the lowest layer (e.g., the first insulating layer VA1).

Figure 20:
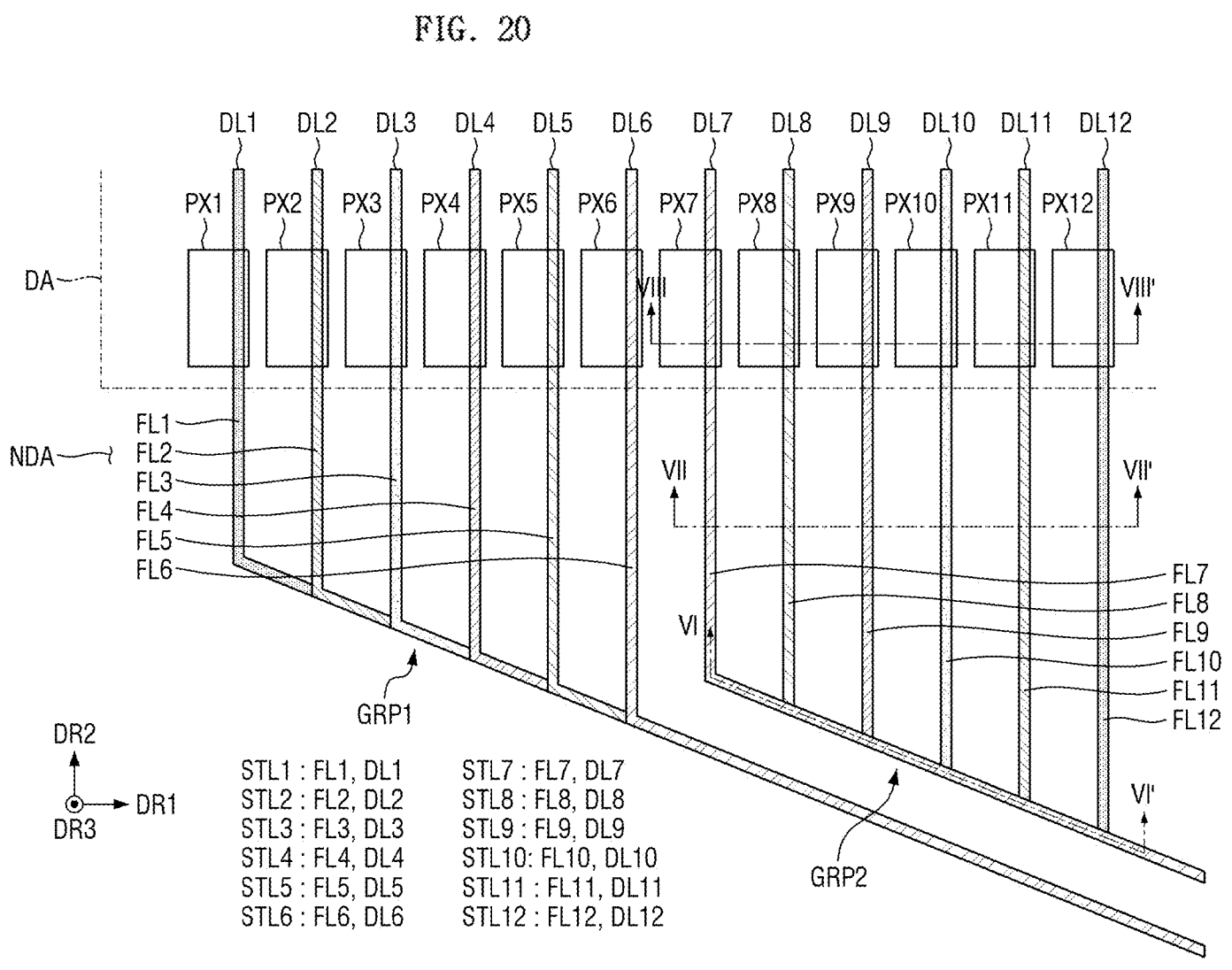
Figure 21:
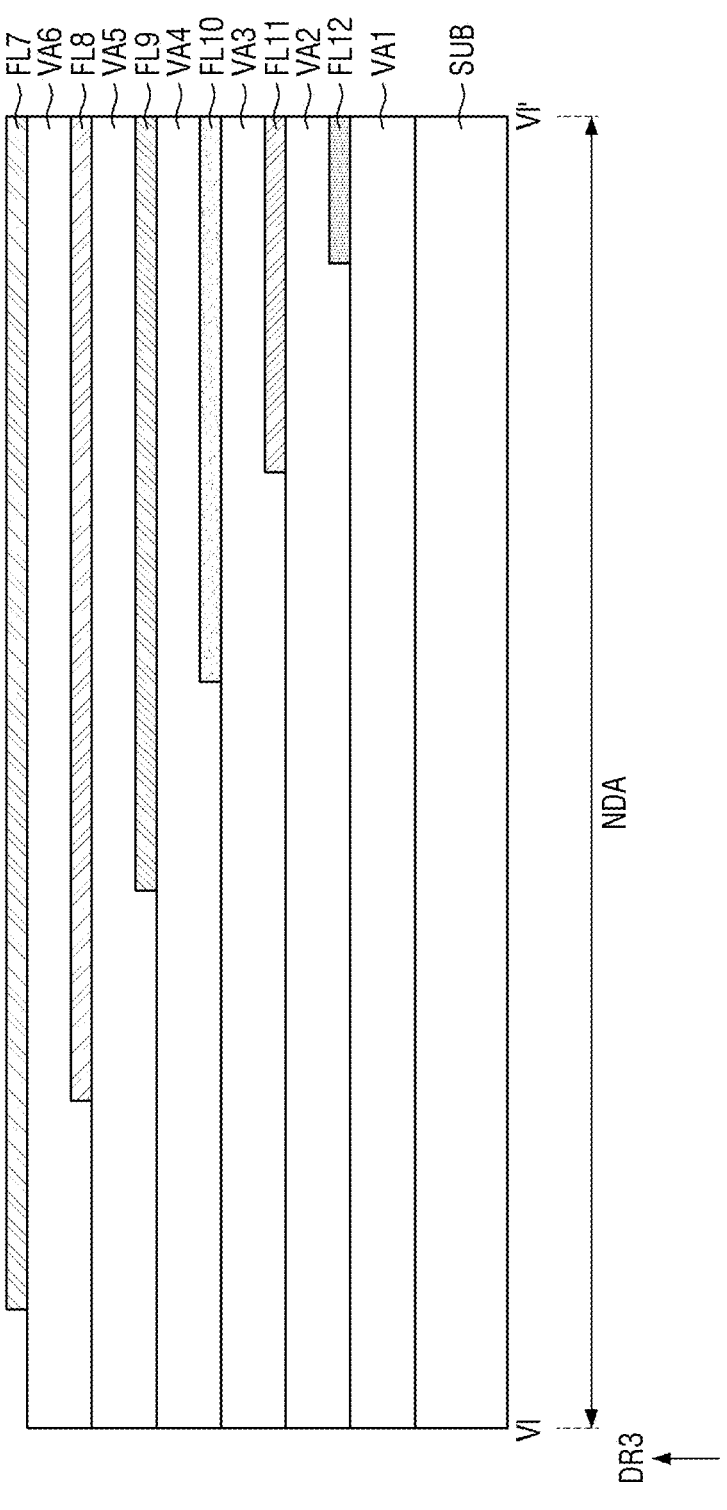
FIG. 21 is a cross-sectional view taken along the line VI-VI' of FIG. 20.
Figure 23:
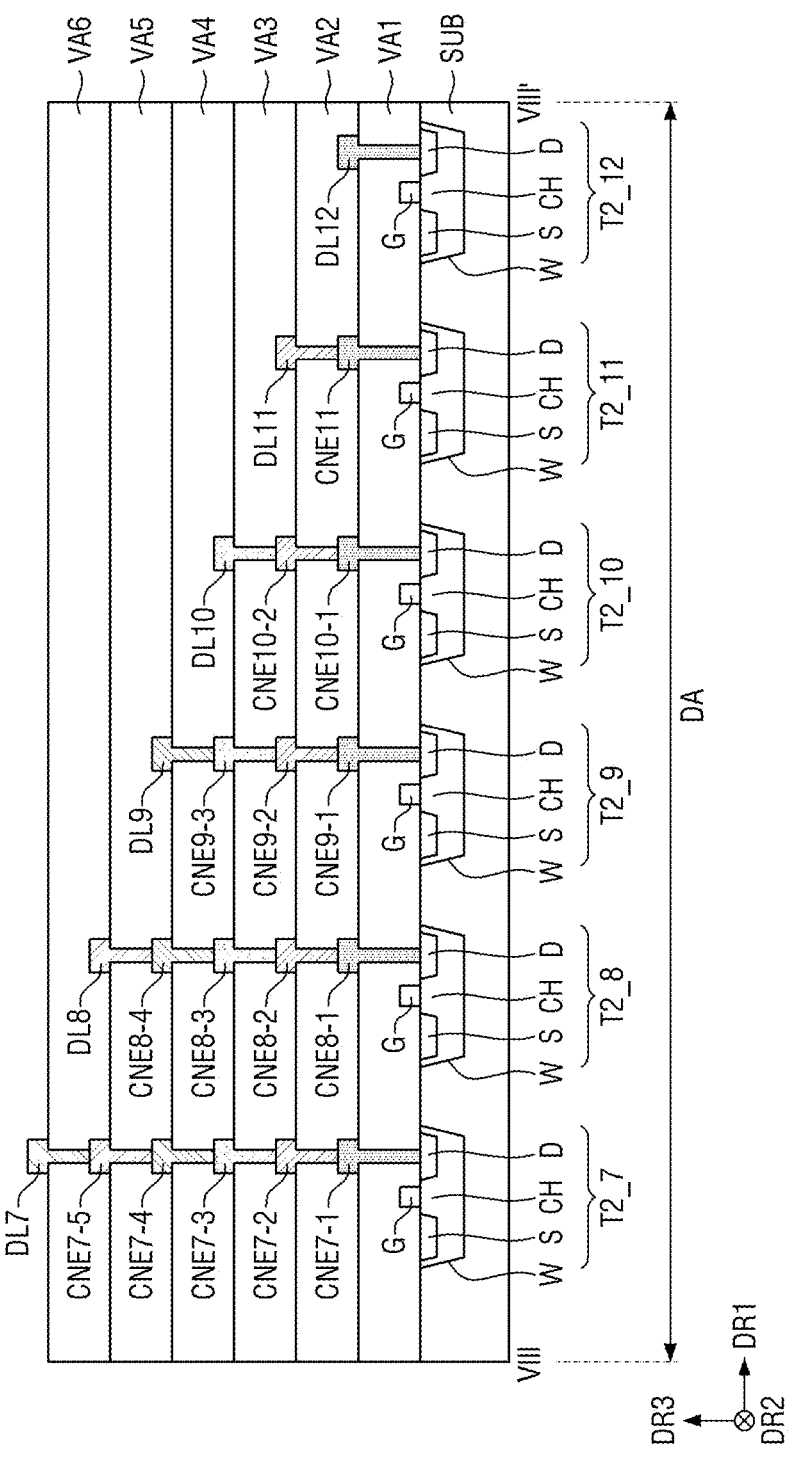
FIG. 23 is a cross-sectional view along the line VIII-VIII' of FIG. 20.

FIG. 20 is a plan view of a display device according to one or more embodiments, FIG. 21 is a cross-sectional view taken along the line VI-VI' of FIG. 20, FIG. 22 is a cross-sectional view taken along the line VII-VII' of FIG. 20, and FIG. 23 is a cross-sectional view along the line VIII-VIII' of FIG. 20.

As shown in FIG. 20, the signal transmission lines of the first group GRP1 and the signal transmission lines of the second group GRP2 may be disposed adjacent to each other. Here, the signal transmission lines of the first group GRP1 may be the same as the above-described first to sixth signal transmission lines STL1 to STL6 of FIGS. 7-17.

As shown in FIG. 20, the signal transmission lines of the second group GRP2 may include the seventh to twelfth signal transmission lines STL7 to STL12.

As illustrated in FIG. 20, the seventh signal transmission line STL7 may include the seventh data line DL7 disposed in the display area DA and a seventh fan-out line FL7 extending from the seventh data line DL7 and disposed in the non-display area NDA, the eighth signal transmission line STL8 may include the eighth data line DL8 disposed in the display area DA and an eighth fan-out line FL8 extending from the eighth data line DL8 and disposed in the non-display area NDA, the ninth signal transmission line STL9 may include the ninth data line DL9 disposed in the display area DA and a ninth fan-out line FL9 extending from the ninth data line DL9 and disposed in the non-display area NDA, the tenth signal transmission line STL10 may include the tenth data line DL10 disposed in the display area DA and a tenth fan-out line FL10 extending from the tenth data line DL10 and disposed in the non-display area NDA, the eleventh signal transmission line STL11 may include the eleventh data line DL11 disposed in the display area DA and an eleventh fan-out line FL11 extending from the eleventh data line DL11 and disposed in the non-display area NDA, and the twelfth signal transmission line STL12 may include the twelfth data line DL12 disposed in the display area DA and a twelfth fan-out line FL12 extending from the twelfth data line DL12 and disposed in the non-display area NDA.

The seventh data line DL7 of the seventh signal transmission line STL7 may be connected to the seventh pixel PX7, the eighth data line DL8 of the eighth signal transmission line STL8 may be connected to the eighth pixel PX8, the ninth data line DL9 of the ninth signal transmission line STL9 may be connected to the ninth pixel PX9, the tenth data line DL10 of the tenth signal transmission line STL10 may be connected to the tenth pixel PX10, the eleventh data line DL11 of the eleventh signal transmission line STL11 may be connected to the eleventh pixel PX11, and the twelfth data line DL12 of the twelfth signal transmission line STL12 may be connected to the twelfth pixel PX12. For example, as shown in FIG. 23, the seventh data line DL7 may be connected to the drain electrode D of the second transistor T2_7 provided in the seventh pixel PX7, the eighth data line DL8 of the eighth signal transmission line STL8 may be connected to the drain electrode D of the second transistor T2_8 provided in the eighth pixel PX8, the ninth data line DL9 of the ninth signal transmission line STL9 may be connected to the drain electrode D of the second transistor T2_9 provided in the ninth pixel PX9, the tenth data line DL10 of the tenth signal transmission line STL10 may be connected to the drain electrode D of the second transistor T2_10 provided in the tenth pixel PX10, the eleventh data line DL11 of the eleventh signal transmission line STL11 may be connected to the drain electrode D of the second transistor T2_11 provided in the eleventh pixel PX11, and the twelfth data line DL12 of the twelfth signal transmission line STL12 may be connected to the drain electrode D of the second transistor T2_12 provided in the twelfth pixel PX12. Here, each of the second transistors T2 of FIG. 23 may be the same as the above-described second transistor T2 of FIG. 5. Each of the second transistors T2_1 to T2_12 may include the gate electrode G, the channel region CH, the source electrode S, and the drain electrode D. The source electrode S, the drain electrode D, and the channel region CH of each of the second transistors T2_1 to T2_12 may be disposed in the well region W of the substrate SUB.

The seventh to twelfth signal transmission lines STL7 to STL12 may be disposed on succeeding lower layers as that are arranged with other along the first direction DR1. For example, as illustrated in FIGS. 22 and 23, the seventh signal transmission line STL7 may be disposed on the sixth insulating layer VA6, which is the highest layer, the eighth signal transmission line STL8 may be despised on the fifth insulating layer VA5, which is the next highest layer, the ninth signal transmission line STL9 may be disposed on the fourth insulating layer VA4, which is the next highest layer, the tenth signal transmission line STL10 may be disposed on the third insulating layer VA3, which is the next highest layer, the eleventh signal transmission line STL11 may be disposed on the second insulating layer VA2, which is the next highest layer, and the twelfth signal transmission line STL12 may be disposed on the first insulting layer VA1, which is the lowest layer.

As shown in FIG. 23, the seventh data line DL7 of the seventh signal transmission line STL7 may be connected to the drain electrode D of the second transistor T2_7 through a seventh-first connection electrode CNE7-1 on the first insulating layer VA1, a seventh-second connection electrode CNE7-2 on the second insulating layer VA2, a seventh-third connection electrode CNE7-3 on the third insulating layer VA3, a seventh-fourth connection electrode CNE7-4 on the fourth insulating layer VA4, and a seventh-fifth connection electrode CNE7-5 on the fifth insulating layer VA5. The eighth data line DL8 of the eighth signal transmission line STL8 may be connected to the drain electrode D of the second transistor T2_8 through an eighth-first connection electrode CNE8-1 on the first insulating layer VA1, an eighth-second connection electrode CNE8-2 on the second insulating layer VA2, an eighth-third connection electrode CNE8-3 on the third insulating layer VA3, and an eighth-fourth connection electrode CNE8-4 on the fourth insulating layer VA4. The ninth data line DL9 of the ninth signal transmission line STL9 may be connected to the drain electrode D of the second transistor T2_9 through a ninth-first connection electrode CNE9-1 on the first insulating layer VA1, a ninth-second connection electrode CNE9-2 on the second insulating layer VA2, and a ninth-third connection electrode CNE9-3 on the third insulating layer VA3. The tenth data line DL10 of the tenth signal transmission line STL10 may be connected to the drain electrode D of the second transistor T2 through a tenth-first connection electrode CNE10-1 on the first insulating layer VA1 and a tenth-second connection electrode CNE10-2 on the second insulating layer VA2. The eleventh data line DL11 of the eleventh signal transmission line STL11 may be directly connected to the drain electrode D of the second transistor T2 through an eleventh connection electrode CNE11 on the first insulating layer VA1.

As illustrated in FIGS. 21 and 23, the seventh to twelfth signal transmission lines STL1 to STL12 may overlap in the third direction DR3 in the non-display area NDA, and may not overlap in the third direction DR3 in the display area DA. In other words, the seventh to twelfth fan-out lines FL7 to FL12 of the seventh to twelfth signal transmission lines STL7 to STL12 may overlap in the third direction DR3 in the non-display area NDA, while the seventh to twelfth data lines DL7 to DL12 of the seventh to twelfth signal transmission lines STL7 to STL12 may not overlap in the third direction DR3 in the display area DA.

In this way, because the signal transmission lines STL7 to STL12 overlap in the third direction DR3 in the non-display area NDA, the density of the fan-out lines in the area (hereinafter referred to as a fan-out area) where the fan-out lines FL7 to FL12 are disposed may increase. As a result, the area (for example, the size in the first direction DR1*the size in the second direction DR2) of the fan-out area may be reduced, so that a dead space area of the display device may be reduced or minimized.

Figure 24:
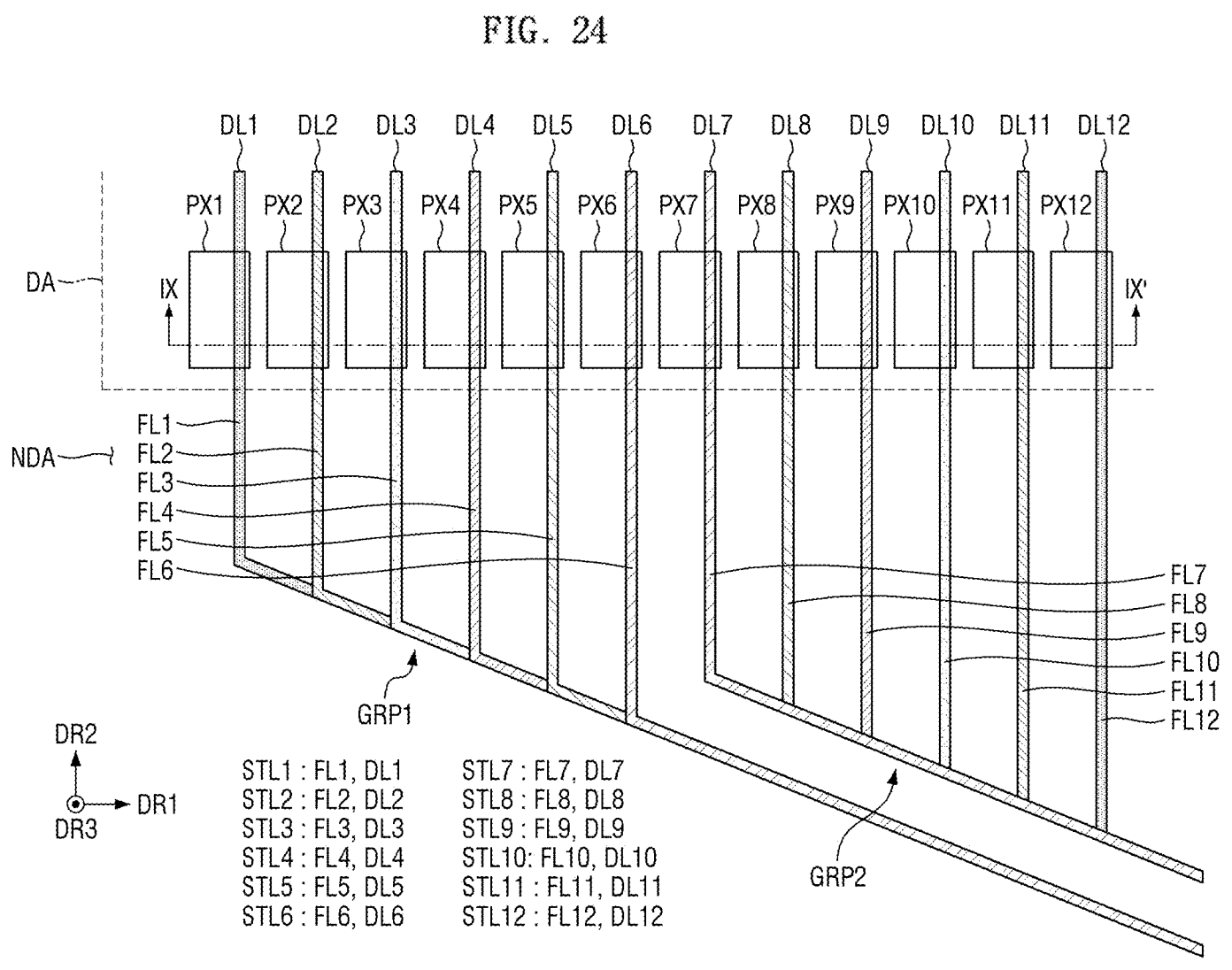
Figure 25:
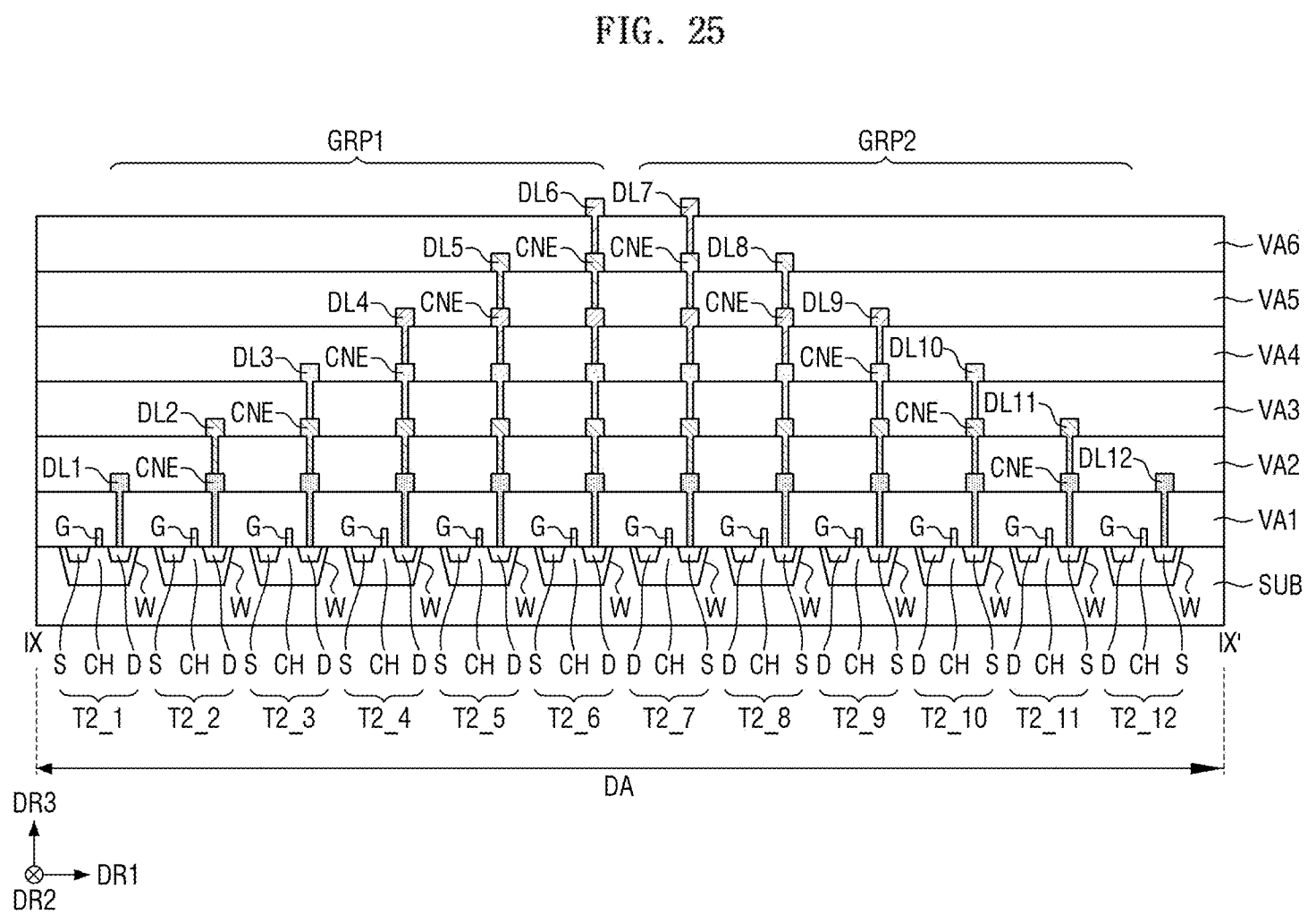

FIG. 24 is a plan view of a display device according to one or more embodiments, and FIG. 25 is a cross-sectional view taken along the line IX-IX' of FIG. 24. Here, FIG. 24 is the same as FIG. 20 described above except for the position of a section line.

As illustrated in FIGS. 24 and 25, while the signal transmission lines STL1 to STL6 of the first group GRP1 may be disposed succeeding higher layers as they are arranged with each other along the first direction DR1, the signal transmission lines STL7 to STL12 of the second group GRP2 may be disposed on succeeding lower layers as that are arranged with other along the first direction DR1. Accordingly, the signal transmission lines respectively belonging to different groups from among the adjacent groups and disposed adjacent to each other may be placed on (e.g., at) the same layer in the display area DA. For example, as shown in FIG. 25, the sixth signal transmission line STL6 of the first group GRP1 and the seventh signal transmission line STL7 of the second group GRP2 adjacent thereto may be disposed on (e.g., at) the same layer. Accordingly, as shown in FIG. 25, the deviation between the distance from the sixth signal transmission line STL6 to the drain electrode D of the second transistor T2 and the distance from the seventh signal transmission line STL7 to the drain electrode D of the second transistor T2 may be reduced or minimized. Therefore, the deviation between the voltage drop of the data signal supplied to the sixth pixel PX6 through the sixth signal transmission line STL6 and the voltage drop of the data signal supplied to the seventh pixel PX7 through the seventh signal transmission line STL7 may be reduced or minimized. Thus, when data signals of the same grayscale are supplied to the sixth pixel PX6 and the seventh pixel PX7 adjacent to each other, the luminance deviation between the adjacent sixth and seventh pixels PX6 and PX7 may be reduced or minimized, so that the image quality of the display device 10 may be improved.

Figure 27:
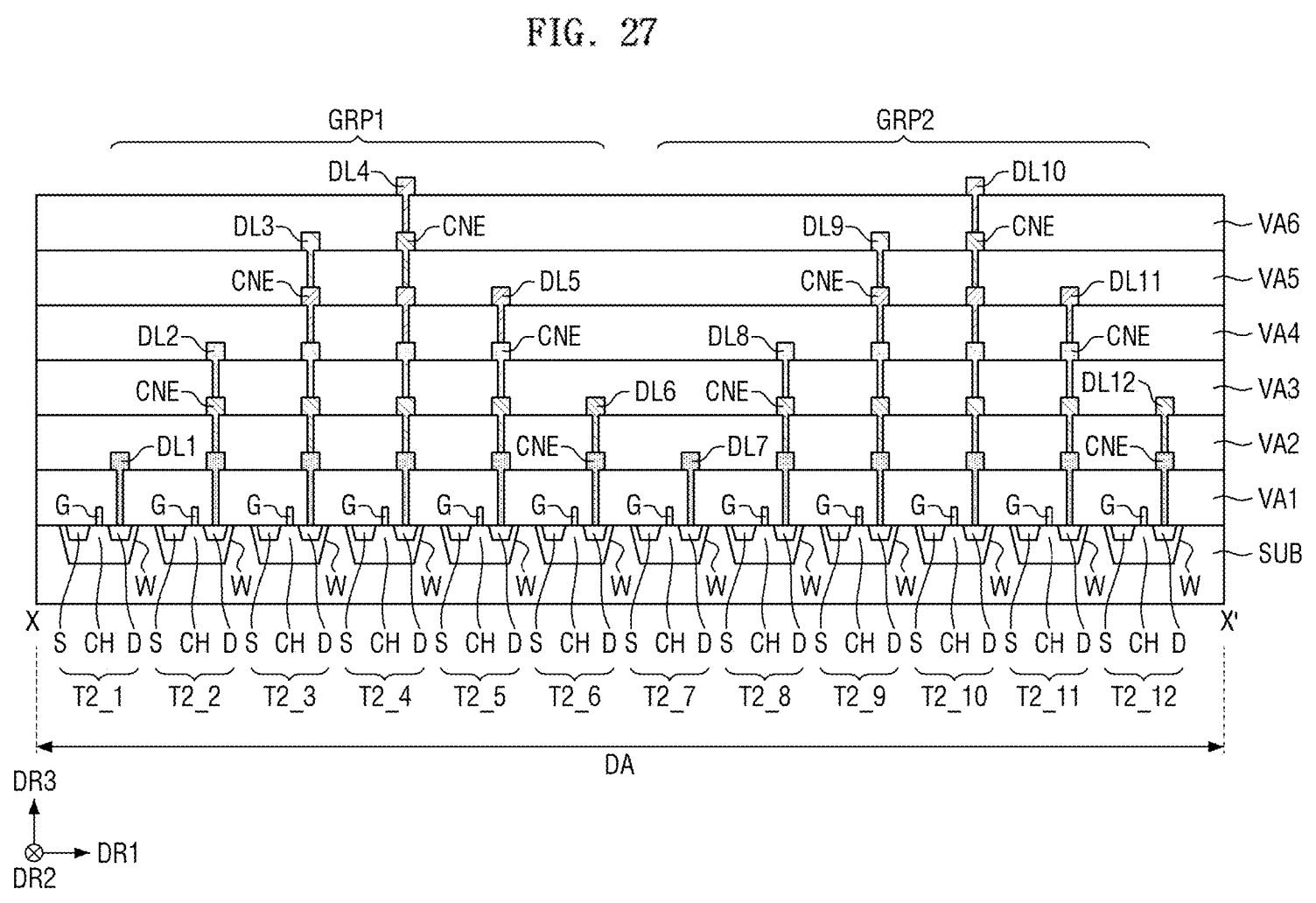

FIG. 26 is a plan view of a display device according to one or more embodiments, and FIG. 27 is a cross-sectional view along the line XX' of FIG. 26.

The display device 10 of FIGS. 26 and 27 is different from the display device of FIGS. 20-25 in the heights of the first to twelfth signal transmission lines STL1 to STL12 in the third direction DR3, and the following description will mainly focus on this difference.

As shown in FIGS. 26 and 27, the signal transmission lines of the first group GRP1 may include the first to sixth signal transmission lines STL1 to STL6. At this time, as illustrated in FIG. 27, the first data line DL1 of the first signal transmission line STL1 may be directly connected to the drain electrode D of the second transistor T2, the second data line DL2 of the second signal transmission line STL2 may be connected to the drain electrode D of the second transistor T2 through two connection electrodes CNE, the third data line DL3 of the third signal transmission line STL3 may be connected to the drain electrode D of the second transistor T2 through four connection electrodes CNE, the fourth data line DL4 of the fourth signal transmission line STL4 may be connected to the drain electrode D of the second transistor T2 through five connection electrodes CNE, the fifth data line DL5 of the fifth signal transmission line STL5 may be connected to the drain electrode D of the second transistor T2 through three connection electrodes CNE, and the sixth data line DL6 of the sixth signal transmission line STL6 may be connected to the drain electrode D of the second transistor T2 through one connection electrode CNE.

As shown in FIGS. 26 and 27, the signal transmission lines of the second group GRP2 may include the seventh to twelfth signal transmission lines STL7 to STL12. Here, the seventh data line DL7 of the seventh signal transmission line STL7 may be directly connected to the drain electrode D of the second transistor T2, the eighth data line DL8 of the eighth signal transmission line STL8 may be connected to the drain electrode D of the second transistor T2 through two connection electrodes CNE, the ninth data line DL9 of the ninth signal transmission line STL9 may be connected to the drain electrode D of the second transistor T2 through four connection electrodes CNE, the tenth data line DL10 of the tenth signal transmission line STL10 may be connected to the drain electrode D of the second transistor T2 through five connection electrodes CNE, the eleventh data line DL11 of the eleventh signal transmission line STL11 may be connected to the drain electrode D of the second transistor T2 through three connection electrodes CNE, and the twelfth data line DL12 of the twelfth signal transmission line STL12 may be connected to the drain electrode D of the second transistor T2 through one connection electrode CNE.

As illustrated in FIG. 27, the height difference between the sixth signal transmission line STL6 of the first group GRP1 and the seventh signal transmission line STL7 of the second group GRP2 adjacent thereto may be reduced. Accordingly, as shown in FIG. 27, the deviation between the distance from the sixth signal transmission line STL6 to the drain electrode D of the second transistor T2 and the distance from the seventh signal transmission line STL7 to the drain electrode D of the second transistor T2 may be reduced or minimized. Therefore, the deviation between the voltage drop of the data signal supplied to the sixth pixel PX6 through the sixth signal transmission line STL6 and the voltage drop of the data signal supplied to the seventh pixel PX7 through the seventh signal transmission line STL7 may be reduced or minimized. Thus, when data signals of the same grayscale are supplied to the sixth pixel PX6 and the seventh pixel PX7 adjacent to each other, the luminance deviation between the adjacent sixth and seventh pixels PX6 and PX7 may be reduced or minimized, so that the image quality of the display device 10 may be improved.

Figure 29:
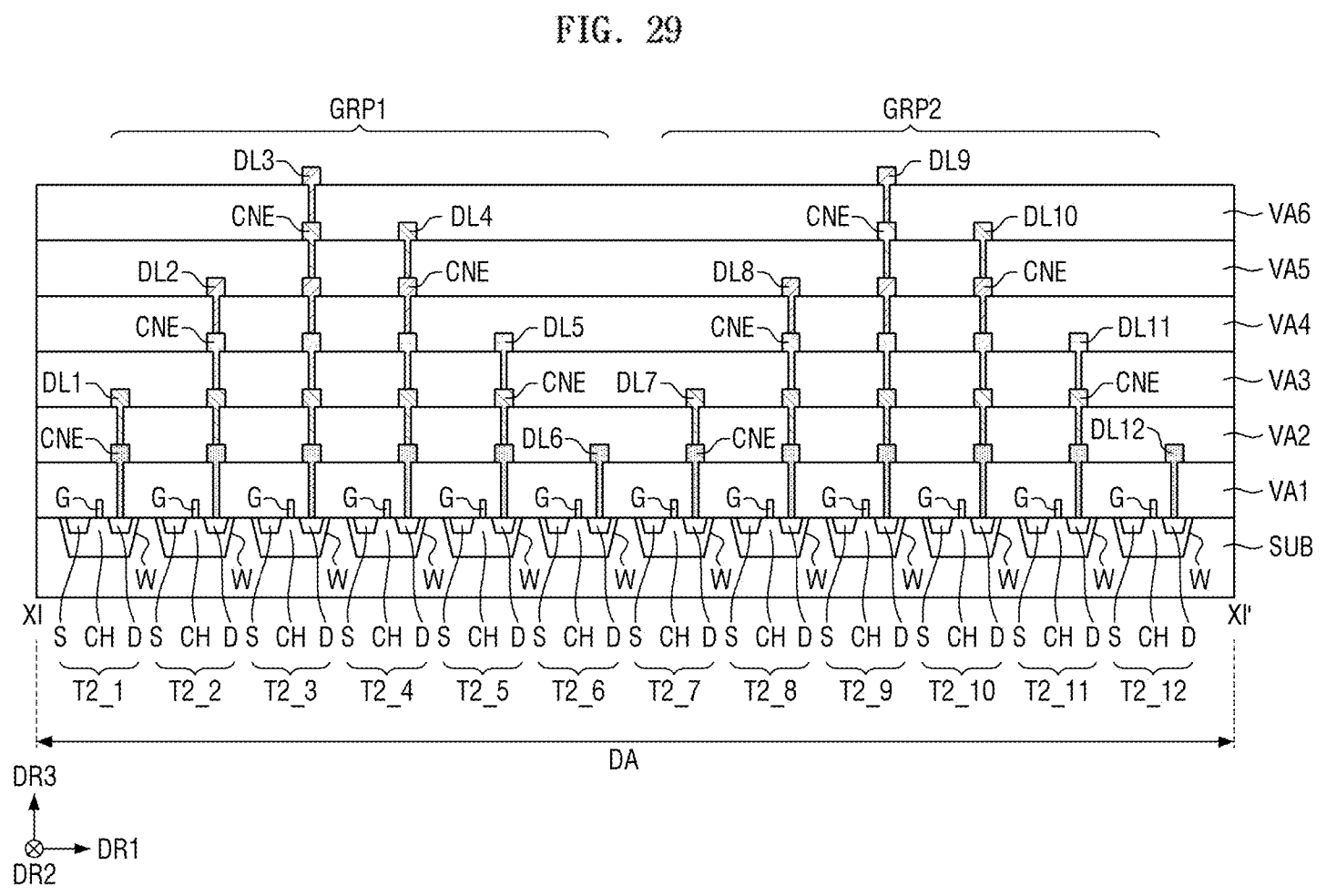

FIG. 28 is a plan view of a display device according to one or more embodiments, and FIG. 29 is a cross-sectional view taken along the line XI-XI' of FIG. 28.

The display device 10 of FIGS. 28 and 29 is different from the display device of FIGS. 20-25 in the heights of the first to twelfth signal transmission lines STL1 to STL12 in the third direction DR3, and the following description will mainly focus on this difference.

As shown in FIGS. 28 and 29, the signal transmission lines of the first group GRP1 may include the first to sixth signal transmission lines STL1 to STL6. Here, the first data line DL1 of the first signal transmission line STL1 may be directly connected to the drain electrode D of the second transistor T2 through one connection electrode CNE, the second data line DL2 of the second signal transmission line STL2 may be connected to the drain electrode D of the second transistor T2 through three connection electrodes CNE, the third data line DL3 of the third signal transmission line STL3 may be connected to the drain electrode D of the second transistor T2 through five connection electrodes CNE, the fourth data line DL4 of the fourth signal transmission line STL4 may be connected to the drain electrode D of the second transistor T2 through four connection electrodes CNE, the fifth data line DL5 of the fifth signal transmission line STL5 may be connected to the drain electrode D of the second transistor T2 through two connection electrodes CNE, and the sixth data line DL6 of the sixth signal transmission line STL6 may be directly connected to the drain electrode D of the second transistor T2.

As shown in FIGS. 28 and 29, the signal transmission lines of the second group GRP2 may include the seventh to twelfth signal transmission lines STL7 to STL12. Here, the seventh data line DL7 of the seventh signal transmission line STL7 may be directly connected to the drain electrode D of the second transistor T2 through one connection electrode CNE, the eighth data line DL8 of the eighth signal transmission line STL8 may be connected to the drain electrode D of the second transistor T2 through three connection electrodes CNE, the ninth data line DL9 of the ninth signal transmission line STL9 may be connected to the drain electrode D of the second transistor T2 through five connection electrodes CNE, the tenth data line DL10 of the tenth signal transmission line STL10 may be connected to the drain electrode D of the second transistor T2 through four connection electrodes CNE, the eleventh data line DL11 of the eleventh signal transmission line STL11 may be connected to the drain electrode D of the second transistor T2 through two connection electrodes CNE, and the twelfth data line DL12 of the twelfth signal transmission line STL12 may be directly connected to the drain electrode D of the second transistor T2.

As illustrated in FIG. 29, the height difference between the sixth signal transmission line STL6 of the first group GRP1 and the seventh signal transmission line STL7 of the second group GRP2 adjacent thereto may be reduced. Accordingly, as shown in FIG. 29, the deviation between the distance from the sixth signal transmission line STL6 to the drain electrode D of the second transistor T2 and the distance from the seventh signal transmission line STL7 to the drain electrode D of the second transistor T2 may be reduced or minimized. Therefore, the deviation between the voltage drop of the data signal supplied to the sixth pixel PX6 through the sixth signal transmission line STL6 and the voltage drop of the data signal supplied to the seventh pixel PX7 through the seventh signal transmission line STL7 may be reduced or minimized. Thus, when data signals of the same grayscale are supplied to the sixth pixel PX6 and the seventh pixel PX7 adjacent to each other, the luminance deviation between the adjacent sixth and seventh pixels PX6 and PX7 may be reduced or minimized, so that the image quality of the display device 10 may be improved.

Figure 30:
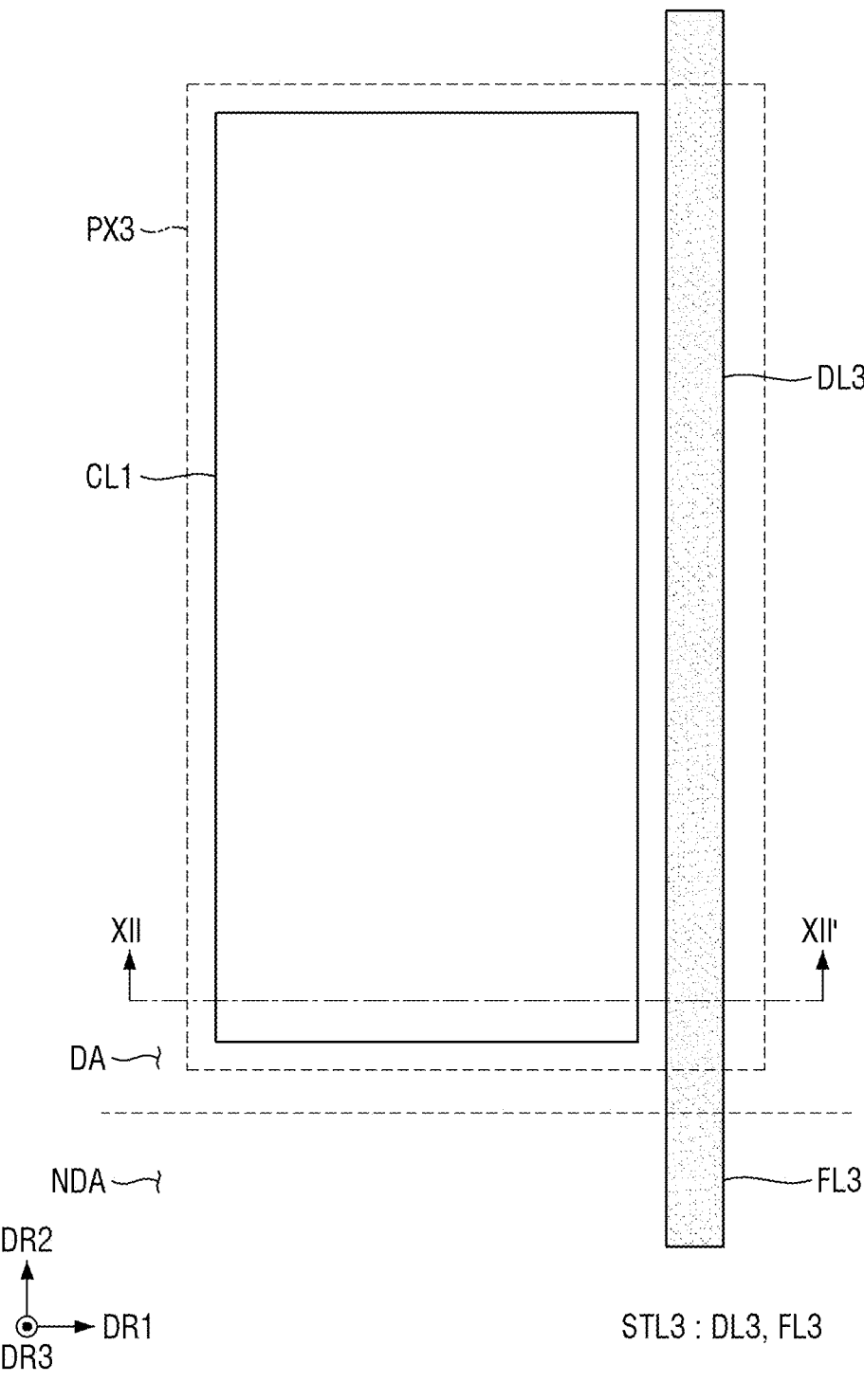
FIG. 30 is a plan view of a first capacitor layer and a third signal transmission line of a display device according to one or more embodiments.
Figure 31:
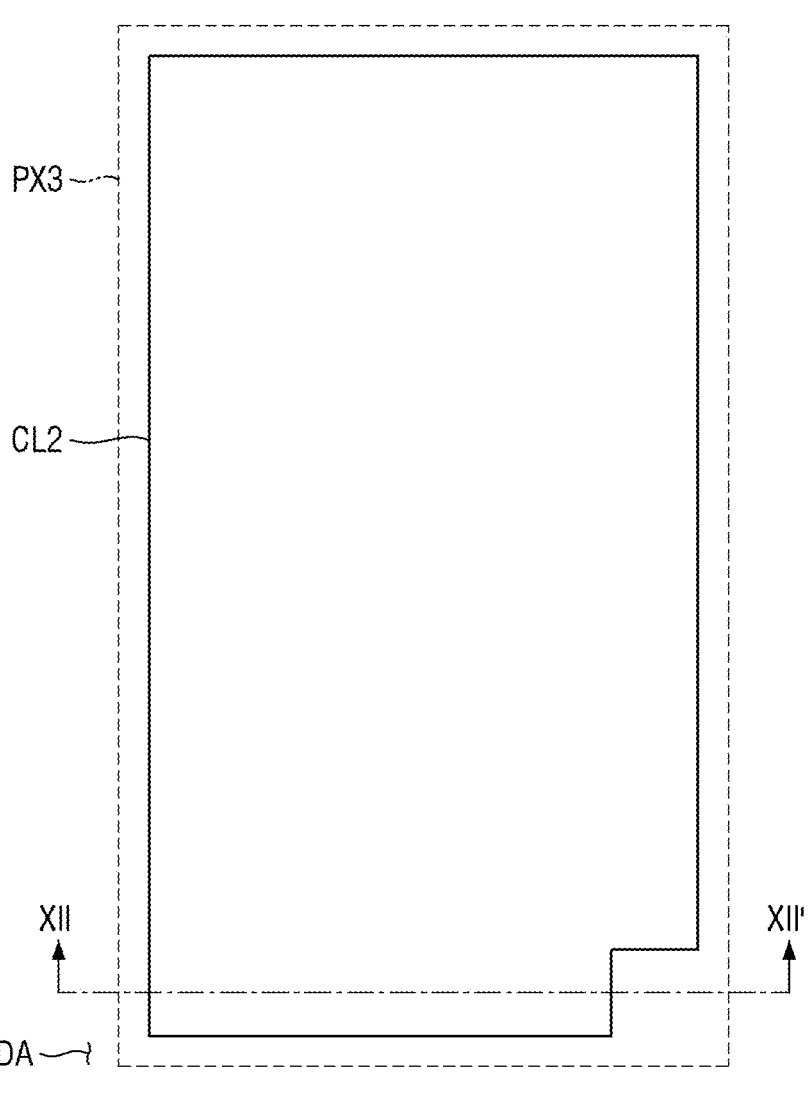
FIG. 31 is a plan view of a second capacitor layer of a display device according to one or more embodiments.
Figure 32:
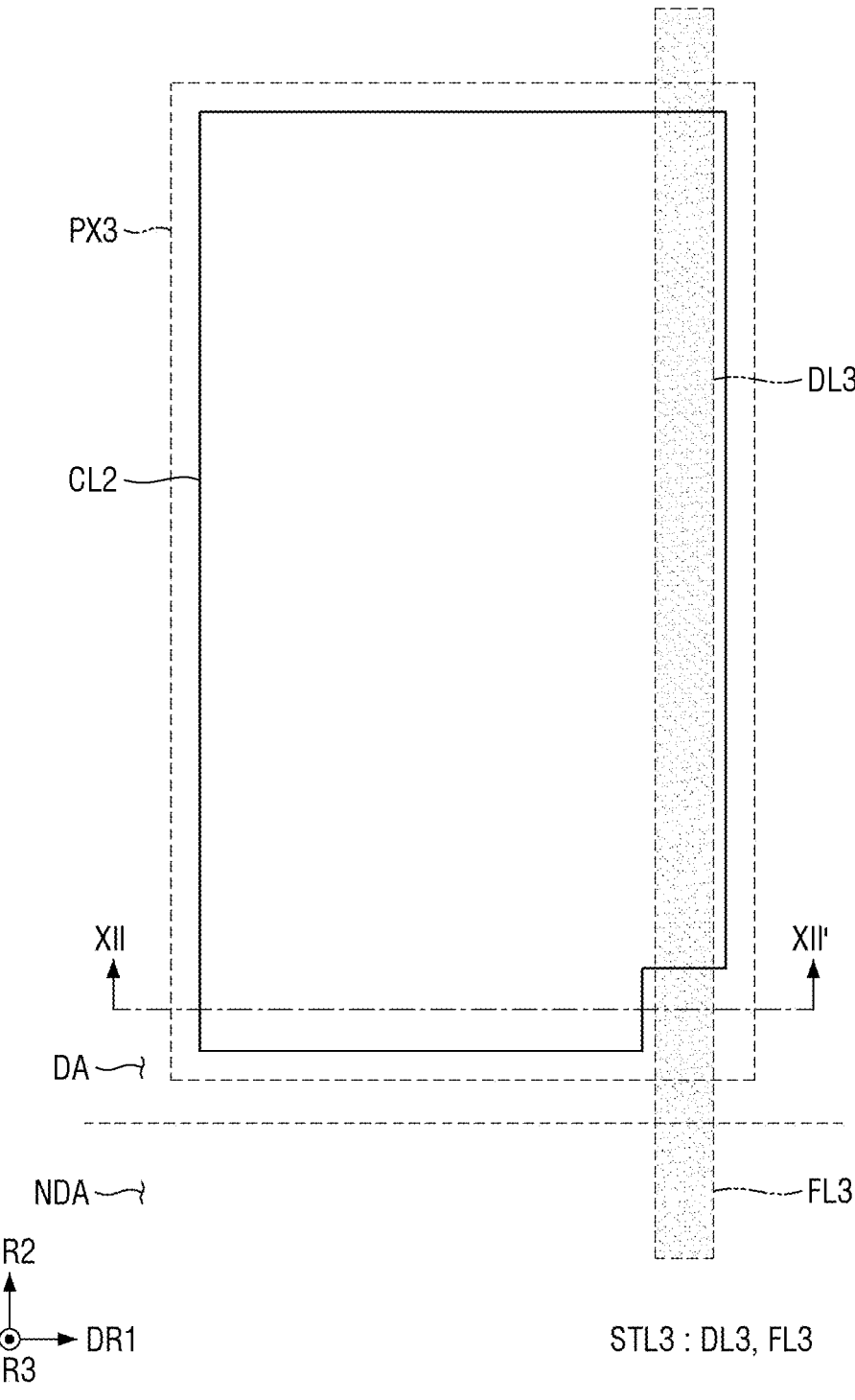
FIG. 32 is a diagram for explaining an overlapping relationship between the third data line of FIG. 30 and the second capacitor layer of FIG. 31.
Figure 33:
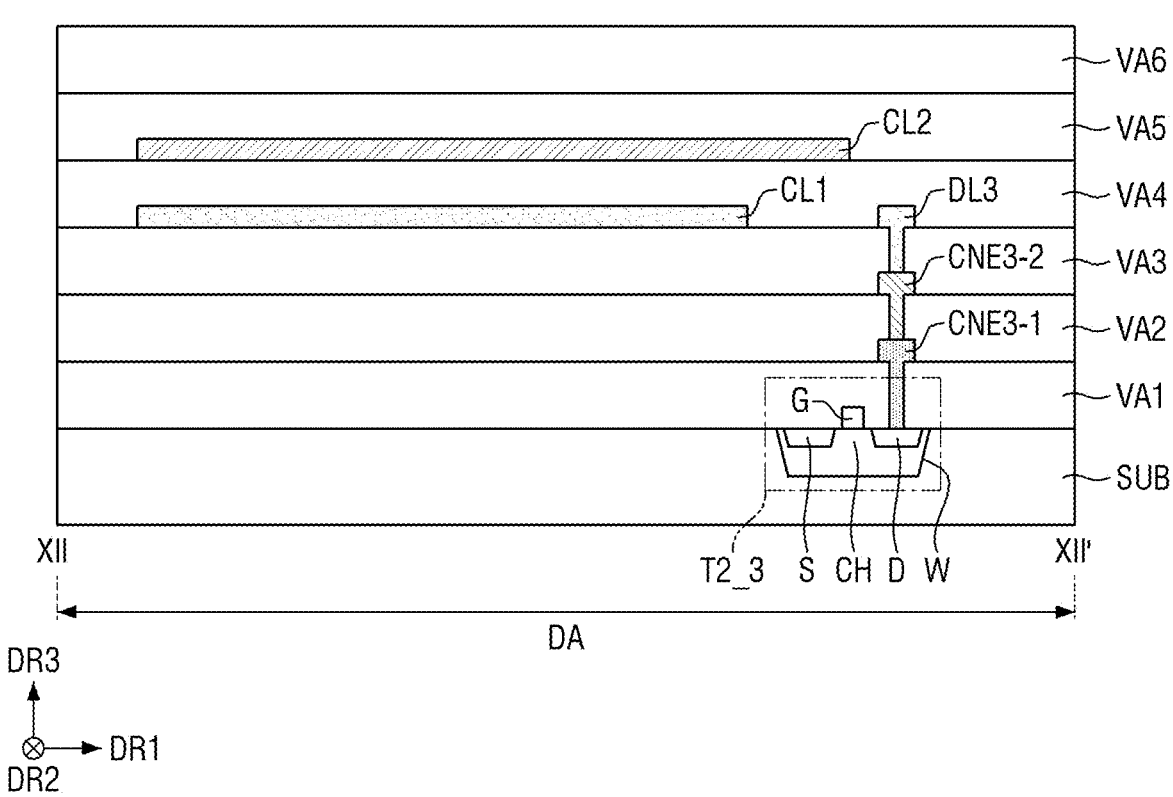
FIG. 33 is a cross-sectional view taken along line XII-XII' of FIGS. 30 and 31.
Figure 34:
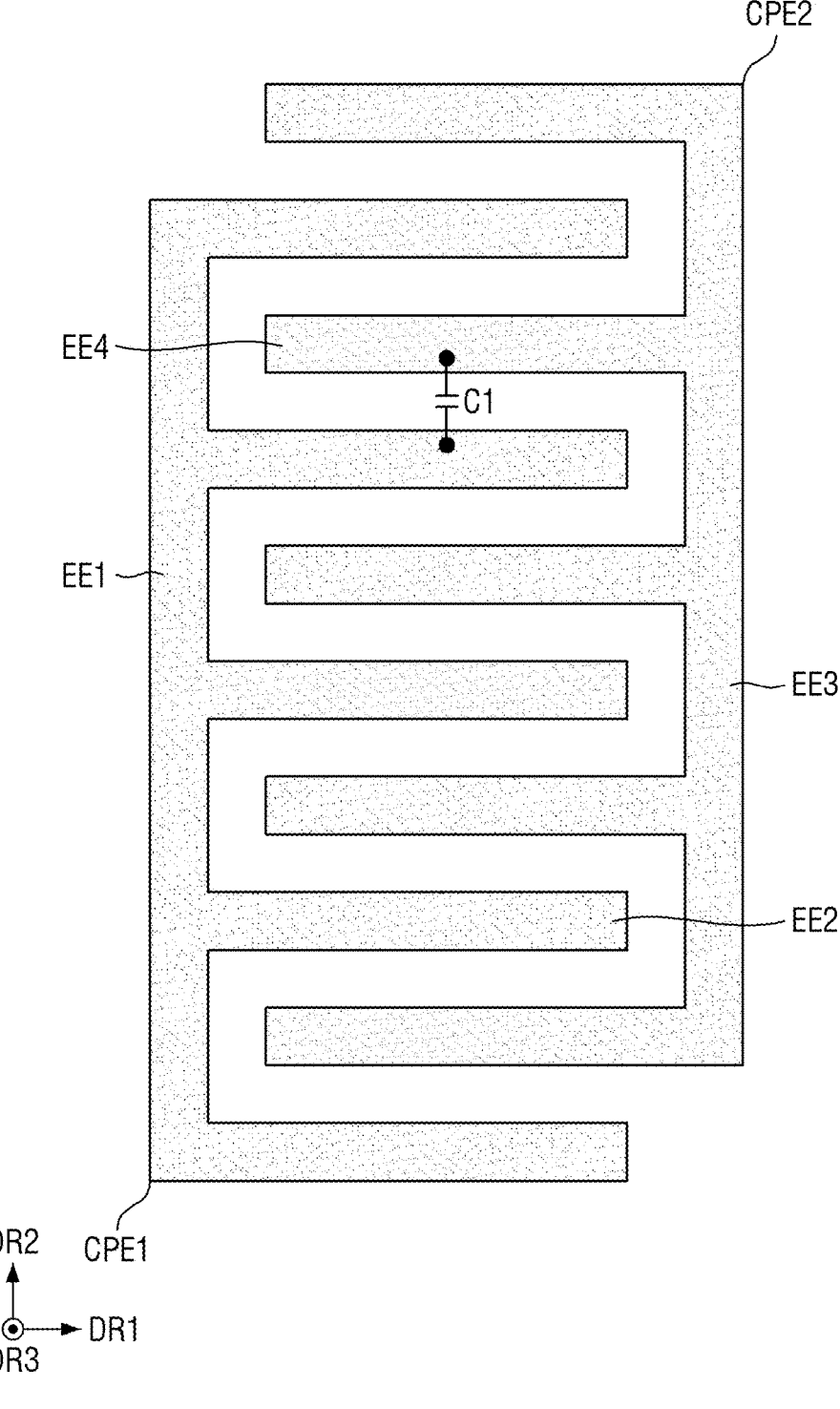
FIG. 34 is a detailed configuration diagram of the first capacitor layer of FIG. 30.

FIG. 30 is a plan view of a first capacitor layer CL1 and the third signal transmission line STL3 of a display device according to one or more embodiments, FIG. 31 is a plan view of a second capacitor layer CL2 of the display device according to one or more embodiments, FIG. 32 is a diagram for explaining an overlapping relationship between the third data line DL3 of FIG. 30 and the second capacitor layer CL2 of FIG. 31, FIG. 33 is a cross-sectional view taken along the line XII-XII' of FIGS. 30 and 31, and FIG. 34 is a detailed configuration diagram of the first capacitor layer CL1 of FIG. 30.

As shown in FIGS. 30-34, the third pixel PX3 may include the second transistor T2, the first capacitor layer CL1, and the second capacitor layer CL2. Here, the third pixel PX3 of FIGS. 30-32 may correspond to, for example, the aforementioned third pixel PX3 of FIG. 7. In some embodiments, the third signal transmission line STL3 of FIG. 30 may correspond to the aforementioned third signal transmission line STL3 of FIG. 7.

The first capacitor layer CL1 may provide the above-described first capacitor C1 of FIG. 5. The first capacitor layer CL1 may be disposed adjacent to the third data line DL3 of the third signal transmission line STL3, as shown in FIG. 30. In some embodiments, as illustrated in FIG. 33, the first capacitor layer CL1 may be disposed on (e.g., at) the same layer as the third signal transmission line STL3. For example, the first capacitor layer CL1 and the third data line DL3 of the third signal transmission line STL3 may be disposed on the third insulating layer VA3.

As illustrated in FIG. 34, the first capacitor layer CL1 may include a first capacitor electrode CPE1 and a second capacitor electrode CPE2 disposed on (e.g., at) the same layer. The first capacitor electrode CPE1 and the second capacitor electrode CPE2 may be disposed to face each other. The fourth insulating layer VA4 may be disposed between the first capacitor electrode CPE1 and the second capacitor electrode CPE2.

The first capacitor electrode CPE1 may include a first electrode EE1 extending in the second direction DR2 and a plurality of second electrodes EE2 extending from the first electrode EE1 in the first direction DR1.

The second capacitor electrode CPE2 may include a third electrode EE3 extending in the second direction DR2 and a plurality of fourth electrodes EE4 extending from the third electrode EE3 in a direction opposite to the first direction DR1. The first capacitor C1 may be formed between the second electrode EE2 of the first capacitor electrode CPE1 and the fourth electrode EE4 of the second capacitor electrode CPE2.

The third data line DL3 of the third signal transmission line STL3 may be connected to the drain electrode D of the second transistor T2 through the third-first connection electrode CNE3-1 on the first insulating layer VA1 and the third-second connection electrode CNE3-2 on the second insulating layer VA2.

The second capacitor layer CL2 may provide the above-described second capacitor C2 of FIG. 5. As illustrated in FIG. 31, the second capacitor layer CL2 may have a larger area than that of the first capacitor layer CL1. In some embodiments, the second capacitor layer CL2 may be disposed on a layer higher than the first capacitor layer CL1 and the third signal transmission line STL3, as shown in FIG. 33. For example, the second capacitor layer CL2 may be disposed on the fourth insulating layer VA4. Here, because the third data line DL3 of the third signal transmission line STL3 and the second capacitor layer CL2 are disposed on different layers, the second capacitor layer CL2 may have a larger area than that of the first capacitor layer CL1.

As shown in FIG. 32, the second capacitor layer CL2 may overlap the third data line DL3 in the third direction DR3.

For example, the second capacitor layer CL2 may have the same shape as the first capacitor layer CL1 of FIG. 34. For example, the second capacitor layer CL2 may include a first capacitor electrode and a second capacitor electrode disposed on (e.g., at) the same layer to face each other.

Figure 35:
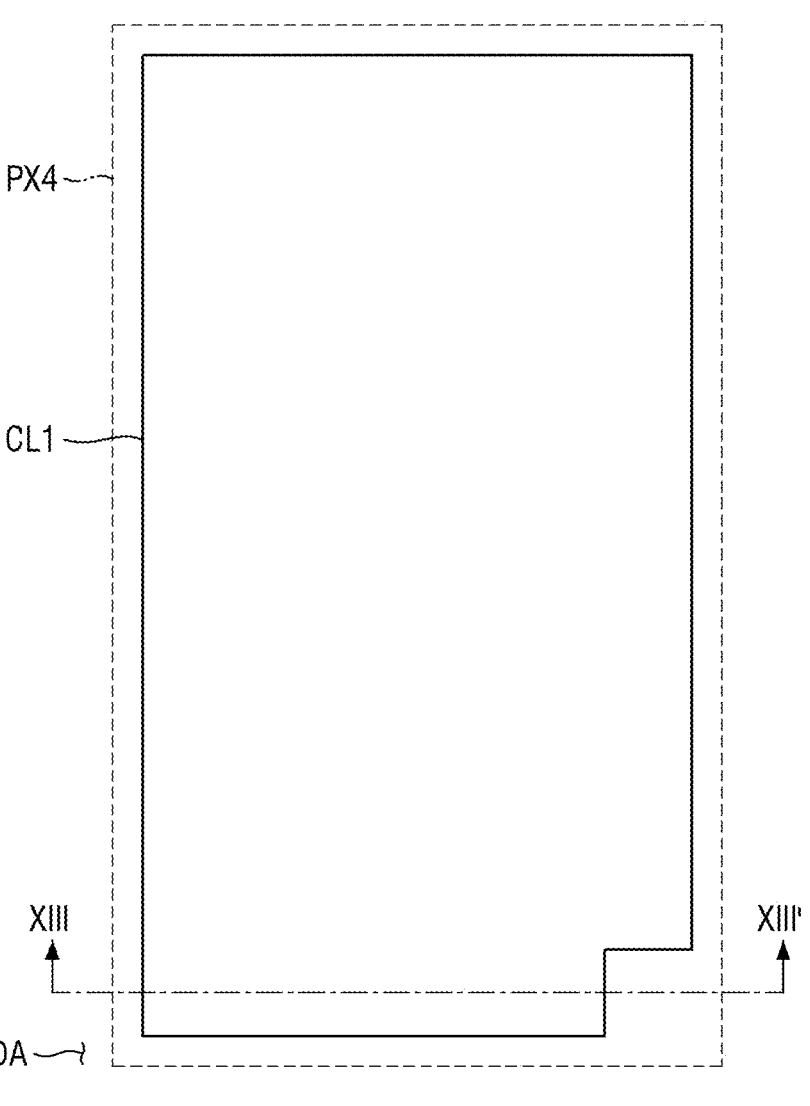
FIG. 35 is a plan view of a first capacitor layer of a display device according to one or more embodiments.
Figure 36:
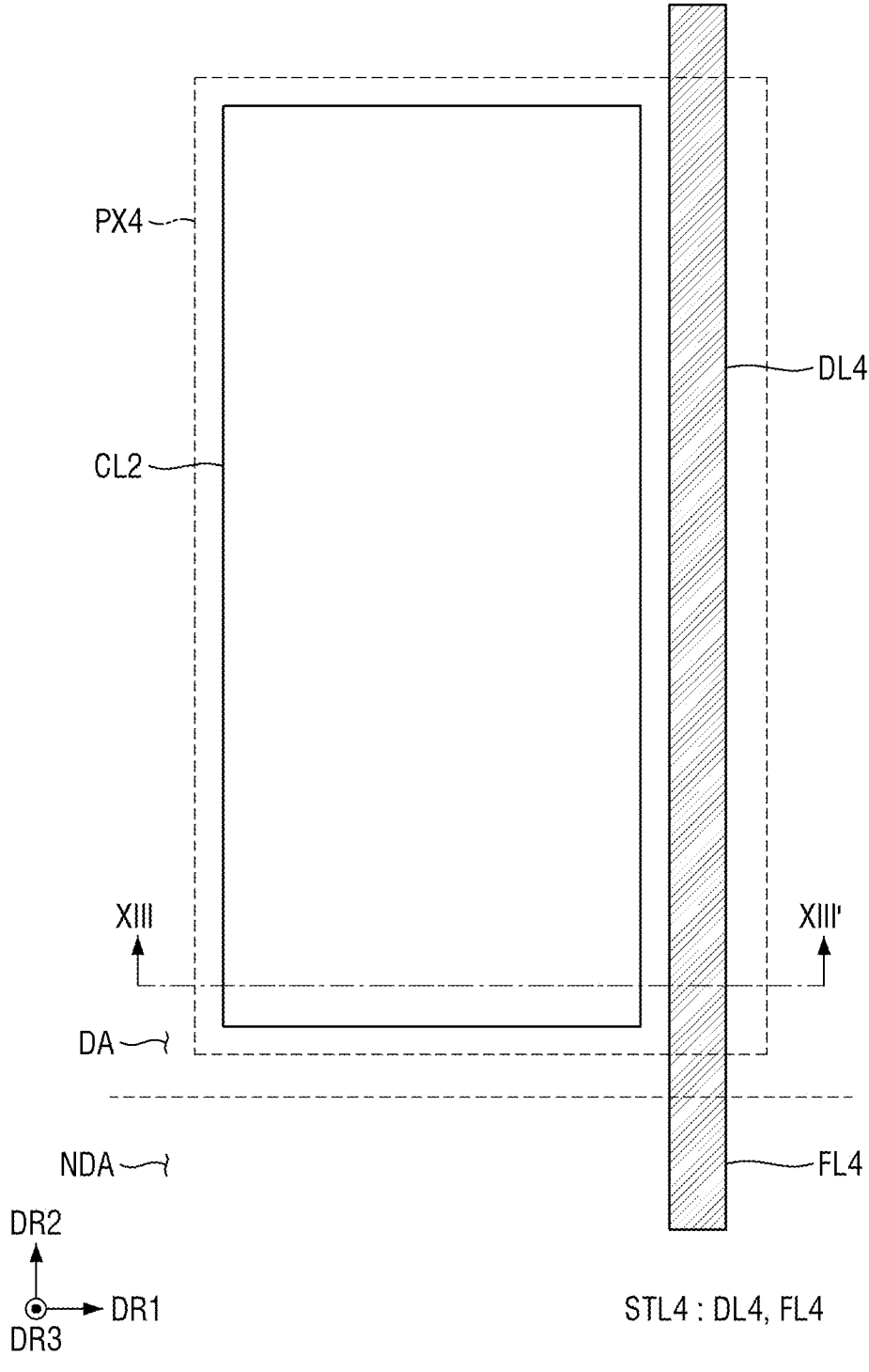
FIG. 36 is a plan view of a second capacitor layer and a fourth signal transmission line of a display device according to one or more embodiment.
Figure 37:
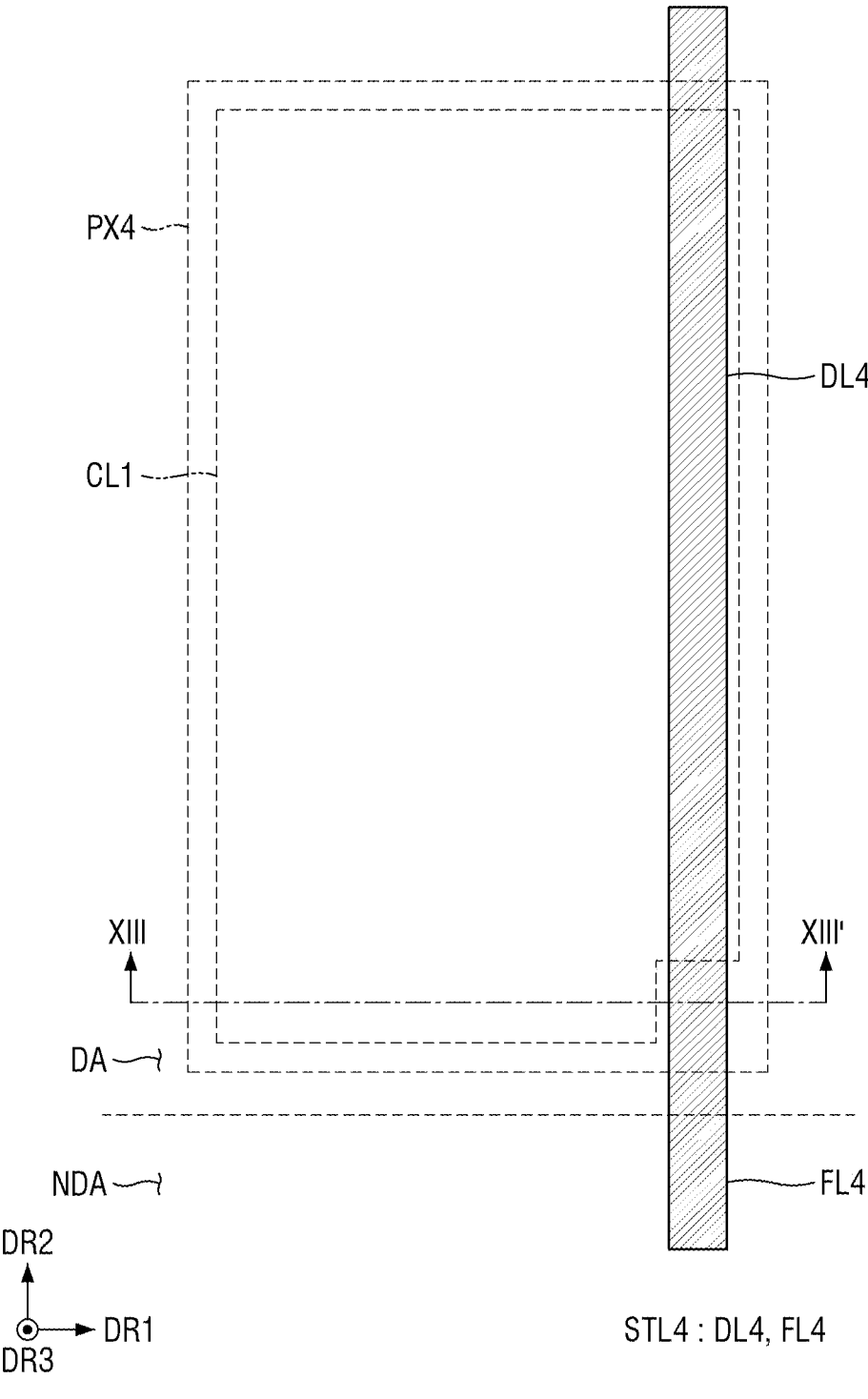
FIG. 37 is a diagram for explaining an overlapping relationship between the fourth data line of FIG. 36 and the first capacitor layer of FIG. 35.
Figure 38:
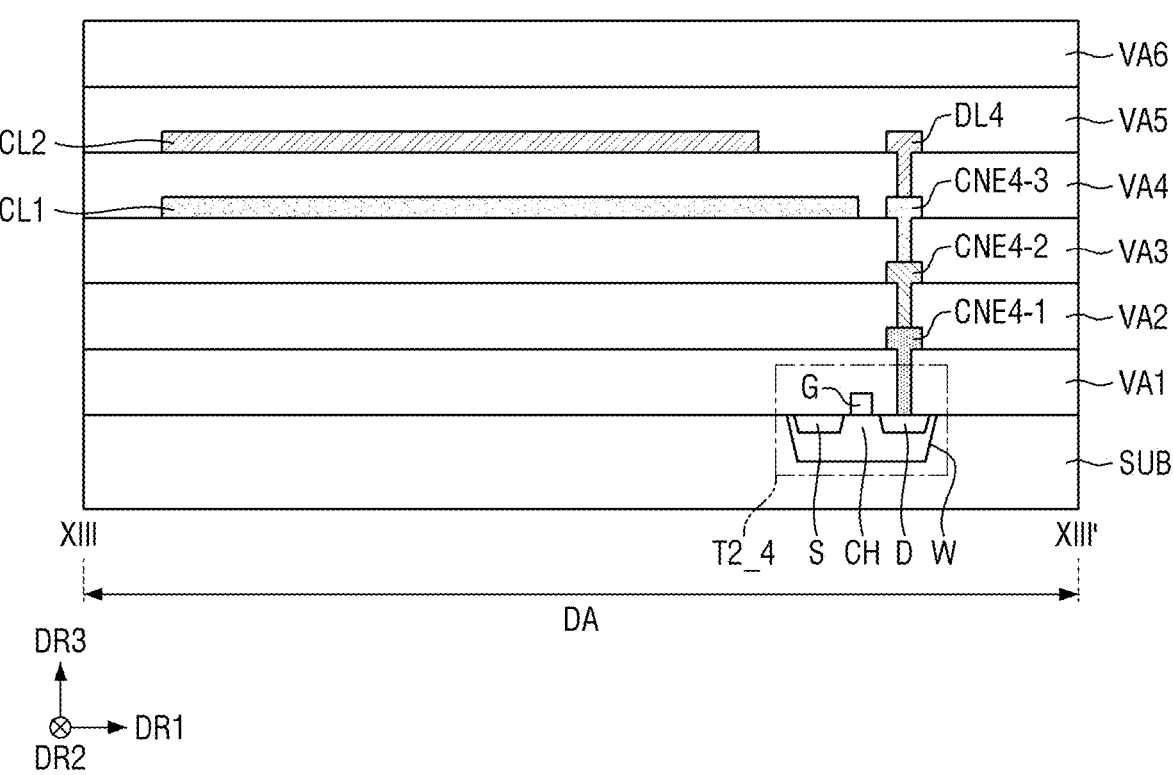
FIG. 38 is a cross-sectional view taken along the line XIII-XIII' of FIGS. 35, 36, and 37.

FIG. 35 is a plan view of the first capacitor layer CL1 of the display device 10 according to one or more embodiments, FIG. 36 is a plan view of the second capacitor layer CL2 and the fourth signal transmission line STL4 of the display device according to one or more embodiments, FIG. 37 is a diagram for explaining an overlapping relationship between the fourth data line DL4 of FIG. 36 and the first capacitor layer CL1 of FIG. 35, and FIG. 38 is a cross-sectional view taken along the line XIII-XIII' of FIGS. 35, 36, and 37.

As depicted in FIGS. 35-38, the fourth pixel PX4 may include the second transistor T2, the first capacitor layer CL1, and the second capacitor layer CL2. Here, the fourth pixel PX4 of FIGS. 35-37 may correspond to, for example, the above-described fourth pixel PX4 of FIG. 7. In some embodiments, the fourth signal transmission line STL4 of FIG. 36 may correspond to the above-described fourth signal transmission line STL4 of FIG. 7.

The first capacitor layer CL1 may provide the above-described first capacitor C1 of FIG. 5. In some embodiments, as illustrated in FIG. 37, the first capacitor layer CL1 may overlap the fourth data line DL4 in the third direction DR3. The first capacitor layer CL1 may have the same shape and structure as the above-described first capacitor layer CL1 of FIG. 34.

The second capacitor layer CL2 may provide the above-described second capacitor C2 of FIG. 5. The second capacitor layer CL2 may be disposed adjacent to the fourth data line DL4 of the fourth signal transmission line STL4, as shown in FIG. 36. In some embodiments, as illustrated in FIG. 38, the second capacitor layer CL2 may be disposed on (e.g., at) the same layer as the fourth signal transmission line STL4. For example, the second capacitor layer CL2 and the fourth data line DL4 of the fourth signal transmission line STL4 may be disposed on (e.g., at) the fourth insulating layer VA4. The second capacitor layer CL2 may have the same shape and structure as the above-described first capacitor layer CL1 of FIG. 34. In some embodiments, the second capacitor layer CL2 may be disposed on the layer higher than the first capacitor layer CL1 and may be at the same layer as the fourth signal transmission line STL4, as shown in FIG. 38. For example, the second capacitor layer CL2 may be disposed on the fourth insulating layer VA4. Here, because the fourth data line DL4 of the fourth signal transmission line STL4 and the first capacitor layer CL1 are disposed on different layers, the first capacitor layer CL1 may have a larger area than that of the second capacitor layer CL2.

The fourth data line DL4 of the fourth signal transmission line STL4 may be connected to the drain electrode D of the second transistor T2 through the fourth-first connection electrode CNE4-1 on the first insulating layer VA1, the fourth-second connection electrode CNE4-2 on the second insulating layer VA2, and the fourth-third connection electrode CNE4-3 on the third insulating layer VA3.

Figure 39:
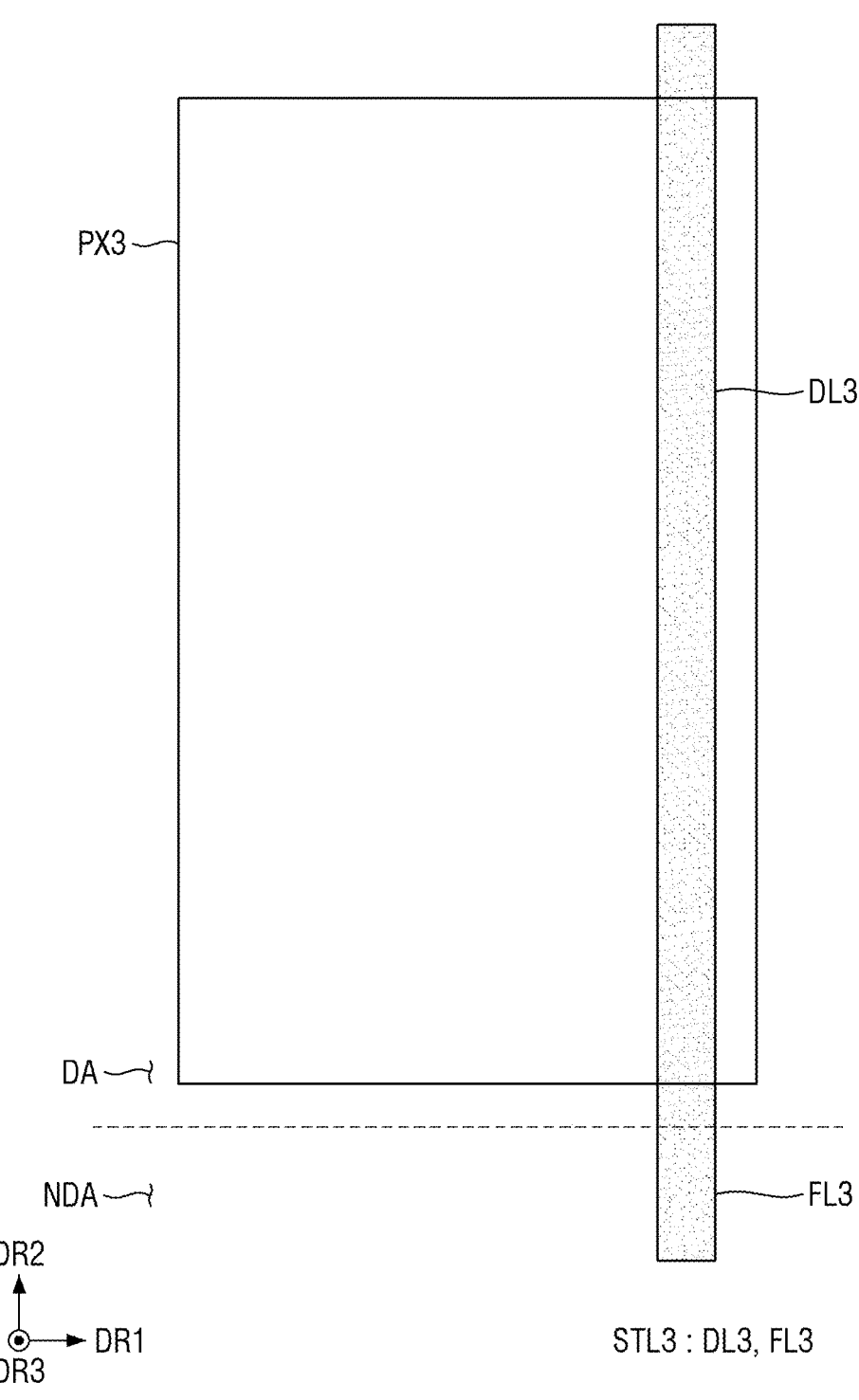
FIG. 39 is a plan view of a display device according to one or more embodiments.

FIG. 39 is a plan view of a display device according to one or more embodiments.

As illustrated in FIG. 39, the third signal transmission line STL3 may be disposed at the edge of the third pixel PX3. For example, the third data line DL3 of the third signal transmission line STL3 may be disposed at the edge of the third pixel PX3.

Here, the third pixel PX3 of FIG. 39 may correspond to, for example, the above-described third pixel PX3 of FIG. 7. In some embodiments, the third signal transmission line STL3 of FIG. 39 may correspond to the above-described third signal transmission line STL3 of FIG. 7.

Figure 40:
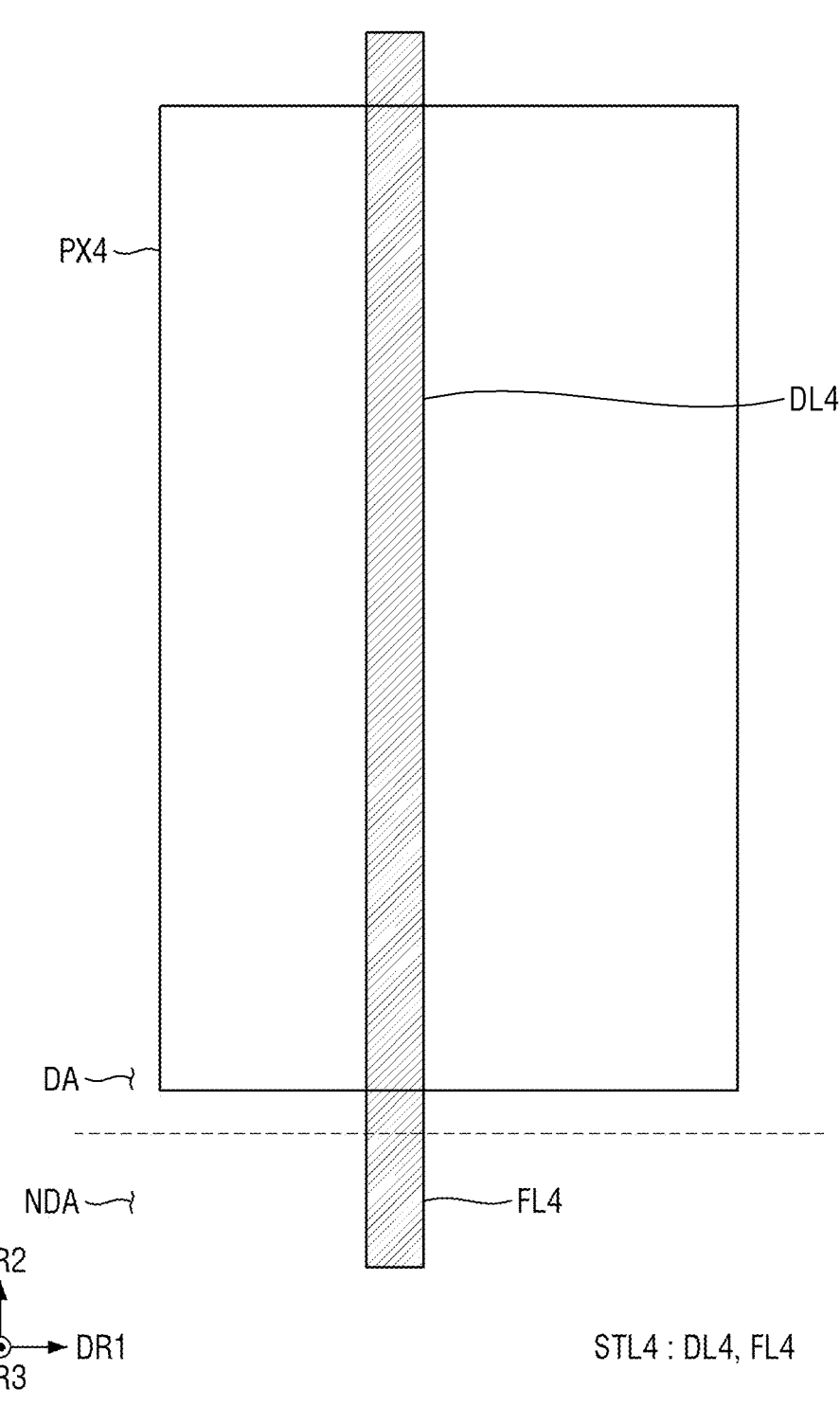
FIG. 40 is a plan view of a display device according to one or more embodiments.

FIG. 40 is a plan view of a display device according to one or more embodiments.

As illustrated in FIG. 40, the fourth signal transmission line STL4 may be disposed at the center of the fourth pixel PX4. In other words, the fourth data line DL4 of the fourth signal transmission line STL4 may be disposed at the center of the fourth pixel PX4.

Here, the fourth pixel PX4 of FIG. 40 may correspond to, for example, the above-described fourth pixel PX4 of FIG. 7. In some embodiments, the fourth signal transmission line STL4 of FIG. 40 may correspond to the above-described fourth signal transmission line STL4 of FIG. 7.

As illustrated in FIGS. 39 and 40, the respective data lines of the plurality of signal transmission lines may be disposed at different portions of the corresponding pixels.

Figure 41:
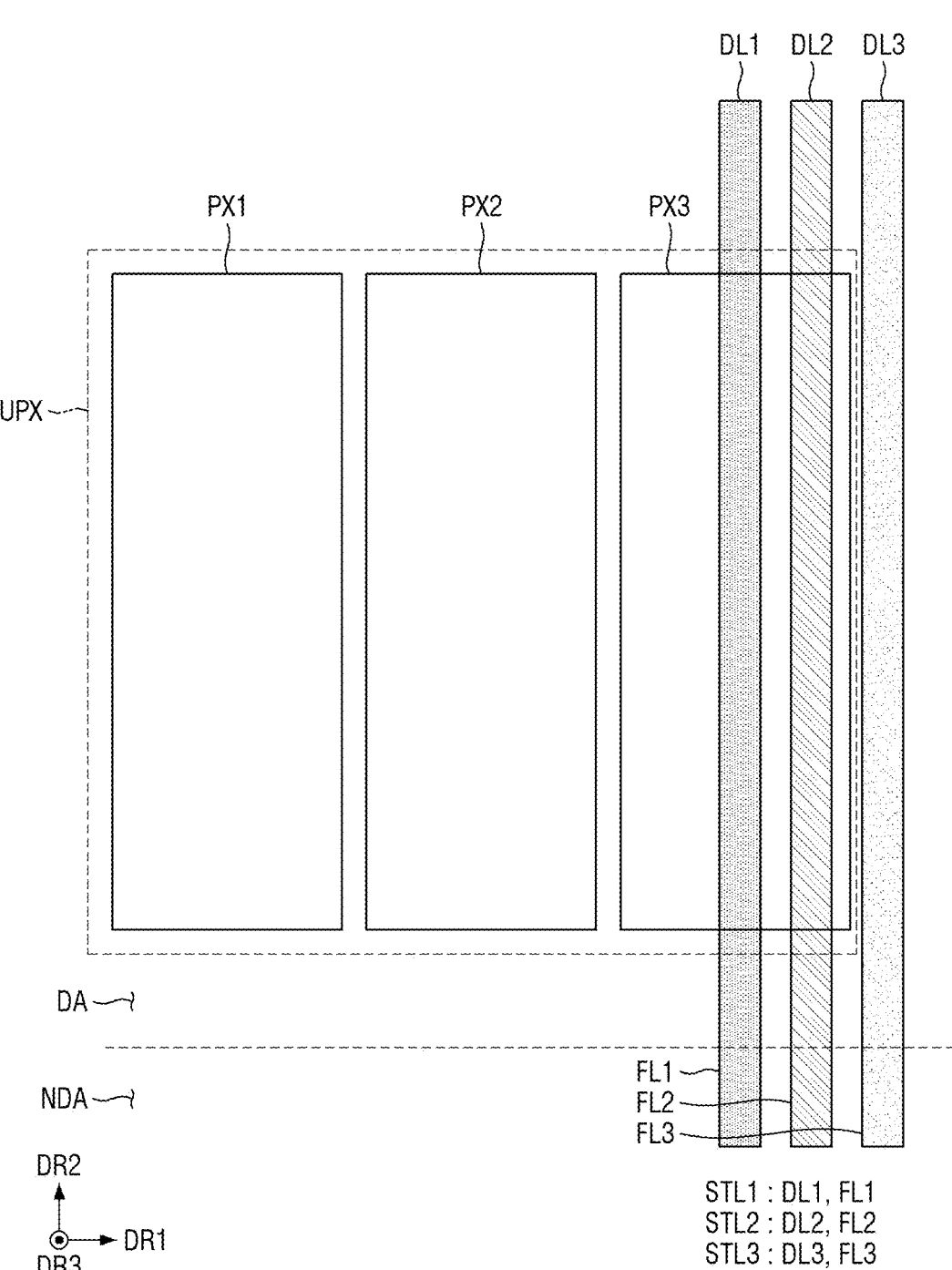
FIG. 41 is a plan view of a display device according to one or more embodiments.

FIG. 41 is a plan view of a display device according to one or more embodiments.

As shown in FIG. 41, a unit pixel UPX may include the first pixel PX1, the second pixel PX2, and the third pixel PX3. The first pixel PX1, the second pixel PX2, and the third pixel PX3 may be configured to emit light of different colors. For example, the first pixel PX1 may be configured to emit red light, the second pixel PX2 may be configured to emit green light, and the third pixel PX3 may be configured to emit blue light.

The first signal transmission line STL1 may be connected to the first pixel PX1. For example, the first data line DL1 of the first signal transmission line STL1 may be connected to the drain electrode D of the second transistor T2 provided in the first pixel PX1.

The second signal transmission line STL2 may be connected to the second pixel PX2. For example, the second data line DL2 of the second signal transmission line STL2 may be connected to the drain electrode D of the second transistor T2 provided in the second pixel PX2.

The third signal transmission line STL3 may be connected to the third pixel PX3. For example, the third data line DL3 of the third signal transmission line STL3 may be connected to the drain electrode D of the second transistor T2 provided in the third pixel PX3.

The first data line DL1 of the first signal transmission line STL1, the second data line DL2 of the second signal transmission line STL2, and the third data line DL3 of the third signal transmission line STL3 may be disposed adjacent to one edge of the unit pixel UPX. Here, at least one of the first to third data lines DL1 to DL3 may overlap the third pixel PX3. For example, the first data line DL1 and the second data line DL2 may overlap the third pixel PX3 in the third direction DR3.

In one or more embodiments, the first signal transmission line STL1, the second signal transmission line STL2, and the third signal transmission line STL3 may be disposed on different layers.

Figure 42:
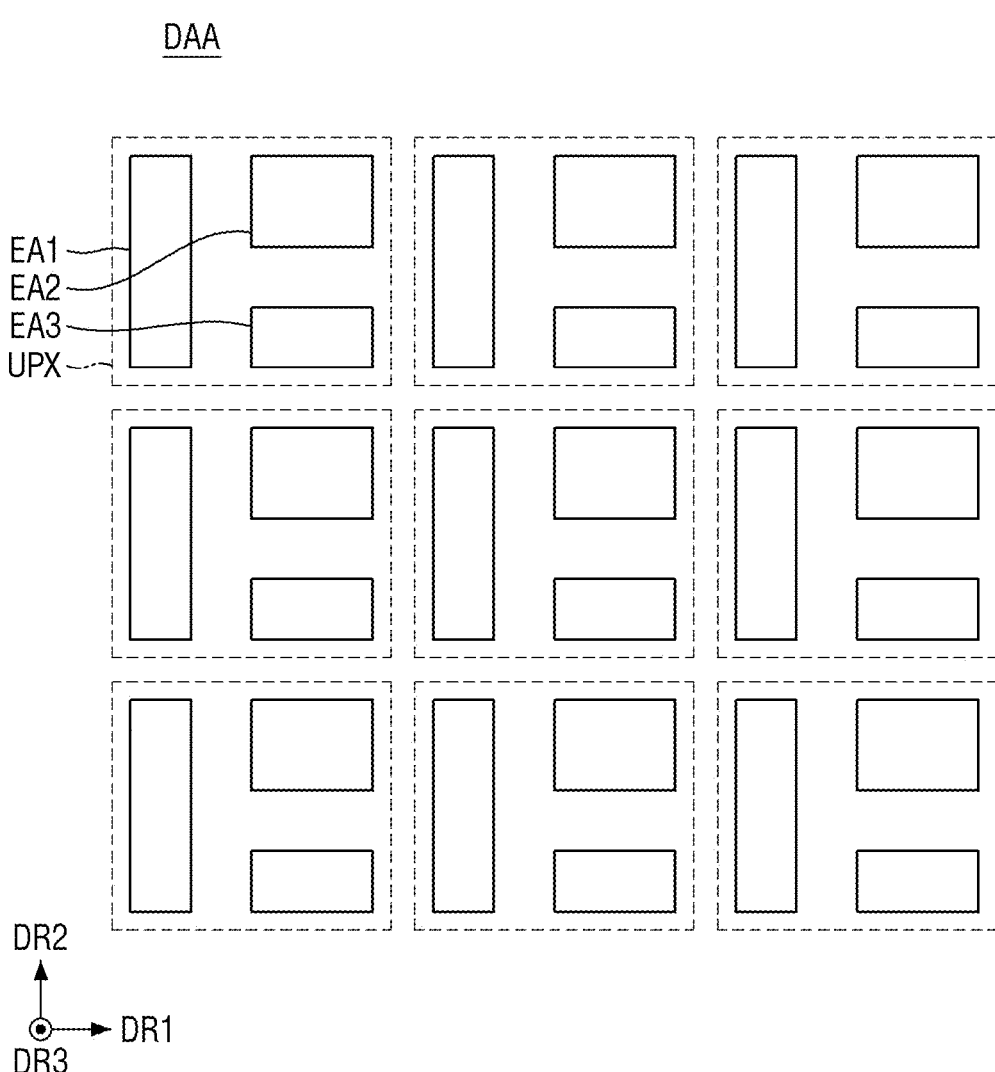
FIG. 42 is a layout view illustrating pixels of a display area according to one or more embodiments.

FIG. 42 is a layout view illustrating pixels of a display area according to one or more embodiments.

Referring to FIG. 42, each of the plurality of pixels PX includes the first emission area EA1 as an emission area of the first pixel PX1, the second emission area EA2 as an emission area of the second pixel PX2, and the third emission area EA3 as an emission area of the third pixel PX3.

Each of the first emission area EA1, the second emission area EA2, and the third emission area EA3 may have, in a plan view, a quadrilateral shape such as a rectangle, a square, or a diamond. For example, the first emission area EA1 may have a rectangular shape, in a plan view, having a short side in the first direction DR1 and a long side in the second direction DR2. In some embodiments, each of the second emission area EA2 and the third emission area EA3 may have a rectangular shape, in a plan view, having a long side in the first direction DR1 and a short side in the second direction DR2.

The length of the first emission area EA1 in the first direction DR1 may be smaller than the length of the second emission area EA2 in the first direction DR1, and may be smaller than the length of the third emission area EA3 in the first direction DR1. The length of the second emission area EA2 in the first direction DR1 and the length of the third emission area EA3 in the first direction DR1 may be substantially the same.

The length of the first emission area EA1 in the second direction DR2 may be larger than the sum of the length of the second emission area EA2 in the second direction DR2 and the length of third emission areas EA3 in the second direction DR2. The length of the second emission area EA2 in the second direction DR2 may be greater than the length of the third emission area EA3 in the second direction DR2.

Although it is illustrated in FIG. 42 that each of the first emission area EA1, the second emission area EA2, and the third emission area EA3 has a rectangular shape in a plan view, the present disclosure is not limited thereto. For example, each of the first emission area EA1, the second emission area EA2, and the third emission area EA3 may have a polygonal shape other than a quadrilateral shape, a circular shape, or an elliptical shape in a plan view.

In each of the plurality of pixels PX, the first emission area EA1 and the second emission area EA2 may be adjacent to each other in the first direction DR1. Further, the first emission area EA1 and the third emission area EA3 may be adjacent to each other in the first direction DR1. In some embodiments, the second emission area EA2 and the third emission area EA3 may be adjacent to each other in the second direction DR2. The area of the first emission area EA1, the area of the second emission area EA2, and the area of the third emission area EA3 may be different.

The first emission area EA1 may be to emit light of a first color, the second emission area EA2 may be to emit light of a second color, and the third emission area PX3 may be to emit light of a third color. Here, the first color light may be light of a blue wavelength band, the second color light may be light of a green wavelength band, and the third color light may be light of a red wavelength band. For example, the blue wavelength band may be a wavelength band of light whose main peak wavelength is in the range of about 370 nm to about 460 nm, the green wavelength band may be a wavelength band of light whose main peak wavelength is in the range of about 480 nm to about 560 nm, and the red wavelength band may be a wavelength band of light whose main peak wavelength is in the range of about 600 nm to about 750 nm.

Although it is illustrated in FIG. 42 that each of the plurality of pixels PX includes the three emission areas EA1, EA2, and EA3, the present disclosure is not limited thereto. For example, each of the plurality of pixels PX may include four emission areas.

In some embodiments, the layout of the emission areas of the plurality of pixels PX is not limited to that shown in FIG. 42. For example, the emission areas of the plurality of pixels PX may be arranged in a stripe structure in which the emission areas are arranged along the first direction DR1, a PENTILE® structure in which the emission areas are arranged in a diamond shape, or a hexagonal structure in which the emission areas having, in a plan view, a hexagonal shape are arranged side by side. The PENTILE® pixel arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

Figure 43:
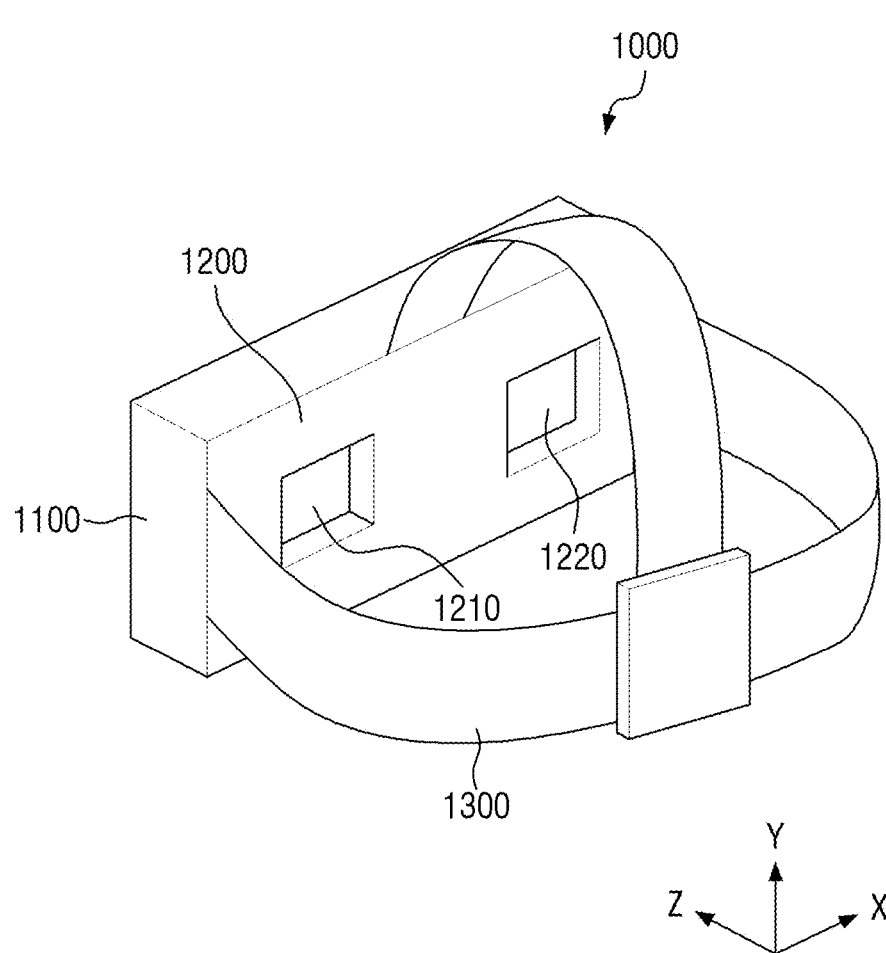
FIG. 43 is a perspective view illustrating a head mounted display device according to one or more embodiments.
Figure 44:
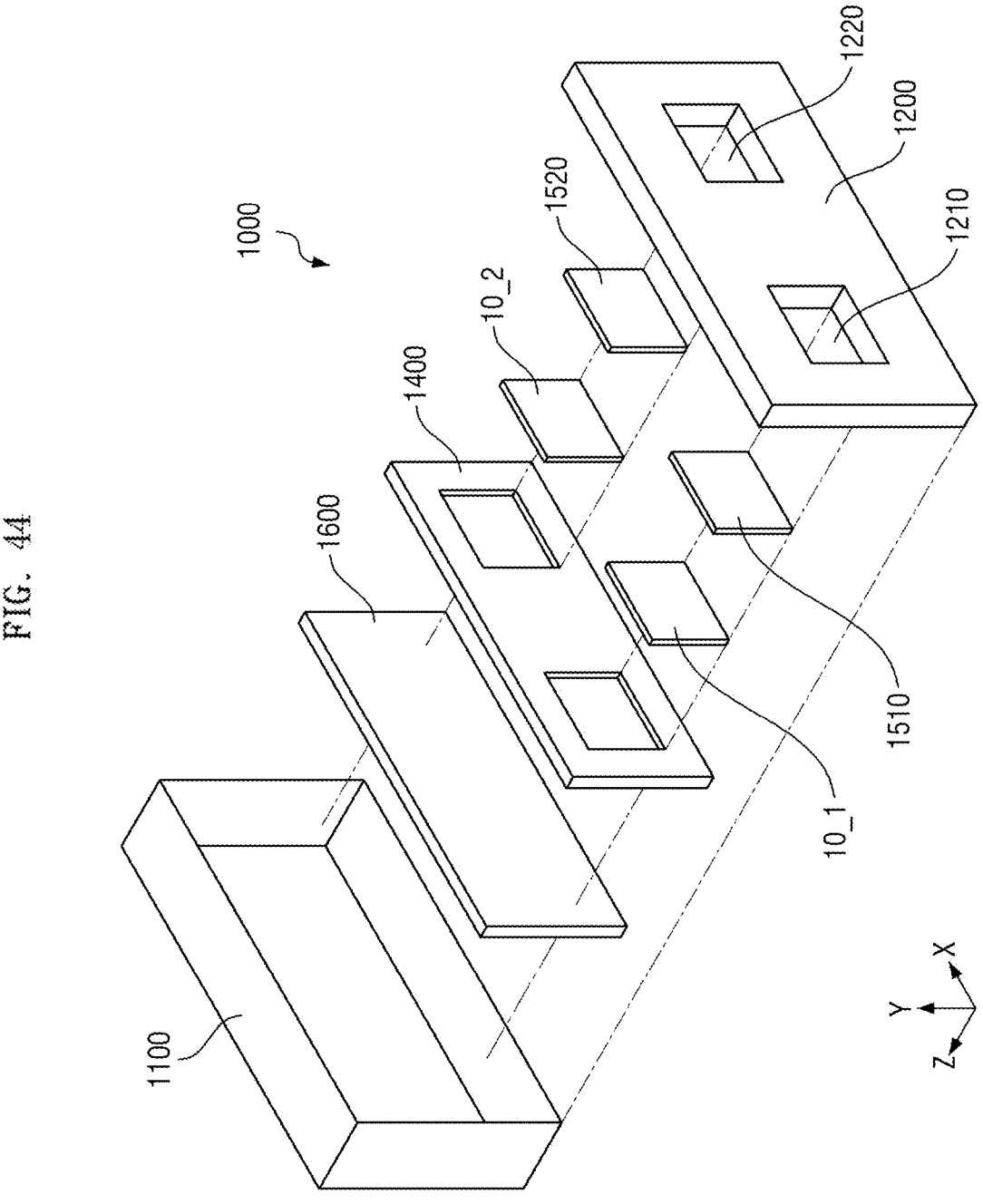
FIG. 44 is an exploded perspective view illustrating an example of the head mounted display device of FIG. 43.

FIG. 43 is a perspective view illustrating a head mounted display device according to one or more embodiments. FIG. 44 is an exploded perspective view illustrating an example of the head mounted display device of FIG. 43.

Referring to FIGS. 43 and 44, a head mounted display device 1000 according to one or more embodiments includes a first display device 10_1, a second display device 10_2, a display device housing 1100, a housing cover 1200, a first eyepiece 1210, a second eyepiece 1220, a head mounted band 1300, a middle frame 1400, a first optical member 1510, a second optical member 1520, a control circuit board 1600, and a connector.

The first display device 10_1 provides an image to the user's left eye, and the second display device 10_2 provides an image to the user's right eye. Because each of the first display device 10_1 and the second display device 10_2 is substantially the same as the display device 10 described in conjunction with FIGS. 1-42, description of the first display device 10_1 and the second display device 10_2 will not be provided.

The first optical member 1510 may be disposed between the first display device 10_1 and the first eyepiece 1210. The second optical member 1520 may be disposed between the second display device 10_2 and the second eyepiece 1220. Each of the first optical member 1510 and the second optical member 1520 may include at least one convex lens.

The middle frame 1400 may be disposed between the first display device 10_1 and the control circuit board 1600 and between the second display device 10_2 and the control circuit board 1600. The middle frame 1400 serves to support and fix the first display device 10_1, the second display device 10_2, and the control circuit board 1600.

The control circuit board 1600 may be disposed between the middle frame 1400 and the display device housing 1100. The control circuit board 1600 may be connected to the first display device 10_1 and the second display device 10_2 through the connector. The control circuit board 1600 may convert an image source inputted from the outside into digital video data DATA, and transmit the digital video data DATA to the first display device 10_1 and the second display device 10_2 through the connector.

The control circuit board 1600 may be to transmit the digital video data DATA corresponding to a left-eye image optimized for the user's left eye to the first display device 10_1, and may be to transmit the digital video data DATA corresponding to a right-eye image optimized for the user's right eye to the second display device 10_2. In some embodiments, the control circuit board 1600 may be to transmit the same digital video data DATA to the first display device 10_1 and the second display device 10_2.

The display device housing 1100 serves to accommodate therein the first display device 10_1, the second display device 10_2, the middle frame 1400, the first optical member 1510, the second optical member 1520, the control circuit board 1600, and the connector. The housing cover 1200 is disposed to cover the one open side of the display device housing 1100. The housing cover 1200 may include the first eyepiece 1210 at which the user's left eye is disposed and the second eyepiece 1220 at which the user's right eye is disposed. Although it is illustrated in FIGS. 43 and 44 that the first eyepiece 1210 and the second eyepiece 1220 are disposed separately, the present disclosure is not limited thereto. The first eyepiece 1210 and the second eyepiece 1220 may be combined into one.

The first eyepiece 1210 may be aligned with the first display device 10_1 and the first optical member 1510, and the second eyepiece 1220 may be aligned with the second display device 10_2 and the second optical member 1520. Therefore, the user may view, through the first eyepiece 1210, the image of the first display device 10_1 magnified as a virtual image by the first optical member 1510, and may view, through the second eyepiece 1220, the image of the second display device 10_2 magnified as a virtual image by the second optical member 1520.

The head mounted band 1300 serves to fix the display device housing 1100 to the user's head so that a state in which the first and second eyepieces 1210 and 1220 of the housing cover 1200 are placed on the user's left and right eyes, respectively, can be maintained. When the display device housing 1200 is implemented to be lightweight and compact, the head mounted display device 1000 may be provided with an eyeglass frame as shown in FIG. 45 instead of the head mounted band 1300.

In some embodiments, the head mounted display device 1000 may further include a battery for supplying power, an external memory slot for accommodating an external memory, and an external connection port and a wireless communication module for receiving an image source. The external connection port may be a universe serial bus (USB) terminal, a display port, or a high-definition multimedia interface (HDMI) terminal, and the wireless communication module may be a 5G communication module, a 4G communication module, a Wi-Fi module, or a Bluetooth module.

Figure 45:
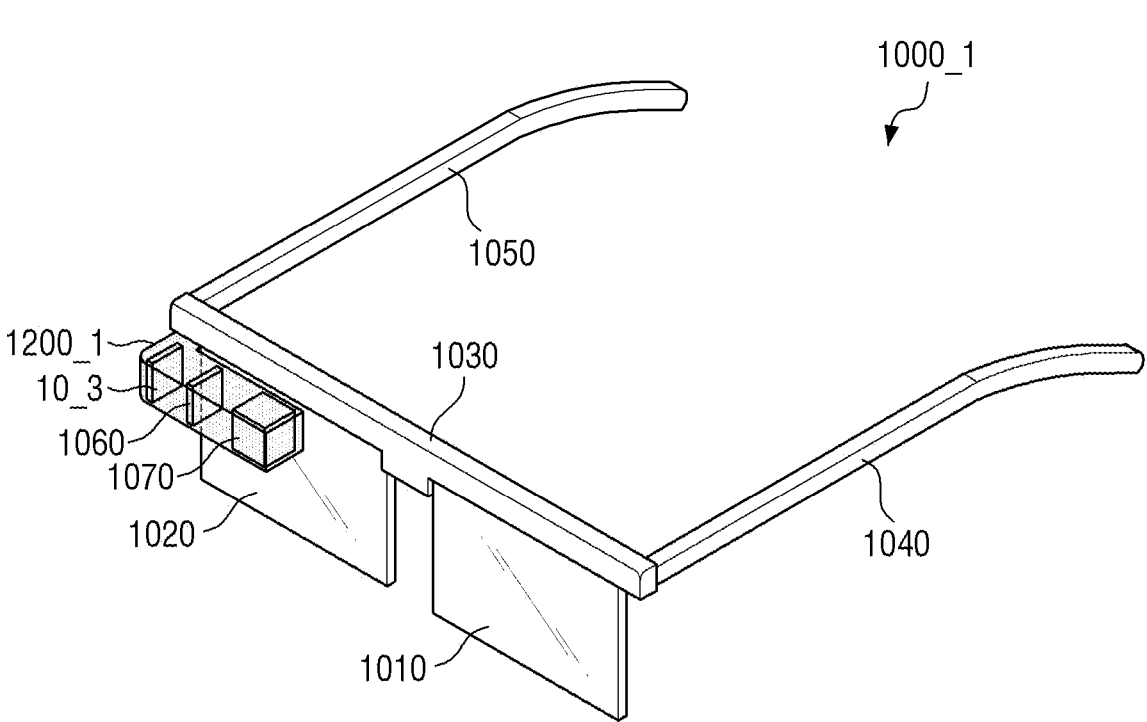
FIG. 45 is a perspective view illustrating a head mounted display device according to one or more embodiments.

FIG. 45 is a perspective view illustrating a head mounted display device according to one or more embodiments.

Referring to FIG. 45, a head mounted display device 1000_1 according to one or more embodiments may be an eyeglasses-type or kind display device in which a display device housing 1200_1 is implemented in a lightweight and compact manner. The head mounted display device 1000_1 according to one or more embodiments may include a display device 10_3, a left eye lens 1010, a right eye lens 1020, a support frame 1030, temples 1040 and 1050, an optical member 1060, an optical path conversion member 1070, and the display device housing 1200_1.

The display device housing 1200_1 may include the display device 10_3, the optical member 1060, and the optical path conversion member 1070. The image displayed on the display device 10_3 may be magnified by the optical member 1060, and may be provided to the user's right eye through the right eye lens 1020 after the optical path thereof is converted by the optical path conversion member 1070. As a result, the user may view an augmented reality image, through the right eye, in which a virtual image displayed on the display device 10_3 and a real image seen through the right eye lens 1020 are combined.

Although it is illustrated in FIG. 45 that the display device housing 1200_1 is disposed at the right end of the support frame 1030, the present disclosure is not limited thereto. For example, the display device housing 1200_1 may be disposed at the left end of the support frame 1030, in which case the image of the display device 10_3 may be provided to the user's left eye. In some embodiments, the display housing 1200_1 may be disposed at both (e.g., simultaneously) the left end and the right end of the support frame 1030, in which case the user may view the image displayed on the display device 10_3 through both (e.g., simultaneously) the left and right eyes.

It will be able to be understood by one of ordinary skill in the art to which the present disclosure belongs that the present disclosure may be implemented in other specific forms without changing the technical spirit or essential features of the present disclosure. Therefore, it is to be understood that the example embodiments described above are illustrative rather than being restrictive in all aspects. It is to be understood that the scope of the present disclosure are defined by the claims and their equivalents rather than the detailed description described above and all modifications and alterations derived from the claims and their equivalents fall within the scope of the present disclosure.

What is claimed is:

1. A display device comprising:
a substrate having a display area and a non-display area;
a signal transmission line comprising a signal line in the display area of the substrate and a fan-out line extending from the signal line and in the non-display area of the substrate; and
a plurality of pixels in the display area of the substrate,
wherein a plurality of signal transmission lines comprise the signal transmission line and are respectively connected to the plurality of pixels,
wherein the plurality of signal transmission lines are on different layers on the substrate,
wherein the display device further comprising a plurality of connection electrodes respectively connecting the plurality of signal transmission lines to the plurality of pixels,
wherein the plurality of signal transmission lines have different lengths, and
wherein a plurality of signal lines are connected to the plurality of pixels by a smaller number of the connection electrodes as they have greater lengths and comprise the signal line.

2. The display device of claim 1, wherein the plurality of signal transmission lines overlap in the non-display area.

3. The display device of claim 2, wherein a plurality of fan-out lines of the plurality of signal transmission lines overlap in the non-display area and comprise the fan-out line.

4. The display device of claim 3, wherein when a longest fan-out line from among the plurality of fan-out lines of the plurality of signal transmission lines is a reference fan-out line, an overlapping area between the reference fan-out line and each of the plurality of fan-out lines other than the reference fan-out line is different.

5. The display device of claim 1, wherein the plurality of signal transmission lines do not overlap in the display area.

6. The display device of claim 5, wherein the plurality of signal lines of the plurality of signal transmission lines do not overlap in the display area and comprise the signal line.

7. The display device of claim 1, wherein a plurality of fan out lines of the plurality of signal transmission lines have different lengths and comprise the fan-out line.

8. The display device of claim 1, wherein the plurality of signal transmission lines are on succeeding higher layers as they are arranged with each other along one direction.

9. The display device of claim 1, wherein the plurality of signal transmission lines are connected to the plurality of pixels by a greater number of the connection electrodes as they are on succeeding higher layers.

10. The display device of claim 1, wherein the plurality of signal lines of the plurality of signal transmission lines are connected to a plurality of transistors of the plurality of pixels through the plurality of connection electrodes and comprise the signal line.

11. The display device of claim 1, wherein the plurality of signal transmission lines are a first group of signal transmission lines, and wherein the display device further comprising a second group of signal transmission lines adjacent to the first group of signal transmission lines and comprising a plurality of other signal transmission lines that do not overlap the first group of signal transmission lines.

12. The display device of claim 11, wherein two signal transmission lines in different groups of signal transmission lines and located adjacent to each other are at a same layer.

13. The display device of claim 11, wherein the first group of signal transmission lines are on succeeding higher layers as they are arranged with each other along one direction, and wherein the second group of signal transmission lines are on succeeding lower layers as they are arranged with other along the one direction.

14. The display device of claim 1, further comprising:

a plurality of first capacitor layers respectively on the plurality of pixels; and a plurality of second capacitor layers respectively on the first capacitor layers.

15. The display device of claim 14, wherein at least one signal transmission line of the plurality of signal transmission lines is at a same layer as at least one capacitor layer selected from among the first capacitor layers and the second capacitor layers.

16. The display device of claim 15, wherein a capacitor layer on a different layer from the at least one signal transmission line has a larger area than a capacitor layer at a same layer as the at least one signal transmission line.

17. The display device of claim 15, wherein a capacitor layer on a different layer from the at least one signal transmission line overlaps the at least one signal transmission line in the display area.

18. The display device of claim 17, wherein a capacitor layer on the different layer from the at least one signal transmission line overlaps a signal line of the at least one signal transmission line in the display area.

19. The display device of claim 1, wherein at least one signal transmission line of the plurality of signal transmission lines overlaps an edge of at least one pixel.

20. The display device of claim 1, wherein at least one signal transmission line of the plurality of signal transmission lines overlaps a center of at least one pixel.

21. The display device of claim 1, wherein one unit pixel comprises at least two or more pixels from among the plurality of pixels, and wherein the plurality of signal transmission lines respectively connected to the pixels of the one unit pixel are at an edge of the unit pixel.

22. The display device of claim 1, further comprising a display driver in the non-display area of the substrate, wherein the plurality of signal transmission lines are connected to the display driver in the non-display area.

23. A display device comprising:

a substrate having a display area and a non-display area;

a plurality of pixels in the display area; and a plurality of signal transmission lines respectively connected to the plurality of pixels in the display area, and extending from the display area to the non-display area, wherein the plurality of signal transmission lines are located on different layers on the substrate, wherein the display device further comprising a plurality of connection electrodes respectively connecting the plurality of signal transmission lines to the plurality of pixels, wherein the plurality of signal transmission lines have different lengths, and wherein the plurality of signal transmission lines are connected to the pixels by a smaller number of the connection electrodes as they have greater lengths.

24. The display device of claim 23, wherein the plurality of signal transmission lines overlap in the non-display area.

25. The display device of claim 24, wherein when a longest signal transmission line from among the plurality of signal transmission lines is a reference signal transmission line, an overlapping area between the reference signal transmission line and each of the plurality of signal transmission lines other than the reference signal transmission line is different.

26. The display device of claim 23, wherein the plurality of signal transmission lines do not overlap in the display area.

27. The display device of claim 23, wherein the plurality of signal transmission lines are on succeeding higher layers as they are arranged with each other along one direction.

28. The display device of claim 23, wherein the plurality of signal transmission lines are connected to the pixels by a greater number of the connection electrodes as they are on succeeding higher layers.

* * * * *